United States Patent
Luby et al.

(10) Patent No.: US 9,350,488 B2
(45) Date of Patent: May 24, 2016

(54) CONTENT DELIVERY SYSTEM WITH ALLOCATION OF SOURCE DATA AND REPAIR DATA AMONG HTTP SERVERS

(71) Applicant: QUALCOMM Incorporated, San Diego, CA (US)

(72) Inventors: Michael George Luby, Berkeley, CA (US); Nikolai Konrad Leung, Talcoma Park, MD (US); Ralph Akram Gholmieh, Berkeley, CA (US); Thomas Stockhammer, Bergen (DE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/663,247

(22) Filed: Mar. 19, 2015

(65) Prior Publication Data

US 2015/0263824 A1 Sep. 17, 2015

Related U.S. Application Data

(63) Continuation of application No. 13/563,590, filed on Jul. 31, 2012, now Pat. No. 9,015,564.

(60) Provisional application No. 61/614,408, filed on Mar. 22, 2012, provisional application No. 61/645,562, filed on May 10, 2012, provisional application No. 61/647,414, filed on May 15, 2012.

(51) Int. Cl.
*H03M 13/00* (2006.01)
*H04L 1/00* (2006.01)
(Continued)

(52) U.S. Cl.
CPC ............ *H04L 1/0045* (2013.01); *H03M 13/356* (2013.01); *H03M 13/3761* (2013.01); *H03M 13/6306* (2013.01); *H04L 1/1819* (2013.01); *H04L 65/4076* (2013.01); *H04L 67/02* (2013.01)

(58) Field of Classification Search
CPC .... H04L 1/0045; H04L 67/02; H04L 65/4076
See application file for complete search history.

(56) References Cited

U.S. PATENT DOCUMENTS

| 5,617,541 A | 4/1997 | Albanese et al. |
| 6,307,487 B1 | 10/2001 | Luby |

(Continued)

FOREIGN PATENT DOCUMENTS

| JP | 2007520961 A | 7/2007 |
| JP | 2008508761 A | 3/2008 |

(Continued)

OTHER PUBLICATIONS

"3rd Generation Partnership Project; Technical Specification Group Services and System Aspects; Technical Report; Enhancements to Multimedia (EMM): EMM, DDE and IPME Aspects (Release 11)", 3GPP Standard; 3GPP TR 26.951, 3rd Generation Partnership Project (3GPP), Mobile Competence Centre ;650, Route Des Lucioles ; F-06921 Sophia-Antipolis Cedex ; France, vol. SA WG4, No. V1.0.0, Sep. 12, 2012, pp. 1-16, XP050649068, [retrieved on Sep. 12, 2012] Section 5.2.5 Use Case #5.

(Continued)

*Primary Examiner* — Sam Rizk
(74) *Attorney, Agent, or Firm* — Charles E. Eggers

(57) ABSTRACT

Data objects are delivered over a packet-switched network and receivers receive encoded symbols, such as repair symbols, broadcast or multicast, with sufficient information to form requests for additional symbols as needed based on what source symbols or sub-symbols are needed or missing. The requests can be made in a unicast or request fashion. Requesting and broadcasting might be done by different entities. A broadcast server can generate and store repair symbols while a source server can store content in source form. A request can be a unicast HTTP byte-range request, such as a URL, starting position and length. Requests might be aligned with starting positions of files. A receiver can calculate starting and ending byte positions of symbols or sub-symbols in a file and get indications that conventional HTTP servers are usable for file repair. Repair servers can request broadcast of repair data when byte-range requests from multiple receivers overlap.

21 Claims, 38 Drawing Sheets

(51) Int. Cl.
*H03M 13/35* (2006.01)
*H03M 13/37* (2006.01)
*H04L 1/18* (2006.01)
*H04L 29/06* (2006.01)
*H04L 29/08* (2006.01)

(56) References Cited

U.S. PATENT DOCUMENTS

| | | |
|---|---|---|
| 6,320,520 B1 | 11/2001 | Luby |
| 6,856,263 B2 | 2/2005 | Shokrollahi et al. |
| 6,909,383 B2 | 6/2005 | Shokrollahi et al. |
| 7,068,729 B2 | 6/2006 | Shokrollahi et al. |
| 7,376,150 B2 | 5/2008 | Vedantham et al. |
| 7,418,651 B2 | 8/2008 | Luby et al. |
| 7,953,079 B2 | 5/2011 | John et al. |
| 7,956,772 B2 | 6/2011 | Shokrollahi et al. |
| 8,019,886 B2 | 9/2011 | Harrang et al. |
| 2005/0182842 A1* | 8/2005 | Walsh et al. ............ 709/230 |
| 2006/0280254 A1 | 12/2006 | Luby et al. |
| 2007/0195894 A1 | 8/2007 | Shokrollahi et al. |
| 2009/0077247 A1 | 3/2009 | Bouazizi et al. |
| 2010/0217887 A1 | 8/2010 | Bouazizi et al. |
| 2010/0268836 A1 | 10/2010 | Jabri et al. |
| 2011/0299629 A1 | 12/2011 | Luby et al. |
| 2012/0099593 A1 | 4/2012 | Luby |
| 2012/0151302 A1 | 6/2012 | Luby et al. |
| 2013/0246846 A1 | 9/2013 | Oyman |
| 2013/0254631 A1 | 9/2013 | Luby et al. |

FOREIGN PATENT DOCUMENTS

| | | |
|---|---|---|
| JP | 2010114844 A | 5/2010 |
| WO | 2005078982 A1 | 8/2005 |
| WO | 2006013459 A1 | 2/2006 |

OTHER PUBLICATIONS

Albanese, A., et al., "Priority Encoding Transmission", IEEE Transactions on Information Theory, vol. 42, No. 6, pp. 1-22, (Nov. 1996).
Barquero, G.D., et al., "Multicast Delivery of File Download Services in Evolved 3G Mobile Networks With HSDPA and MBMS", IEEE Transactions on Broadcasting, IEEE Service Center, Piscataway, NJ, US, vol. 55, No. 4, Dec. 1, 2009,pp. 742-751, XP011343538, ISSN: 0018-9316, DOI: 10.1109/ TBC.2009. 2032800 abstract p. 743, right-hand col., lastparagraph—p. 744, left-hand col., paragraph 1 p. 745, left-hand col., paragraph 1—p. 746, left-hand col., paragraph 1 figure 1.
Luby, et al., "Content Delivery System with Allocation of Source Data and Repair Data Among HTTP Servers", U.S. Appl. No. 61/645,562, filed May 10, 2012.
Luby et, al. "Layered Coding Transport (LCT) Building Block", IETF RFC 5651, pp. 1-42, (Oct. 2009).
Luby, et al., "The Use of Forward Error Correction (FEC) in Reliable Multicast", IETF RFC 3453 (Dec. 2002); 18pgs.
Luby, et al.,"RaptorQ Forward Error Correction Scheme for Object Delivery", IETF RFC 6330, Reliable Multicast Transport (Aug. 2011), 69pgs.
Luby, M., et al. "Forward Error Correction (FEC) Building Block", IETF RFC 5052, pp. 1-31, (Aug. 2007).
Luby, M., et al., "Raptor Forward Error Correction Scheme for Object Delivery", IETF RFC5053, pp. 1-46 (Sep. 2007).
Luby M. et al., "RaptorQ Forward Error Correction Scheme for Object Delivery", IETF draft ietf-rmt-bb-fec-raptorq-04, Reliable Multicast Transport, Internet Engineering Task Force (IETF), Standard Workingdraft, Internet Society (ISOC), Aug. 24, 2010, pp. 1-68, XP015070705, [retrieved on Aug. 24, 2010].
Luby, "Methods and Apparatus Employing FEC Codes with Permanent Inactivation of Symbols for Encoding and Decoding Processes", U.S. Appl. No. 61/235,285, filed Aug. 19, 2009.
Paila et al., "FLUTE—File Delivery over Unidirectional Transport", Network Working Group, RFC 3926, Oct. 1, 2004, The Internet Society, XP015009699, ISSN: 0000-0003.
Qualcomm Incorporated et al., "EMM-DDE Use Case—MBMS File Repair via Conventional HTTP Servers", 3GPP Draft; S4-120207 EMM-DDE Use Case—MBMS File Repair Via Conventional HTTP Servers, 3rd Generation Partnership Project (3GPP), Mobile Competence Centre ; 650, Route Des Lucioles ; F-06921 Sophia-Antipolis Cedex ; France, vol. SA WG4, No. Edinburgh, UK; Jan. 30-Feb. 3, 2012, Feb. 2, 2012, XP050578293, [retrieved on Feb. 2, 2012] the whole document.
Qualcomm Incorporated et al., "MBMS File Repair via Conventional HTTP Web Servers", 3GPP Draft; S4-120046 MBMS File Repair Via Conventional HTTP Web Servers, 3rd Generation Partnership Project(3GPP), Mobile Competence Centre ; 650, Route Des Lucioles ; F-06921 Sophia-Antipolis Cedex ; France, vol. SA WG4, no. Edinburgh, United Kingdom; Jan. 30-Feb. 3, 2012, Jan. 25, 2012, XP050578163, [retrieved on Jan. 25, 2012] the whole document.
Roca, V., et, al. "Low Density Parity Check (LDPC) Staircase and Triangle Forward Error Correction (FEC) Schemes", IETF RFC 5170 (Jun. 2008), pp. 1-34.
Watson, M., et, al. "Asynchronous Layered Coding (ALC) Protocol Instantiation", IETF RFC 5775, pp. 1-23, (Apr. 2010).

\* cited by examiner

```
 0                   1                   2                   3
 0 1 2 3 4 5 6 7 8 9 0 1 2 3 4 5 6 7 8 9 0 1 2 3 4 5 6 7 8 9 0 1
|       Source Block Number (SBN)       |    Encoding Symbol ID (ESI)   |
|              (16 bits)                |          (16 bits)            |
```

Fig. 1A.  Raptor-RFC 5053 Payload ID (prior art)

```
 0                   1                   2                   3
 0 1 2 3 4 5 6 7 8 9 0 1 2 3 4 5 6 7 8 9 0 1 2 3 4 5 6 7 8 9 0 1
| Source Block  |                                               |
| Number (SBN)  |         Encoding Symbol ID (ESI)              |
|   (8 bits)    |              (24 bits)                        |
```

Fig. 1B.  RaptorQ-Spec Payload ID (prior art)

```
 0                   1                   2                   3
 0 1 2 3 4 5 6 7 8 9 0 1 2 3 4 5 6 7 8 9 0 1 2 3 4 5 6 7 8 9 0 1
|             Universal File Symbol Identifier (UFSI)           |
|                          (32 bits)                            |
```

Fig. 2

|  | ESI 0 | ESI 1 | ESI 2 | ESI 3 | ESI 4 | ESI 5 |  |
|---|---|---|---|---|---|---|---|
|  | (0,0) | (0,1) | (0,2) | (0,3) | (0,4) | (0,5) | SBN 0 |
|  | (1,0) | (1,1) | (1,2) | (1,3) | (1,4) | (1,5) | SBN 1 |
|  | (2,0) | (2,1) | (2,2) | (2,3) | (2,4) | (2,5) | SBN 2 |
|  | (3,0) | (3,1) | (3,2) | (3,3) | (3,4) |  | SBN 3 |
|  | (4,0) | (4,1) | (4,2) | (4,3) | (4,4) |  | SBN 4 |

Fig. 5A

| | | | | | | |
|---|---|---|---|---|---|---|
| SBN 0 | UFSI 0 | UFSI 5 | UFSI 10 | UFSI 15 | UFSI 20 | UFSI 25 |
| SBN 1 | UFSI 1 | UFSI 6 | UFSI 11 | UFSI 16 | UFSI 21 | UFSI 26 |
| SBN 2 | UFSI 2 | UFSI 7 | UFSI 12 | UFSI 17 | UFSI 22 | UFSI 27 |
| SBN 3 | UFSI 3 | UFSI 8 | UFSI 13 | UFSI 18 | UFSI 23 | |
| SBN 4 | UFSI 4 | UFSI 9 | UFSI 14 | UFSI 19 | UFSI 24 | |

Fig. 5B

Structure of part 1 of file

| (0,0) | (0,1) | (0,2) | (0,3) | (0,4) | (0,5) | SBN 0 |
|---|---|---|---|---|---|---|
| (1,0) | (1,1) | (1,2) | (1,3) | (1,4) | (1,5) | SBN 1 |
| (2,0) | (2,1) | (2,2) | (2,3) | (2,4) | (2,5) | SBN 2 |
| (3,0) | (3,1) | (3,2) | (3,3) | (3,4) |       | SBN 3 |
| (4,0) | (4,1) | (4,2) | (4,3) | (4,4) |       | SBN 4 |
| ESI 0 | ESI 1 | ESI 2 | ESI 3 | ESI 4 | ESI 5 |       |

Fig. 8A

Structure of part 2 of file

| (0,0) | (0,1) | (0,2) | (0,3) | SBN 0 |
|---|---|---|---|---|
| (1,0) | (1,1) | (1,2) | (1,3) | SBN 1 |
| (2,0) | (2,1) | (2,2) | (2,3) | SBN 2 |
| (3,0) | (3,1) | (3,2) |       | SBN 3 |
| ESI 0 | ESI 1 | ESI 2 | ESI 3 |       |

Fig. 8B

| UFSI | $T_1$ | $T_2$ |
|---|---|---|
| UFSI 0 | (0,0) | (0,0) |
| UFSI 1 | (1,0) | (1,0) |
| UFSI 2 | (2,0) | (2,0) |
| UFSI 3 | (3,0) | (3,0) |
| UFSI 4 | (4,0) | (0,1) |
| UFSI 5 | (0,1) | (1,1) |
| UFSI 6 | (1,1) | (2,1) |
| UFSI 7 | (2,1) | (3,1) |
| UFSI 8 | (3,1) | (0,2) |
| UFSI 9 | (4,1) | (1,2) |
| UFSI 10 | (0,2) | (2,2) |
| UFSI 11 | (1,2) | (3,2) |
| UFSI 12 | (2,2) | (0,3) |
| UFSI 13 | (3,2) | (1,3) |
| UFSI 14 | (4,2) | (2,3) |
| UFSI 15 | (0,3) | (3,3) |
| UFSI 16 | (1,3) | (0,4) |
| UFSI 17 | (2,3) | (1,4) |
| UFSI 18 | (3,3) | (2,4) |
| UFSI 19 | (4,3) | (3,4) |
| UFSI 20 | (0,4) | (0,5) |
| UFSI 21 | (1,4) | (1,5) |
| UFSI 22 | (2,4) | (2,5) |
| UFSI 23 | (3,4) | (3,5) |
| UFSI 24 | (4,4) | (0,6) |
| UFSI 25 | (0,5) | (1,6) |
| UFSI 26 | (1,5) | (2,6) |
| UFSI 27 | (2,5) | (3,6) |

Fig. 9

| 0 | | | | | | | | 1 | | | | | | | | 2 | | | | | | | | 3 | |
|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 0 | 1 | 2 | 3 | 4 | 5 | 6 | 7 | 8 | 9 | 0 | 1 | 2 | 3 | 4 5 6 7 8 9 0 1 |

| Number of Objects ($d$=2) (8 bits) | Object 1 Symbol Size ($T_1$) | $F_1$ |
|---|---|---|
| Object 1 Transfer Length (cont.) ($F_1$) ||| 
| Object 2 Symbol Size ($T_2$) | Object 2 Transfer Length ($F_2$) ||
| Object 2 Transfer Length (cont.) ($F_1$) || padding |

Fig. 20

| A1 | $Z_1$ | $N_1$ |
|---|---|---|
| $Z_2$ | $N_2$ | padding |

Fig. 21

| Sub-block Number (SuBN) | First ESI | Start Byte (Formula) | Start Byte (Value) | Last ESI | End Byte (Formula) | End Byte (Value) |
|---|---|---|---|---|---|---|
| 0 | 12 | 12 * 112 | 1,344 | 29 | 1,344 + 18 * 112 - 1 | 3,359 |
| 1 | 12 | 7,576 * 12 + 12 * 112 | 849,856 | 29 | 849,856 + 18 * 112 - 1 | 851,871 |
| 2 | 12 | 7,576 * 2 * 112 + 12 * 112 | 1,698,368 | 29 | 1,698,368 + 18 * 112 - 1 | 1,700,383 |
| 3 | 12 | 7,576 * 3 * 112 + 12 * 112 | 2,546,880 | 29 | 2,546,880 + 18 * 112 - 1 | 2,548,895 |
| 4 | 12 | 7,576 * 4 * 112 + 12 * 112 | 3,395,392 | 29 | 3,395,392 + 18 * 112 - 1 | 3,397,407 |
| 5 | 12 | 7,576 * 5 * 112 + 12 * 112 | 4,243,904 | 29 | 4,243,904 + 18 * 112 - 1 | 4,245,919 |
| 6 | 12 | 7,576 * 6 * 112 + 12 * 108 | 5,092,368 | 29 | 5,092,368 + 18 * 108 - 1 | 5,094,311 |
| 7 | 12 | 7,576 * (6 * 112 + 108) + 12 * 108 | 5,910,576 | 29 | 5,910,576 + 18 * 108 - 1 | 5,912,519 |
| 8 | 12 | 7,576 * (6 * 112 + 2 * 108) + 12 * 108 | 6,728,784 | 29 | 6,728,784 + 18 * 108 - 1 | 6,730,727 |
| 9 | 12 | 7,576 * (6 * 112 + 3 * 108) + 12 * 108 | 7,546,992 | 29 | 7,546,992 + 18 * 108 - 1 | 7,548,935 |
| 10 | 12 | 7,576 * (6 * 112 + 4 * 108) + 12 * 108 | 8,365,200 | 29 | 8,365,200 + 18 * 108 - 1 | 8,367,143 |
| 11 | 12 | 7,576 * (6 * 112 + 5 * 108) + 12 * 108 | 9,183,408 | 29 | 9,183,408 + 18 * 108 - 1 | 9,185,351 |

Fig. 32

| Sub-block Number (SuBN) | First ESI | Start Byte (Formula) | Start Byte (Value) | Last ESI | End Byte (Formula) | End Byte (Value) |
|---|---|---|---|---|---|---|
| 0 | 12 | 7,576 * 1320 + 12 * 112 | 10,001,664 | 29 | 10,001,664 + 18 * 112 - 1 | 10,003,679 |
| 1 | 12 | 7,576 * (1320 + 112) + 12 * 112 | 10,850,176 | 29 | 10,850,176 + 18 * 112 - 1 | 10,852,191 |
| 2 | 12 | 7,576 * (1320 + 2 * 112) + 12 * 112 | 11,698,688 | 29 | 11,698,688 + 18 * 112 - 1 | 11,700,703 |
| 3 | 12 | 7,576 * (1320 + 3 * 112) + 12 * 112 | 12,547,200 | 29 | 12,547,200 + 18 * 112 - 1 | 12,549,215 |
| 4 | 12 | 7,576 * (1320 + 4 * 112) + 12 * 112 | 13,395,712 | 29 | 13,395,712 + 18 * 112 - 1 | 13,397,727 |
| 5 | 12 | 7,576 * (1320 + 5 * 112) + 12 * 112 | 14,244,224 | 29 | 14,244,224 + 18 * 112 - 1 | 14,246,239 |
| 6 | 12 | 7,576 * (1320 + 6 * 112) + 12 * 108 | 15,092,688 | 29 | 15,092,688 + 18 * 108 - 1 | 15,094,631 |
| 7 | 12 | 7,576 * (1320 + 6 * 112 + 108) + 12 * 108 | 15,910,896 | 29 | 15,910,896 + 18 * 108 - 1 | 15,912,839 |
| 8 | 12 | 7,576 * (1320 + 6 * 112 + 2 * 108) + 12 * 108 | 16,729,104 | 29 | 16,729,104 + 18 * 108 - 1 | 16,731,047 |
| 9 | 12 | 7,576 * (1320 + 6 * 112 + 3 * 108) + 12 * 108 | 17,547,312 | 29 | 17,547,312 + 18 * 108 - 1 | 17,549,255 |
| 10 | 12 | 7,576 * (1320 + 6 * 112 + 4 * 108) + 12 * 108 | 18,365,520 | 29 | 18,365,520 + 18 * 108 - 1 | 18,367,463 |
| 11 | 12 | 7,576 * (1320 + 6 * 112 + 5 * 108) + 12 * 108 | 19,183,728 | 29 | 19,183,728 + 18 * 108 - 1 | 19,185,671 |

| Sub-block Number (SuBN) | First ESI | Start Byte (Formula) | Start Byte (Value) | Last ESI | End Byte (Formula) | End Byte (Value) |
|---|---|---|---|---|---|---|
| 5 | 12 | (5 * 758 + 12) * 1320 | 5,018,640 | 29 | 5,018,640 + 1320 * 18 - 1 | 5,042,399 |
| 19 | 27 | (12 * 758 + 7 * 757 + 27) * 1320 | 19,037,040 | 36 | 19,037,040 + 1320 * 10 - 1 | 19,050,239 |

Fig. 39

| Sub-block Number (SuBN) | First ESI | Start Byte (Formula) | Start Byte (Value) | Last ESI | End Byte (Formula) | End Byte (Value) |
|---|---|---|---|---|---|---|
| 5 | 758 | 5 * 758 * 1320 | 5,002,800 | 775 | 5,002,800 + 1320 * 18 - 1 | 5,026,559 |
| 19 | 757 | (12 * 758 + 7 * 757) * 1320 | 19,001,400 | 766 | 19,001,400 + 1320 * 10 - 1 | 19,014,599 |

Fig. 40

| Sub-block Number (SuBN) | First ESI | Start Byte (Formula) | Start Byte (Value) | Last ESI | End Byte (Formula) | End Byte (Value) |
|---|---|---|---|---|---|---|
| 0 | 7576 | 0 | 0 | 7593 | 0 + 18 * 112 - 1 | 2,015 |
| 1 | 7576 | 7,576 * 112 | 848,512 | 7593 | 848,512 + 18 * 112 - 1 | 850,527 |
| 2 | 7576 | 7,576 * 2 * 112 | 1,697,204 | 7593 | 1,697,204 + 18 * 112 - 1 | 1,699,219 |
| 3 | 7576 | 7,576 * 3 * 112 | 2,545,536 | 7593 | 2,545,536 + 18 * 112 - 1 | 2,547,551 |
| 4 | 7576 | 7,576 * 4 * 112 | 3,394,048 | 7593 | 3,394,048 + 18 * 112 - 1 | 3,396,063 |
| 5 | 7576 | 7,576 * 5 * 112 | 4,242,560 | 7593 | 4,242,560 + 18 * 112 - 1 | 4,244,575 |
| 6 | 7576 | 7,576 * 6 * 112 | 5,091,072 | 7593 | 5,091,072 + 18 * 108 - 1 | 5,093,015 |
| 7 | 7576 | 7,576 * (6 * 112 + 108) | 5,909,280 | 7593 | 5,909,280 + 18 * 108 - 1 | 5,911,223 |
| 8 | 7576 | 7,576 * (6 * 112 + 2 * 108) | 6,727,488 | 7593 | 6,727,488 + 18 * 108 - 1 | 6,729,431 |
| 9 | 7576 | 7,576 * (6 * 112 + 3 * 108) | 7,545,696 | 7593 | 7,545,696 + 18 * 108 - 1 | 7,547,639 |
| 10 | 7576 | 7,576 * (6 * 112 + 4 * 108) | 8,363,904 | 7593 | 8,363,904 + 18 * 108 - 1 | 8,365,847 |
| 11 | 7576 | 7,576 * (6 * 112 + 5 * 108) | 9,182,112 | 7593 | 9,182,112 + 18 * 108 - 1 | 9,184,055 |

Fig. 41

CONTENT DELIVERY SYSTEM WITH ALLOCATION OF SOURCE DATA AND REPAIR DATA AMONG HTTP SERVERS

CROSS-REFERENCE TO RELATED APPLICATIONS

This application is a continuation of U.S. patent application Ser. No. 13/563,590, entitled "Content Delivery System with Allocation of Source Data and Repair Data Among HTTP Servers," filed Jul. 31, 2012, which is hereby expressly incorporated by reference herein for all purposes.

This application claims priority from and is a non-provisional of U.S. Provisional Patent Application No. 61/614,408, filed Mar. 22, 2012 entitled "Unicast Repair Service and Server Augmenting Broadcast File Delivery System", U.S. Provisional Patent Application No. 61/645,562, filed May 10, 2012 entitled "Content Delivery System with Allocation of Source Data and Repair Data Among HTTP Servers", and U.S. Provisional Patent Application No. 61/647,414, filed May 15, 2012 entitled "Content Delivery System with Allocation of Source Data and Repair Data Among HTTP Servers", the entire disclosure of which is incorporated by reference herein for all purposes.

The present disclosure may be related to the following commonly assigned patents or applications, each of which are herein incorporated by reference in their entirety for all purposes:

1) U.S. Pat. No. 6,307,487 issued to Michael G. Luby, entitled "Information Additive Code Generator and Decoder for Communication Systems" (hereinafter "Luby I");

2) U.S. Pat. No. 6,320,520 issued to Michael G. Luby, entitled "Information Additive Group Code Generator and Decoder for Communication Systems" (hereinafter "Luby II");

3) U.S. Pat. No. 6,856,263 issued to M. Amin Shokrollahi, entitled "Systems and Processes for Decoding a Chain Reaction Code Through Inactivation" (hereinafter "Shokrollahi I");

4) U.S. Pat. No. 6,909,383, issued to M. Amin Shokrollahi, entitled "Systematic Encoding and Decoding of Chain Reaction Codes" (hereinafter "Shokrollahi II");

5) U.S. Pat. No. 7,068,729 issued to M. Amin Shokrollahi, entitled "Multi-Stage Code Generator and Decoder for Communication Systems" (hereinafter "Shokrollahi III");

6) U.S. Pat. No. 7,418,651, issued to Michael G. Luby, M. Amin Shokrollahi and Mark Watson, entitled "File Download and Streaming System" (hereinafter "Luby III");

7) U.S. Patent Publication No. 2006/0280254 naming Michael G. Luby and M. Amin Shokrollahi, entitled "In-Place Transformations with Applications to Encoding and Decoding Various Classes of Codes" (hereinafter "Luby IV");

8) U.S. Patent Publication No. 2007/0195894 naming M. Amin Shokrollahi, entitled "Multiple-Field Based Code Generator and Decoder for Communications Systems" (hereinafter "Shokrollahi IV");

9) U.S. patent application Ser. No. 12/604,773, filed Oct. 23, 2009, naming M. Amin Shokrollahi, et al., entitled "Method and Apparatus Employing FEC Codes with Permanent Inactivation of Symbols for Encoding and Decoding Processes" (hereinafter "Shokrollahi V");

10) U.S. Provisional Application No. 61/235,285, filed Aug. 19, 2009, naming Michael G. Luby, entitled "Methods and Apparatus Employing FEC Codes with Permanent Inactivation of Symbols for Encoding and Decoding Processes" (hereinafter "Luby V"); and 11) U.S. patent application Ser. No. 12/859,161 filed Aug. 18, 2010 naming Michael G. Luby, M. Amin Shokrollahi, entitled "Methods and Apparatus Employing FEC Codes with Permanent Inactivation of Symbols for Encoding and Decoding Processes" (hereinafter "Shokrollahi VI").

12) U.S. patent application Ser. No. 13/206,418 filed Aug. 9, 2011 naming Michael G. Luby, Thadi M. Nagaraj, entitled "Broadcast Multimedia Storage and Access Using Page Maps when Asymmetric Memory is Used" (hereinafter "Luby VI").

13) U.S. Patent Application No. 61/645,562 filed May 10, 2012 naming Michael G. Luby, Nikolai Leung, Ralph Gholmieh, Thomas Stockhammer, entitled "Content Delivery System with Allocation of Source Data and Repair Data Among HTTP Servers" (hereinafter "Luby VII").

REFERENCES

Each of references below is herein incorporated by reference in their entirety for all purposes:

[Albanese96], or [PET] "Priority Encoding Transmission", Andres Albanese, Johannes Blomer, Jeff Edmonds, Michael Luby, and Madhu Sudan, IEEE Transactions on Information Theory, vol. 42, no. 6 (November 1996);

[Albanese97], or [PET-Patent] U.S. Pat. No. 5,617,541 to A. Albanese, M. Luby, J. Blomer, J. Edmonds, entitled "System for Packetizing Data Encoded Corresponding to Priority Levels Where Reconstructed Data Corresponds to Fractionalized Priority Level and Received Fractionalized Packets" (issued Apr. 1, 1997);

[ALC] Luby, M., Watson, M., Vicisano, L., "Asynchronous Layered Coding (ALC) Protocol Instantiation", IETF RFC 5775 (April 2010);

[FEC BB] Watson, M., Luby, M., and L. Vicisano, "Forward Error Correction (FEC) Building Block", IETF RFC 5052 (August 2007);

[FLUTE] Paila, T., Luby, M., Lehtonen, R., Roca, V., Walsh, R., "FLUTE—File Delivery over Unidirectional Transport", IETF RFC 3926 (October 2004);

[LCT] Luby, M., Watson, M., Vicisano, L., "Layered Coding Transport (LCT) Building Block", IETF RFC 5651 (October 2009)

[Luby2007], or [Raptor-RFC-5053] M. Luby, A. Shokrollahi, M. Watson, T. Stockhammer, "Raptor Forward Error Correction Scheme for Object Delivery", IETF RFC 5053 (September 2007);

[Luby2002] Luby, M., Vicisano, L., Gemmell, J., Rizzo, L., Handley, M., and J. Crowcroft, "The Use of Forward Error Correction (FEC) in Reliable Multicast", IETF RFC 3453 (December 2002);

[Matsuoka], or [LDPC-Extensions] "Low-Density Parity-Check Code Extensions Applied for Broadcast-Communication Integrated Content Delivery", Hosei Matsuoka, Akira Yamada, and Tomoyuki Ohya, Research Laboratories, NTT DOCOMO, Inc., 3-6, Hikari-No-Oka, Yokosuka, Kanagawa, 239-8536, Japan; and

[RaptorQ-RFC-6330] M. Luby, A. Shokrollahi, M. Watson, T. Stockhammer, L. Minder, "RaptorQ Forward Error Correction Scheme for Object Delivery", IETF RFC 6330, Reliable Multicast Transport (August 2011);

[Roca], or [LDPC-RFC-5170] V. Roca, C. Neumann, D. Furodet, "Low Density Parity Check (LDPC) Staircase and Triangle Forward Error Correction (FEC) Schemes", IETF RFC 5170 (June 2008).

FIELD OF THE INVENTION

The present invention relates to encoding and decoding data in communications systems and more specifically to communication systems that encode and decode data to account for errors and gaps in communicated data in an efficient manner and that handle different file delivery methods.

BACKGROUND OF THE INVENTION

Techniques for transmission of files between a sender and a recipient over a communications channel are the subject of much literature. Preferably, a recipient desires to receive an exact copy of data transmitted over a channel by a sender with some level of certainty. Where the channel does not have perfect fidelity (which covers most all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors.

Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected a simple parity code might be best.

As used herein, "source data" refers to data that is available at one or more senders and that a receiver is used to obtain, by recovery from a transmitted sequence with or without errors and/or erasures, etc. As used herein, "encoded data" refers to data that is conveyed and can be used to recover or obtain the source data. In a simple case, the encoded data is a copy of the source data, but if the received encoded data differs (due to errors and/or erasures) from the transmitted encoded data, in this simple case the source data might not be entirely recoverable absent additional data about the source data. Transmission can be through space or time. In a more complex case, the encoded data is generated based on source data in a transformation and is transmitted from one or more senders to receivers. The encoding is said to be "systematic" if the source data is found to be part of the encoded data. In a simple example of systematic encoding, redundant information about the source data is appended to the end of the source data to form the encoded data.

Also as used herein, "input data" refers to data that is present at an input of an FEC (forward-error correcting) encoder apparatus or an FEC encoder module, component, step, etc., ("FEC encoder") and "output data" refers to data that is present at an output of an FEC encoder. Correspondingly, output data would be expected to be present at an input of an FEC decoder and the FEC decoder would be expected to output the input data, or a correspondence thereof, based on the output data it processed. In some cases, the input data is, or includes, the source data, and in some cases, the output data is, or includes, the encoded data. For example, the input data would be the source data if there is no processing before the input of an FEC encoder. However, in some cases, the source data is processed into a different form (e.g., a static encoder, an inverse encoder or another process) to generate intermediate data that is presented to the FEC encoder instead of the source data.

In some cases, a sender device or sender program code may comprise more than one FEC encoder, i.e., source data is transformed into encoded data in a series of a plurality of FEC encoders. Similarly at the receiver, there may be more than one FEC decoder applied to generate source data from received encoded data.

Data can be thought of as partitioned into symbols. An encoder is a computer system, device, electronic circuit, or the like, that generates encoded symbols or output symbols from a sequence of source symbols or input symbols and a decoder is the counterpart that recovers a sequence of source symbols or input symbols from received or recovered encoded symbols or output symbols. The encoder and decoder are separated in time and/or space by the channel and any received encoded symbols might not be exactly the same as corresponding transmitted encoded symbols and they might not be received in exactly the same sequence as they were transmitted. The "size" of a symbol can be measured in bits, whether or not the symbol is actually broken into a bit stream, where a symbol has a size of M bits when the symbol is selected from an alphabet of $2^M$ symbols. In many of the examples herein, symbols are measured in octets and codes might be over a field of 256 possibilities (there are 256 possible 8-bit patterns within each octet), but it should be understood that different units of data measurement can be used and it is well-known to measure data in various ways. In the general literature, the term "byte" is sometimes used interchangeably with the term "octet" to indicate an 8-bit value, although in some contexts "byte" indicates an X-bit value where X is not equal to 8, e.g., X=7. Herein, the term "octet" and "byte" are used interchangeably. Unless otherwise indicated, the examples herein are not limited to a particular integer or noninteger number of bits per symbol.

Luby I describes the use of codes, such as chain reaction codes, to address error correction in a compute-efficient, memory-efficient and bandwidth-efficient manner. One property of the encoded symbols produced by a chain reaction encoder is that a receiver is able to recover the original file as soon as enough encoded symbols have been received. Specifically, to recover the original K source symbols with a high probability, the receiver needs approximately K+A encoded symbols.

The "absolute reception overhead" for a given situation is represented by the value A, while a "relative reception overhead" can be calculated as the ratio A/K. The absolute reception overhead is a measure of how much extra data needs to be received beyond the information theoretic minimal amount of data, and it may depend on the reliability of the decoder and may vary as a function of the number, K, of source symbols. Similarly, the relative reception overhead, A/K, is a measure of how much extra data needs to be received beyond the information theoretic minimal amount of data relative to the size of the source data being recovered, and also may depend on the reliability of the decoder and may vary as a function of the number K of source symbols.

Chain reaction codes are extremely useful for communication over a packet based network. However, they can be fairly computationally intensive at times. A decoder might be able to decode more often, or more easily, if the source symbols are encoded using a static encoder prior to a dynamic encoder that encodes using a chain reaction or another rateless code. Such decoders are shown in Shokrollahi I, for example. In examples shown there, source symbols are input symbols to a static encoder that produces output symbols that are input symbols to a dynamic encoder that produces output symbols that are the encoded symbols, wherein the dynamic encoder is a rateless encoder that that can generate a number of output symbols in a quantity that is not a fixed rate relative to the number of input symbols. The static encoder might include more than one fixed rate encoder. For example a static encoder might include a Hamming encoder, a low-density parity-check ("LDPC") encoder, a high-density parity-check ("HDPC") encoder, and/or the like.

Chain reaction codes have a property that as some symbols are recovered at the decoder from the received symbols, those symbols might be able to be used to recover additional symbols, which in turn might be used to recover yet more symbols. Preferably, the chain reaction of symbol solving at the decoder can continue such that all of the desired symbols are recovered before the pool of received symbols is used up. Preferably, the computational complexity of performing chain reaction encoding and decoding processes is low. The desired symbols might be all of the symbols needed to fully recover all of the original source symbols, or some desired level of completeness that is less than all of the original source symbols.

A recovery process at the decoder might involve determining which symbols were received, creating a matrix that would map the original input symbols to those encoded symbols that were received, then inverting the matrix and performing a matrix multiplication of the inverted matrix and a vector of the received encoded symbols. In a typical system, a brute force implementation of this can consume excessive computing effort and memory requirements. Of course, for a particular set of received encoded symbols, it might be impossible to recover all of the original input symbols, but even where it is possible, it might be very computationally expensive to compute the result.

Forward Error Correction ("FEC") Object Transmission Information ("OTI"), or "FEC OTI"

Based on the FEC OTI a receiver receives (or is able to infer), the receiver can determine the source block and sub-block structure of the file transfer. In [Raptor-RFC-5053] and [RaptorQ-RFC-6330], the FEC Payload ID is (SBN, ESI), where in [Raptor-RFC-5053] the source block number (SBN) is 16 bits and the encoding symbol ID (ESI) is 16 bits, whereas in [RaptorQ-RFC-6330] the SBN is 8 bits and the ESI is 24 bits, as illustrated in FIGS. 1A-1B herein. One disadvantage of this FEC Payload ID format is that one has to pre-determine the number of bits of the FEC Payload ID to allocate to the SBN and to the ESI, and it is sometimes difficult to determine a proper mix that will be adequate for all file delivery parameters.

For example, when using [Raptor-RFC-5053], having only $2^{16}$=65,536 ESIs available might be limiting in some situations, since in some cases there might be a source block with 8,192 source symbols and thus the number of encoded symbols is only a factor of 8 larger, limiting the possible code rate that could be used to be limited to not go down below ⅛ in this case. In this example, it may be that $2^{16}$=65,536 source blocks available could be more than would ever be used, e.g., with 8,192 source symbols of 1,024 octets each, the size of the file that could be supported is 524 GB, which in many applications is two orders of magnitude larger than is needed.

As another example, when using [RaptorQ-RFC-6330], having only $2^8$=256 SBNs available might be limiting in some situations, since for a 4 GB file, if each source block is limited to 8 MB (which might be the case if the maximum sub-block size is 256 KB, the minimum sub-symbol size is 32 octets, and the symbol size is 1,024 octets) then limiting the number of source blocks to 256 in turn limits the file size to 2 GB. In this example, it may be that having available $2^{24}$=16,777,216 possible encoded symbols are more than would ever be used, e.g., with 8,192 source symbols the number of possible encoded symbols is 2,048 times larger, which may never be needed in some applications.

Another desirable property is to provide capabilities for prioritized encoding transmission, sometimes also called unequal error protection ("UEP"), between different parts of the file. For example, it might be desirable to protect the first 10% of the file more strongly against packet loss than the remaining 90%. For example, [LDPC-Extensions] describes how [LDPC-RFC-5170] can be extended to provide support for UEP. In this case, the actual FEC code itself is modified to provide different levels of parity protection on different parts of a file. However, there are drawbacks to this approach. For example, it is not desirable to have to modify the FEC code itself to provide UEP, as this complicates implementing and testing the FEC code itself. Furthermore, as the results shown in FIG. 6 of [LDPC-Extensions], the resulting performance of such an approach in terms of the resiliency to packet loss that is provided for the different parts of the file is far from optimal.

One way to provide UEP file delivery capabilities, as described in [PET] and [PET-Patent], is to allocate different parts of each packet for the different parts of the file according to their priority and size. However, a concern is how to incorporate such UEP methods in such a way that each different part of the file can be partitioned into source blocks and sub-blocks independently of other parts of the file, for example to support small memory decoding of each part of the file, and yet at the same time provide an FEC Payload ID within each packet that allows the receiver to determine which symbol for each part of the file is contained in each packet. This is very difficult to support using an FEC Payload ID of the format (SBN, ESI), as for each part of the file the corresponding SBN and ESI for the symbol in the packet for a first part of the file might be different than the SBN and ESI for the symbol in the packet for a second part of the file.

In some cases, specialized servers are required, and that can be more expensive to implement, support and maintain that using more common, conventional hardware systems to support content delivery. Therefore, it is desirable to have methods for delivering content and repair symbols that are less complex to implement.

SUMMARY OF THE INVENTION

In embodiments of a file delivery method and apparatus, content is provided to a file delivery system so that source blocks and symbols representing the content are available in a unicast fashion and repair blocks and symbols are provided in a broadcast or multicast fashion. Other avenues and redundancies might be provided. The unicast provision of source blocks and symbols might be done by one entity and the broadcast or multicast portion provided by another entity, with or without specific handling done by the first entity.

In a specific embodiment, a set of content (data, images, audio, video, etc.) is to be made available to a large number of end-user devices ("UEs") operated by or for a large number of users in order to present the content to those users, typically beginning a presentation to a given user very shortly after that user asynchronously makes a request for the content and preferably continuing the presentation to its end (unless the user terminates it). In that embodiment, the content is stored in source form at one or more unicast servers and repair symbols for the content are generated and stored at a broadcast server and broadcast or multicast from there to multiple UEs. Alternatively, there is no storage and the content is broadcast as soon as the repair symbols are generated. A UE would then receive some number of repair symbols from the broadcast server, determine whether repair symbols were lost in the process, determine (at least approximately) the number of additional symbols needed to fully recover the content from the additional symbols and the received repair symbols, then request that number of symbols from the unicast server. As another alternative, at least some source symbols are broadcast or multicast from the broadcast server, determine (at least approximately) the number of additional symbols needed to fully recover portions of the content that the UE is going to play back, and then request that number of symbols or sub-symbols from the unicast server, which may be repair sub-symbols or repair symbols.

In some cases, the request to the unicast server is in the form of an HTTP byte-range request. Where an HTTP byte-range request specifies a URL of a file, a starting position in the file and a length of the request (such as the number of symbols requested), or the number of sub-symbols requested, or a byte range request corresponding to a consecutive set of sub-symbols or symbols), the requests might be such that all or many of the requests use the initial position of the file as the starting position. This would allow for downstream caches to more frequently fulfill requests, as it would have all the necessary data to provide, once it has cached the largest request with respect to a given file, since all smaller requests would be a subset of that cached byte range.

In specific embodiments, the unicast servers are simple, conventional HTTP web servers capable of fielding byte-range requests. As such, those unicast servers can be designed unaware of any particular broadcasting being performed.

The following detailed description together with the accompanying drawings will provide a better understanding of the nature and advantages of the present invention.

BRIEF DESCRIPTION OF THE DRAWINGS

FIG. 1A illustrates an FEC Payload ID for Raptor-RFC 5053.

FIG. 1B illustrates an FEC Payload ID for RaptorQ-RFC-6330.

FIG. 2 is a diagram illustrating the FEC Payload ID for a basic universal file delivery ("UFD") method.

FIGS. 5A-5B are examples illustrating the (SBN, ESI) identification of symbols of a file and the mapping to and from the corresponding universal file symbol identifiers ("UFSIs") of symbols of a file.

FIGS. 8A-8B illustrate an example of an (SBN, ESI) identification of a file that comprises two parts, each having a different priority.

FIG. 9 illustrates an example, corresponding to FIGS. 8A and 8B, of the mapping between the (SBN, ESI) identifiers of encoded symbols from the two parts of the file and the packets containing encoded symbols for the parts together with the UFSI included in each packet.

FIG. 20 illustrates an example of a common FEC OTI element format.

FIG. 21 illustrates an example of a scheme-specific FEC OTI element format.

FIG. 32 illustrates an example of sub-block range request calculations for a first source block.

FIG. 33 illustrates an example of sub-block range request calculations for a second source block.

FIG. 35 illustrates an example of source symbols in UOSI order.

FIG. 36 illustrates an example of repair symbols in UOSI order.

FIG. 39 illustrates an example of byte range calculations for an Original-order HTTP file format with no sub-blocking.

FIG. 40 illustrates an example of byte range calculations for an Extended-original-order HTTP file format with no sub-blocking.

FIG. 41 illustrates an example of byte range calculations for an Extended-original-order HTTP file format with sub-blocking.

DETAILED DESCRIPTION OF THE INVENTION

Figure 3:
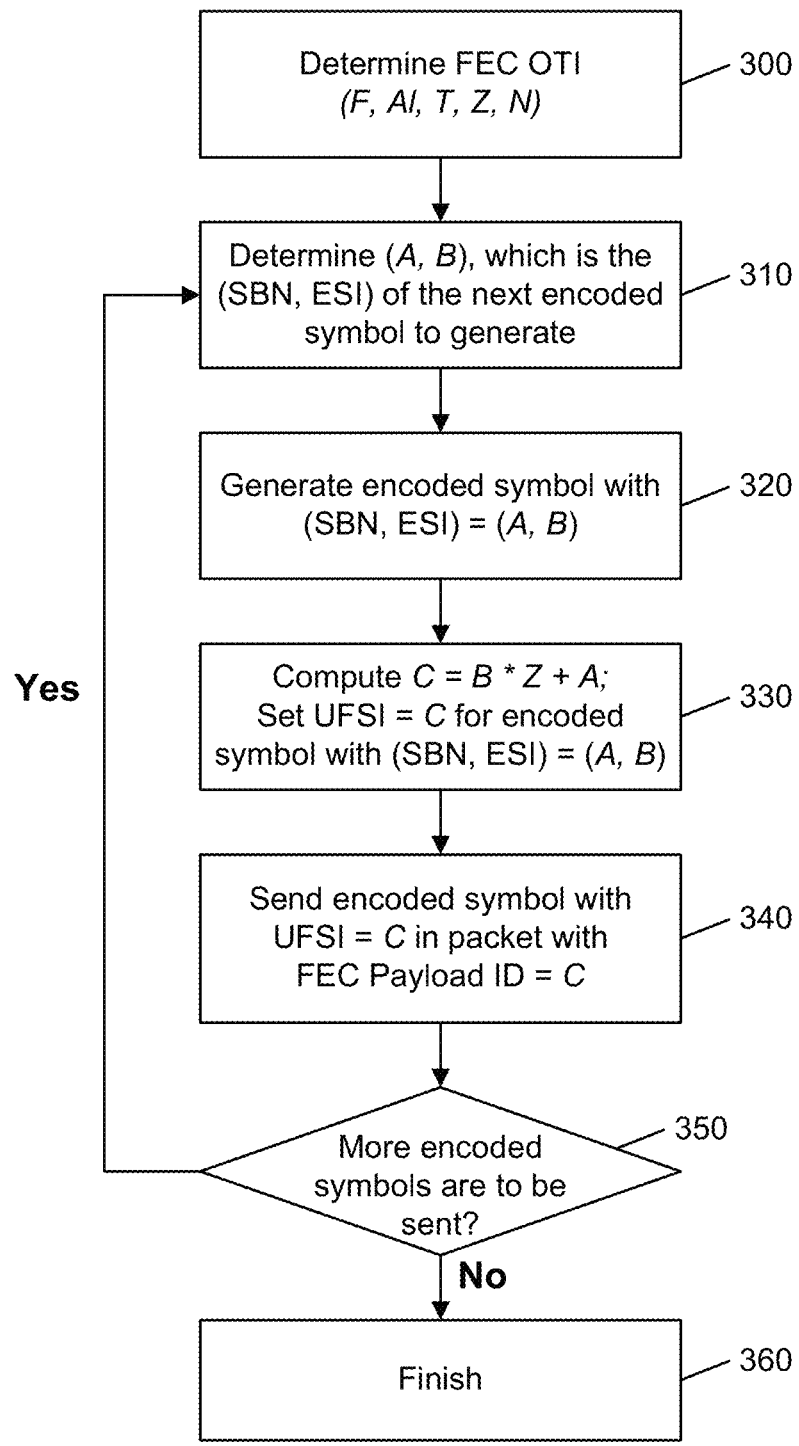
FIG. 3 is a flow chart that illustrates a sender basic UFD method.

In embodiments herein, file delivery is performed by an encoder/transmitter system that sends a file and a receiver/ decoder system that receives a file. The format of the transmissions is coordinated so that the decoder understands what the encoder encoded. As shown in various examples below, file delivery is an example of general object delivery and unless otherwise indicated, it should be apparent from these examples that objects can be treated as files and possibly vice versa.

In a packet delivery system, the data is organized into packets and transmitted as packets. Each packet has elements that allow a receiver to determine what is in the packet and how it is laid out. Using the techniques described herein, flexibility is provided for transmitting packets where forward error correction ("FEC") is used.

Using these techniques, unequal FEC protection can be provided, as well as bundled delivery of files. It is well-known that when many files are delivered as separate files, the resiliency of the deliveries to packet loss can be much less than if all the files are concatenated together into a larger file and the larger file is protected in the delivery. However, a signaling of the structure of the larger file as a combination of smaller files is required, and the receiver generally needs to recover the entire large file to recover any of the smaller files within the large file, even if the receiver is only interested in recovering a subset of the smaller files.

Thus, a preferred file delivery system or method should allow any flexible combination of the number of source blocks and the number of encoding symbols per source block that is used as the file delivery structure for a file. In a typical implementation, a source block is a scope of an FEC operation, such as generating repair symbols. For example, a repair symbol might be generated as a function of one or more source symbols all from one source block. In such cases, each source block might be independently decodable. This is useful at a decoder if it needs to decode and process some data being delivered before all of the data is received. As should be apparent from this disclosure, if source blocks are very small, a received repair symbol would be usable for recovery of a smaller number of source symbols, however, it source blocks are very large, it might take more time for a receiver to decode and/or process and/or use any of the source symbols in the source block as it might take longer to decode a larger source block.

File delivery methods should provide efficient protection against packet loss, and support delivery of the file with different parts of the file protected at different priorities, wherein each part of the file may have a different source block structure and sub-block structure than other parts of the file. Again, files are in some cases considered specific examples of objects, but herein it should be understood that the examples used herein to describe transport and handling of files can also be used for data objects that are perhaps not referred to as files, such as large chunks of data from a database, a portion of a video sequence, etc.

The file/object delivery system or method should provide for the delivery of many smaller files/objects with the protection efficiency of a large file/object, simple signaling of the smaller file/object structures, and the capabilities for the receiver to independently recover only a subset of the smaller files/objects without recovering all of the smaller files/objects.

A file delivery system might comprise a broadcast portion and a unicast portion. For readability, "broadcast" might be read to mean "broadcast, multicast, and/or other mechanisms" for serving common data to a plurality of users." "Unicast" refers to movement of data from one source to one destination, although one logical source might comprise multiple components and one logical destination might comprise multiple components. In a unicast configuration, typically there is a source server and a destination client, with the source server waiting for requests from clients and responding to received request by sending the requested data (if otherwise permitted) to the requesting client specifically. As is well-known in the art, unicast delivery to a large number of destinations can create more scalability challenges than broadcast deliver to those same large number of destinations. Typically, for HTTP delivery, many caching servers are deployed throughout the network to increase sever delivery scalability. However, such an approach doesn't necessarily increase network capacity, which is a common bottleneck for delivery of content to mobile devices.

Examples of systems with these desirable qualities will now be described.

A Basic Universal File Delivery ("UFD") Method and System

A basic universal file delivery ("UFD") method and corresponding system(s) will now be described, wherein the UFD includes significant advantages over existing file delivery methods. The Forward Error Correction ("FEC") Payload ID for the basic UFD method comprises a universal file symbol identifier ("UFSI") field, which for example can be a 32-bit field. The sender and receiver methods for the basic UFD method will now be described in turn. Again, where files are referred to as objects, "UFSI" might be referred to instead as "UOSI" (a universal object symbol identifier).

FIGS. 1A-1B include diagrams illustrating conventional FEC Payload IDs; FIG. 1A illustrates an FEC Payload ID for Raptor-RFC 5053, while FIG. 1B illustrates an FEC Payload ID for RaptorQ-RFC-6330.

FIG. 2 is a diagram illustrating the FEC Payload ID for a basic universal file delivery ("UFD") method. The latter approach can be more flexible.

FIG. 3 illustrates a sender basic UFD method. The sender can use existing methods to generate the FEC Object Transmission Information ("OTI"), for example as described in the [Raptor-RFC-5053] or [RaptorQ-RFC-6330] (see, for example, Section 4.3 of [RaptorQ-RFC-6330]), and use the FEC OTI to determine the source block and sub-block structure to be used to transmit the file, and to determine the relationship between (SBN, ESI) pairs and the encoded symbols of the file (see, for example, Section 4.4 of [RaptorQ-RFC-6330]).

For example, as described in [RaptorQ-RFC-6330], the generated FEC OTI can be (F, Al, T, Z, N), where F is the size of the file to be transmitted, Al is an alignment factor that is used to make sure that sub-symbols are aligned on memory boundaries that are multiples of Al, T is the size of the symbols to be generated and sent in the transmission, Z is the number of source blocks into which the file is to be partitioned for transmission, and N is the number of sub-blocks into which each source block is to partitioned for transmission. This is as shown in Step 300 of FIG. 3.

The sender can form encoded symbols to be sent in packets and generate the SBNs and ESIs for these encoded symbols using existing methods based on the source block, and if sub-blocking is used, then also the sub-block structure, e.g., as described in [RaptorQ-RFC-6330]. Each time an encoded symbol is to be sent, the sender can determine the SBN A and the ESI B for the encoded symbol to be generated, as shown in Step 310 of FIG. 3, and then the sender can generate the value of the encoded symbol based on (SBN, ESI)=(A, B) using existing techniques for example those described in [RaptorQ-RFC-6330], as shown in Step 320 of FIG. 3. Then, the UFSI C for that encoded symbol is computed as C=B*Z+A, as shown in Step 330 of FIG. 3.

The sender can send the encoded symbol in a packet with the FEC Payload ID of the packet set to the UFSI C of the encoded symbol, as shown in Step 340 of FIG. 3. The sender can then determine if more encoded symbols are to be sent, as shown in Step 350 of FIG. 3, and if so then the sender can generate additional encoded symbols to send, as shown by the "Yes" branch to Step 310 of FIG. 3 and, and if not then the sender can finish, as shown by the "No" branch to Step 360 of FIG. 3.

There are many variations of the sender basic UFD method. For example, the sender can send more than one encoded symbol in at least some of the packets, in which case the FEC Payload ID can be set to the UFSI of the first encoded symbol contained in the packet and additional symbols contained in the packet can be chosen so that their corresponding UFSI values are consecutive. For example, if there are three encoded symbols carried in the packet and the first such symbol has UFSI=4,234, then the other two encoded symbols can be those with UFSIs 4,235 and 4,236, respectively. As examples of other alternatives, the sender may predetermine how many encoded symbols to generate and determine the (SBN, ESI) values for all the encoded symbols to be generated before generating any of the encoded symbols. As another example, the UFSI values may be generated directly without an intermediate step of generating the (SBN, ESI) values.

As another example of a variation, other forms of FEC OTI information may be generated. For example, a base UFSI BU may be included in the FEC OTI for the file, that can be used as follows: the UFSI to be used by the FEC sender and receiver for an encoded symbol contained in a packet is U+BU, where U is the UFSI carried in the packet carrying the encoded symbol. Thus, for example, if a packet carries U=1,045, and the base UFSI in the FEC OTI is BU=2,000,000, then the encoded symbol UFSI is 2,001,045. Usage of the base UFSI has several advantages. For one, the protocol suite described in [FLUTE], [ALC], [LCT], [FEC BB] associates a Transmission Object Identifier, also called a TOI, with the FEC OTI of a file or object to be transported. It is possible that encoded symbols for the same file may be sent at different times or in different sessions and can be associated with different TOIs. Also, it is advantageous to be able to send encoded packets starting with the UFSI=0 for the packets associated with each different TOI. By having the ability to specify a base UFSI as part of the FEC OTI, a different base UFSI can be associated with each TOI for which encoded symbols are to be sent for the file without sending duplicate encoded symbols for the different TOIs. For example, encoded symbols for the same file may be sent in packets associated with TOI=1 and associated with TOI=2, wherein the base UFSI associated with TOI=1 is set to 0, and wherein the base UFSI associated with TOI=2 is set to 1,000,000. Then, the encoded packets for both TOI=1 and TOI=2 can contain the sequence of UFSIs 0, 1, 2, etc., and there will be no duplicate encoded symbols sent amongst the encoded symbols sent associated with the two TOIs as long as less than 1,000,000 encoded symbols are sent for the file with TOI=1.

Figure 4:
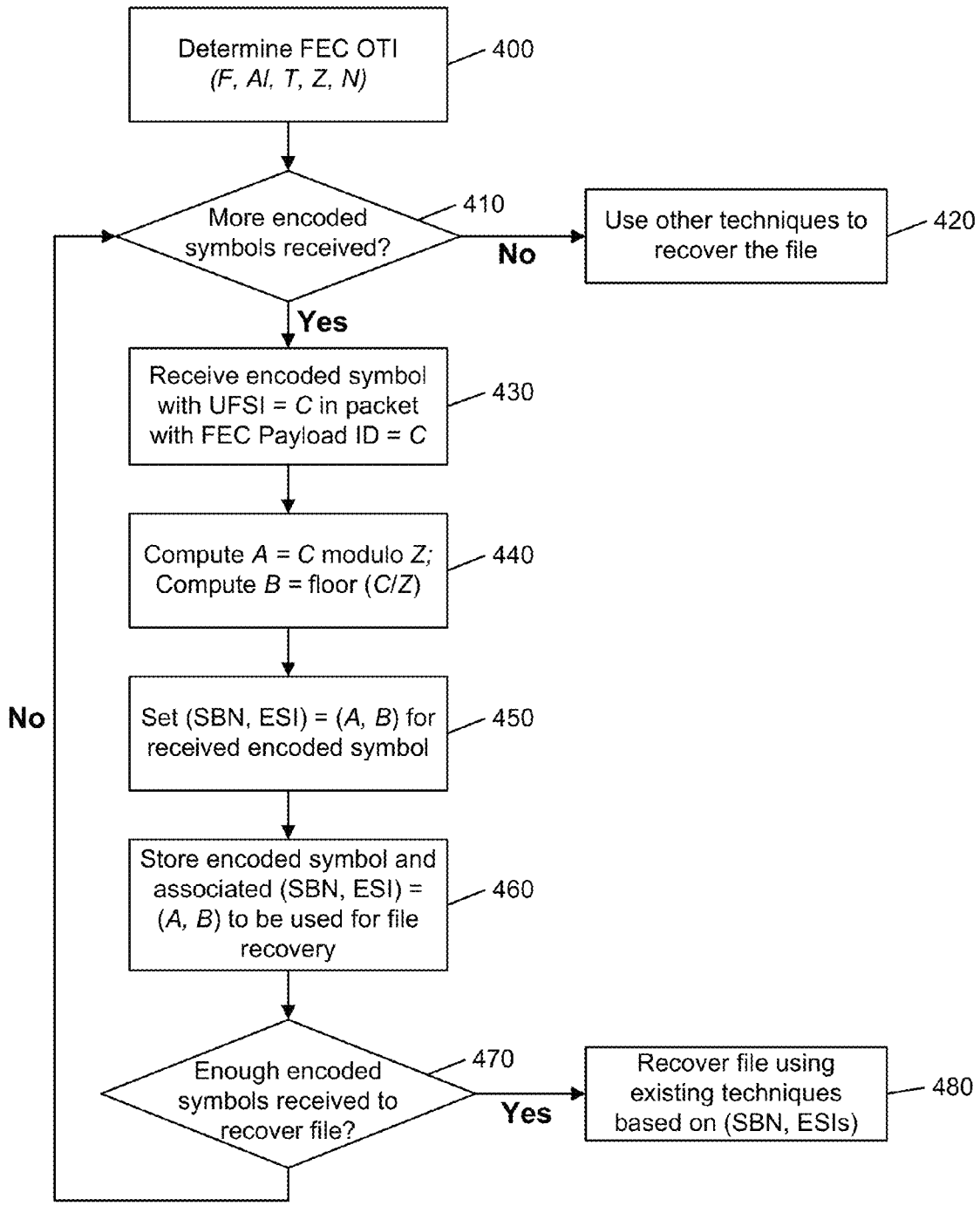
FIG. 4 is a flow chart that illustrates a receiver basic UFD method.

The receiver basic UFD method is described with reference to FIG. 4. The receiver can use existing techniques to determine the FEC OTI (F, Al, T, Z, IV) in the same format as described above as for the sender, as shown in Step 400 of FIG. 4. For example, the FEC OTI may be embedded in a FLUTE session description, or the FEC OTI may be encoded into a URL, or the FEC OTI may be obtained via an SDP message. In Step 410, the receiver sees if more encoded symbols are received, and it may stay at this step until it either receives another encoded symbol, in which case the receiver proceeds to Step 430, or the receiver determines that more encoded symbols are not going to be received, in which case the receiver proceeds to Step 420 and either tries to recover the file using other means, for example using HTTP requests to a file repair server, or the receiver may wait for another session to receiver more encoded symbols at a later time, or the receiver may decide that the file cannot be recovered.

When another encoded symbol is available, in Step 430 the receiver determines the UFSI C of the encoded symbol and receives the value of the encoded symbol. In Step 440, the receiver calculates A=C modulo Z, and B=floor(C/Z) based on the number Z of source blocks and the UFSI C, and in Step 450 the receiver sets the (SBN, ESI) for the encoded symbol to (A, B), and in Step 460 the receiver stores the value of the encoded symbol and (A, B) to be used for file recovery. In Step 470 the receiver determines if there are enough encoded symbols received to recover the file, and if so proceeds to recover the file in Step 480, and if not proceeds to receive more encoded symbols in Step 410.

There are many variations of the receiver basic UFD method. For example, the receiver can receive more than one encoded symbol in at least some of the packets, in which case the FEC Payload ID may be set to the UFSI of the first encoded symbol contained in the packet and additional symbols in the packet may have corresponding UFSI values that are consecutive. For example, if there are three encoded symbols carried in the packet and the first such symbol has UFSI=4,234, then the other two encoded symbols can be those with UFSIs 4,235 and 4,236, respectively, and the UFSI carried in the packet might be the UFSI=4,234 of the first encoded symbol. As examples of other alternatives, the receiver may predetermine how many encoded symbols to receive before attempting recovery. As another example, the receiver may do some processing that is specific to the FEC code used to determine if enough encoded symbols have been received to recover the file. As another example, the UFSI values may be used directly without an intermediate step of generating the (SBN, ESI) values in the recovery process. As another example, recovery of the file may happen concurrently with reception of encoded symbols. As another example, other forms of FEC OTI information may be used.

Combining the basic UFD method with the techniques described in [RaptorQ-RFC-6330] for determining the source block and sub-block structure provides many advantages. For example, what previous methods called source symbols that were identified by a combination of a SBN and ESI for purposes of transmitting the file can be viewed as file symbols that are identified by a UFSI when using the basic UFD method. Let F be the size of the file in octets to be transmitted, and let T be the symbol size to be used for FEC encoding/decoding purposes when transmitting the file, and thus KT=ceil(F/T) is the total number of symbols in the file, where ceil(x) is the smallest integer greater than or equal to x.

When the source block structure and sub-blocking structure is determined as for example described in [RaptorQ-RFC-6330], and the basic UFD method described above is used to convert the identification of a symbol from (SBN, ESI) format to and from UFSI format, the range of UFSIs for the file symbols are 0, 1, 2, ..., KT−1, and any repair symbols generated from the file will have UFSIs in the range KT, KT+1, KT+2, etc. This property allows the determination of whether a symbol is part of the original file or is a repair symbol generated from the file by simply comparing its UFSI to the value of KT. This can be useful for example to allow receivers that do not support FEC decoding to determine which symbols are part of the original file (and their position within the file) and which can be ignored as repair symbols, based on the UFSI value carried in packets, and on the value of KT for the file.

FIGS. 5A and 5B illustrate an example, where in this case the file size is F=28,669 octets, the symbol size is T=1,024 octets, and thus KT=ceil(F/T)=28. In these two figures, the number of source blocks is Z=5. In FIGS. 5A and 5B, the (SBN, ESI) labeling of the symbols of the file is shown at the top and/or side, where each row corresponds to a source block and each column corresponds to symbols with the same ESI value. The corresponding UFSI labeling of the symbols is shown at the bottom. In this case, the symbol with UFSI=27, i.e., the $28^{th}$ symbol with respect to the UFSI labeling, has its last (KT*T)−F=3 octets padded out with zeroes for the purposes of FEC encoding and decoding, but these last three padded octets of this symbol may not be transmitted. Any encoded symbol with UFSI 28 or larger is a repair symbol in this example, where the encoded symbol with UFSI 28 is generated from the source block with SBN=3, the encoded symbol with UFSI 29 is generated from the source block with SBN=4, the encoded symbol with UFSI 30 is generated from the source block with SBN=0, and so on. There are many other advantages of this property, as one skilled in the art will recognize.

Another advantage of the basic UFD method is that if the encoded symbols are sent in the order defined by their UFSI, i.e., in the UFSI order 0, 1, 2, 3, 4, . . . , then the encoded symbols for the Z source blocks are sent in interleaved order, i.e., the Z encoded symbols with ESI 0 from each of the Z source blocks are sent first, followed by the Z encoded symbols with ESI 1 from each of the Z source blocks, etc. For most transmissions, this simple sending order is sufficient and preferred. However, in the case that packet loss experiences some periodicity that might be synchronized with the number of source blocks Z, a potentially better sending order is to randomly permute each set of Z UFSI-consecutive encoded symbols before sending them, i.e., the first Z encoded symbols with UFSIs 0, . . . , Z−1 are sent in random permuted order, and then the next Z encoded symbols with UFSIs Z, . . . , 2*Z−1 are sent in random permuted order, etc. It should be understood through this description, that "random" can include pseudorandom, unless otherwise indicated.

Using the basic UFD method provides many additional advantages over previous known methods. For example, there is a separate predetermined number of possible source blocks or number of possible encoded symbols per source block when using an FEC Payload ID comprising an SBN and ESI fields of predetermined sizes. For example, an 8-bit SBN and a 24-bit ESI resulting in a 32-bit FEC Payload ID limits the number of possible source blocks to 256 and the number of possible encoded symbols per source block to Ser. No. 16/777,216. Instead, the FEC Payload ID comprising the UFSI field only limits the total number of possible encoded symbols for a file, independent of the source block structure of the file. For example, when using a 32-bit UFSI resulting in a 32-bit FEC Payload ID, the total number of encoded symbols that can be generated for a file is 4,294,967,296, independent of how many source blocks into which the file is partitioned, and independent of the sub-block structure of the file if sub-blocking is used. Thus, if symbol is 1,024 octets in size, in this example the file size could be up to 4 GB and the number of encoded symbols could be 1,024 times the file size, independent of whether the file is partitioned into one source block, 16,384 source blocks, or 4,194,304 source blocks. As another example, the file size could be 2 TB and the number of encoded symbols could be twice the file size. In all cases, the number of encoded symbols that could be generated for the file is independent of the sub-blocking structure of the file, if a sub-blocking structure is used.

A Universal File Delivery Method for Unequal Error Protection File Delivery Services Most previous file delivery methods don't support unequal error protection ("UEP") file delivery. There are some previous methods, for example those currently specified in the ISDB-Tmm (Terrestrial mobile multi-media) standard, using the methods described in [LDPC-Extensions], that support UEP by changing the actual FEC code used to encode the different parts of the file. Besides the disadvantage of having to change the actual FEC code when using UEP, a further disadvantage is that the protection provided by these methods is far from ideal.

Figure 6:
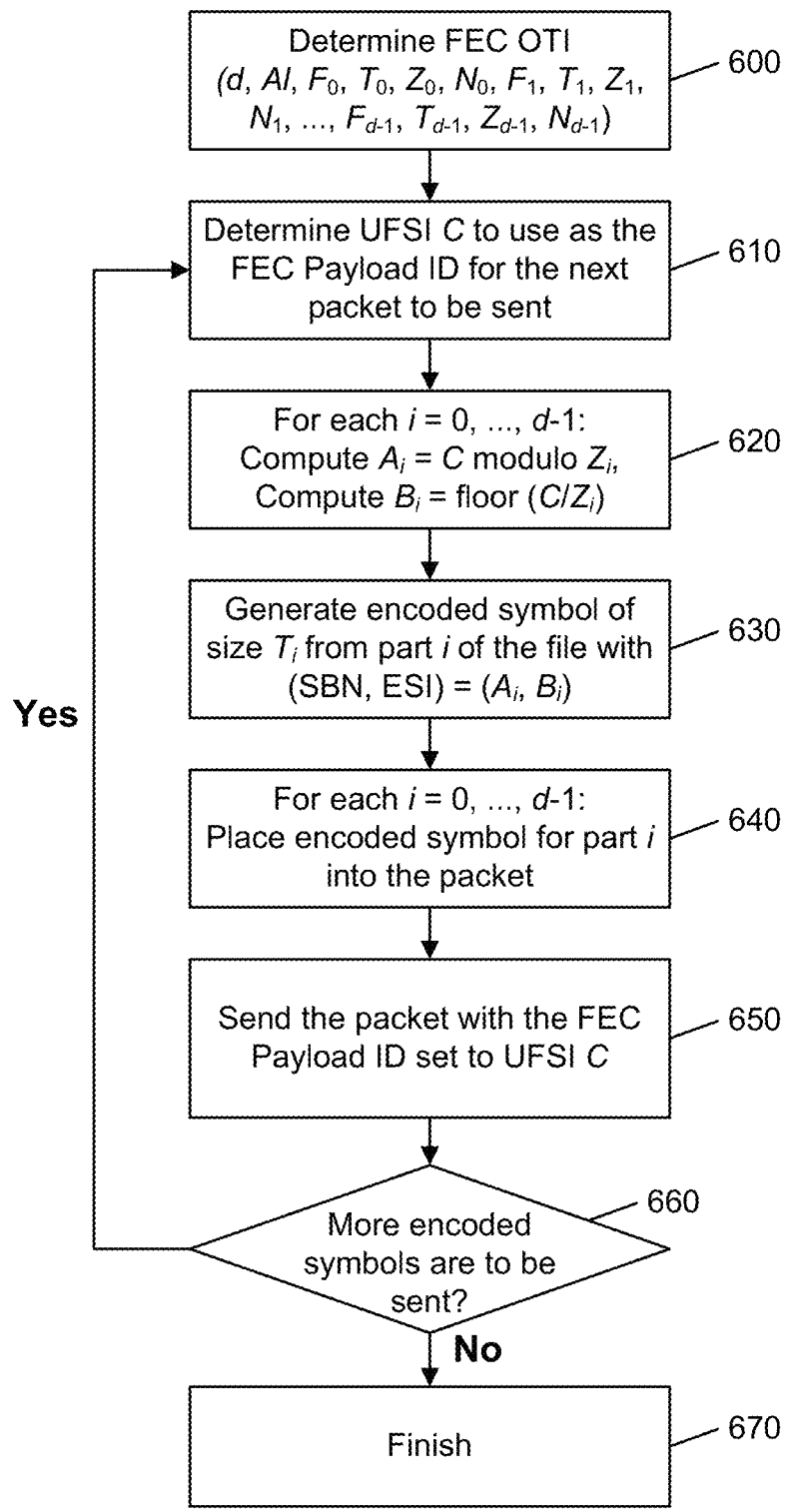
FIG. 6 is a flow chart that illustrates a sender universal file delivery, unequal error protection ("UFD-UEP") method.

As an example, consider the example for which the results are shown in FIG. 6 of [LDPC-Extensions]. In that example, there are two parts to a file of size 1,000 KB that is to be sent in packets, each packet containing a 1 KB symbol: the first part of the file is of size 30 KB and is protected by 100 parity, or repair, packets, and the second part of the file is 970 KB, and overall 1,000 source packets and 1,000 parity packets are sent for the file. The protection provided is far from ideal because of two issues. One issue is that the FEC code that is used, based on [LDPC-RFC-5170], often requires significant reception overhead to recover source block, i.e., more packets are required to be received to recover a file than there are source packets in the file. The second issue is that method essentially sends and protects the first part of the file using a separate set of packets than are used to send and protect the second part of the file. For the second issue, the variance in receiving 30 packets out of the 130 sent for the first part of the file can be large, because the first part of the file is sent over such a small number of packets.

Figure 10:
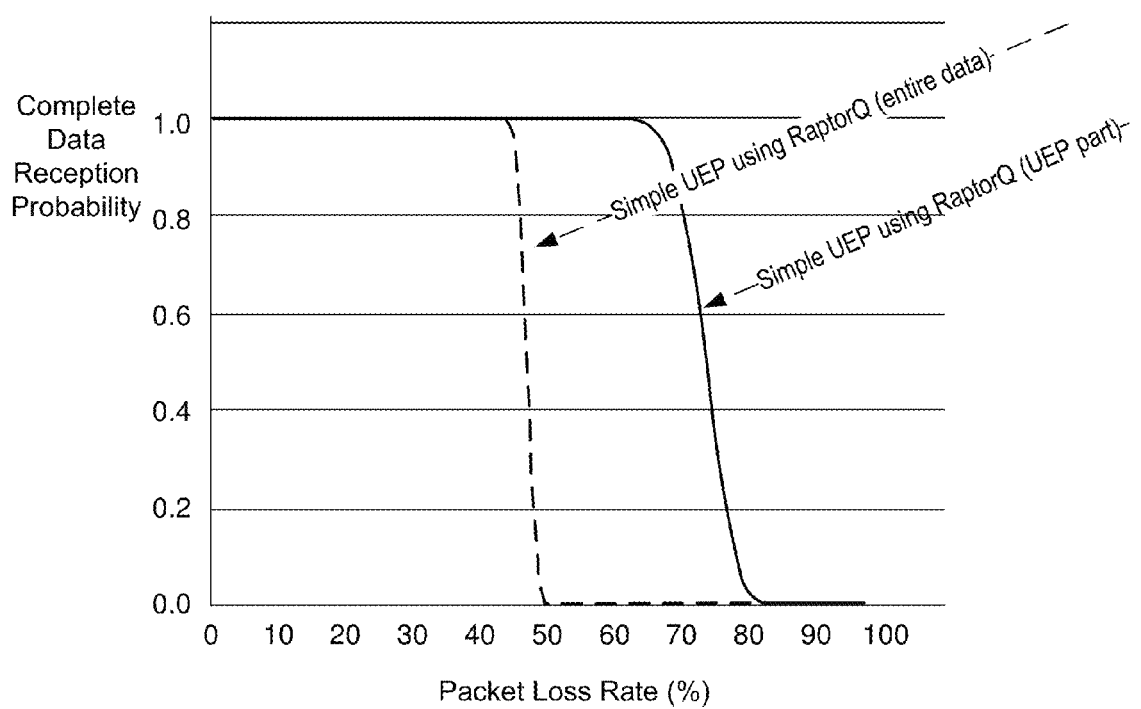
FIG. 10 illustrates the performance of a simple UEP file delivery method using [RaptorQ-RFC-6330].

One can improve on the UEP file delivery method described in [LDPC-Extensions] by an extension, herein called the "simple UEP" file delivery method. The simple UEP file delivery method delivers the parts of a file as separate file deliveries, using existing techniques for file delivery and using different amounts of protection for each part of the file based on its priority, and then the logical connection between the parts of the file can be signaled so that the receiver would know that the delivered files are parts of the same file. For example, the simple UEP file delivery method could use the [RaptorQ-RFC-6330] in the example above to deliver the first 30 KB part of the file by sending a total of 130 packets, each containing an encoded symbol of size 1,024 octets generated from the first part, and then the second 970 KB part of the file could be could delivered as a separate file by sending a total of 1870 packets, each containing an encoded symbol of size 1,024 octets generated from the second part. Thus, a total of 2,000 packets are sent for the two parts of the file sent as separate files. The simple UEP file delivery method is an improvement over the method described in [LDPC-Extensions], because the FEC code itself is not modified, and because, as shown in FIG. 10 herein, the performance of the delivery of the two parts of the file under different packet loss conditions is superior to that shown in FIG. 6 of [LDPC-Extensions].

One possible source of the difference is because the FEC code specified in [RaptorQ-RFC-6330] has superior recovery properties to the FEC code specified in [LDPC-RFC-5170]. However, the simple UEP file delivery method still suffers from the second issue described above.

[PET] and [PET-Patent] provide potentially improved methods for providing a UEP file delivery service, wherein each packet contains a specified amount of encoding data from each part of the file based on its priority. A straightforward incorporation of [PET] would be to include an encoded symbol of the appropriate size for each part of the file in each packet, and then to include a separate FEC Payload ID comprising an (SBN, ESI) pair for each part of the file. However, this method is not advantageous for a few reasons.

For example, there is a separate predetermined number of possible source blocks or number of possible encoded symbols per source block for each part of the file when using an FEC Payload ID comprising an SBN and ESI fields of predetermined sizes for each part. For example, an 8-bit SBN and a 24-bit ESI for each of d parts results in a (32*c)-bit FEC Payload ID that limits the number of possible source blocks per part to 256 and the number of possible encoded symbols per source block to Ser. No. 16/777,216. Furthermore, if the FEC Payload ID size is 32 bits for each of the d parts, then this would mean a total of 32*d bits of FEC Payload IDs for all the parts in each packet, e.g., if d=10 then this is 320 bits, or equivalently 40 octets, just for the FEC Payload ID headers in each packet.

The basic UFD method for file delivery can be extended to provide unequal error protection (UEP) file delivery services, as described in detail below, that provides significant advantages to previous UEP file delivery methods. Herein, these extended methods are referred to as "UFD-UEP" file delivery methods. These UFD-UEP file delivery methods can use some of the methods described in [PET] and [PET-Patent].

An example UFD-UEP file delivery method will now be described in more detail. In such a method, the sender partitions a file of size F into d>1 parts of sizes $F_0, F_1, \ldots, F_{d-1}$, and thus F is equal to the sum over i of $F_i$. The sender partitions the packet size T into d parts of sizes $T_0, T_1, \ldots, T_{d-1}$, and thus T is equal to the sum over i of $T_i$. This partitioning of T is based on $F_0, F_1, \ldots, F_{d-1}$ and the priorities of the corresponding file parts. The ratio $F_i/T_i$ determines how many packets need to be received to recover part i of the file assuming an ideal FEC code is used to protect part i of the file as one source block, and thus the smaller the ratio $F_i/T_i$ the higher the priority of part i of the file. In practice, slightly more than $F_i/T_i$ packets may be needed to recover part i of the file, for example because the FEC code is not perfect and exhibits some reception overhead, or because that part of the file is partitioned into multiple source blocks and the encoded symbols for some source blocks are lost at a higher rate than for other source blocks, or because $F_i/T_i$ is not an integer. As an example of UEP, suppose F=1 MB, T=1,024 octets, d=2, $F_0$=32 KB, $F_1$, F–$F_0$=992 KB, and $T_0$=64 octets, $T_1$=T–$T_0$=960 octets. In this example, $F_0/T_0$=512, and thus ideally reception of 512 packets allows recovery of part 0 of the file, whereas $F_1/T_1$=1,058.13, and thus ideally reception of 1,059 packets allows recovery of part 1 of the file. Thus, in this example, part 0 of the file can be recovered from roughly half as many packets needed to recover part 1 of the file.

Note that in this example, if UEP is not used, i.e., d=1 and thus $F_0$=F=1 MB, and $T_0$=T=1,024 octets, then $F_0/T_0$=1,024 packets are needed to recover the file. Thus, in the UEP example described in the previous paragraph, the recovery of part 1 of the file requires slightly more packets than when UEP is not used, due to the higher priority of part 0 of the file. An analytical study of this fundamental tradeoff can be found in [PET].

There are various ways for the sender UFD-UEP method to generate the partition $T_0, T_1, \ldots, T_{d-1}$ of T based on $F_0, F_1, \ldots, F_{d-1}$ and the priorities of the different file parts. Note that if $T_i$ is chosen so that $F_i/T_i \approx F/T$, then part i of the file is deemed to be of average priority, and the priority of part i would be relatively higher or lower depending on whether $F_i/T_i < F/T$ or $F_i/T_i > F/T$, respectively.

The sender UFD-UEP method for generation of the FEC OTI is now described, with reference to FIG. 6. Given the values of d, $F_0, F_1, \ldots, F_{d-1}, T_0, T_1, \ldots, T_{d-1}$, Al, WS, the FEC OTI can be computed as usual applied to each of the d parts of the file independently using existing methods, for example using the methods described in [RaptorQ-RFC-6330] in Section 4.3, namely that, for each i=0, . . . , d–1, the sender can generate the FEC OTI for file part i that determines how it is to be partitioned into source blocks and sub-blocks using for example the methods described in [RaptorQ-RFC-6330] in Section 4.3, treating $F_i$ as the file size and $T_i$ as the symbol size to be used to carry information for part i in each packet. The sender thus generates the FEC OTI for part i of the file independent of the other parts of the file. This process is shown in Step 600 of FIG. 6 herein.

The sender can also generate the partitioning of part i of the file into source blocks and sub-blocks and the mapping between the (SBN, ESI) of an encoded symbol for part i of the file and how the encoded symbol is generated from part i of the file using existing methods, for example methods described [RaptorQ-RFC-6330] in Section 4.4 and Section 5 therein. These UFD-UEP methods are applied to part i of the file independent of the other parts of the file, and thus different parts of the file may have different source block and sub-block structures, and in particular there may be different numbers of source symbols per source block and different numbers of source blocks between different parts of the file, since the methods are applied independently to each part of the file.

The alignment factor Al is preferably the same for all of the parts of the file, and in particular it is preferable if for each part i the value of $T_i$ is a multiple of Al. Furthermore, if for example, the methods described in Section 4.5 of [RaptorQ-RFC-6330] are used to derive the FEC OTI, it is preferable if the same value of Al and of WS is used when deriving the source block and sub-block structure for each of the parts of the file. The usage of the same value for Al ensures that decoding can occur on memory aligned on multiples of Al octets at the receiver, and the usage of the same value for WS ensures that the maximum block size that needs to be decoded in Random Access Memory (RAM) at the receiver is the same for all parts of the file. However, this is not a requirement of the methods described herein, i.e., the methods apply without modification if different Al values are used for different files, as described further below. There are some applications where using a different value of WS for the different parts of the file are preferred to derive the FEC OTI, for example if it desirable to use less memory to recover the higher priority parts of the file.

There may be applications where usage of different alignment factors for different parts is advantageous. For example, the high priority parts may be decoded by both low-end receivers that have 4-octet aligned memory and high-end receivers that have 8-octet aligned memory, whereas the low priority parts may be decode by only high-end receivers. In this example, it may be advantageous to use Al=4 for the high priority parts so that low-end receivers can efficiently decode these parts, whereas it may be advantageous to use Al=8 for the low priority parts, as the high-end receivers can more efficiently decode these parts with Al=8 than with Al=4.

The corresponding FEC OTI generated by the sender UFD-UEP method specific to file part i comprises $F_i, T_i, Z_i, N_i$, where $Z_i$ is the number of source blocks into which part i of the file is partitioned and $N_i$ is the number of sub-blocks into which each source block of part i of the file is partitioned. Thus, overall the FEC OTI that the sender UFD-UEP method generates for the file can comprise: (d, Al, $F_0, T_0, Z_0, N_0, F_1, T_1, Z_1, N_1, \ldots, N_{d-1}, T_{d-1}, Z_{d-1}, N_{d-1}$). Other versions of the FEC OTI are also available, e.g., when d is fixed and thus does not need to be explicitly listed in the FEC OTI, or when other methods are used for indicating the source block structure, and the sub-block structure if used.

The sender, using the UFD-UEP method, assembles one encoded symbol for each part of the file to be sent in a packet, and the FEC Payload ID for the packet comprises an UFSI value C. When a packet is to be sent, the sender determines an UFSI value C to be used as the FEC Payload ID for the packet, as shown in Step 610 of FIG. 6. The UFSI values to be used for example can be consecutive, for example UFSI values 0, 1, 2, 3, . . . , etc. For a given UFSI value C, the encoded symbol of size $T_i$ to be placed in the i-th part of the packet in the packet for part i of the file has an SBN $A_i$ and an ESI $B_i$, computed as $A_i$=C modulo $Z_i$, and $B_i$=floor(C/$Z_i$), as shown in Step 620 of FIG. 6. For i=0, . . . , d−1, these d encoded symbols are generated for each of the d parts of the packet, and then the UFSI C together with these d encoded symbols of aggregate size T are sent together in the packet, as shown in Steps 630, 640 and 650 of FIG. 6. The sender UFD-UEP method continues to generate and send encoded packets, as shown in the decision made in Step 660 of FIG. 6.

Figure 7:
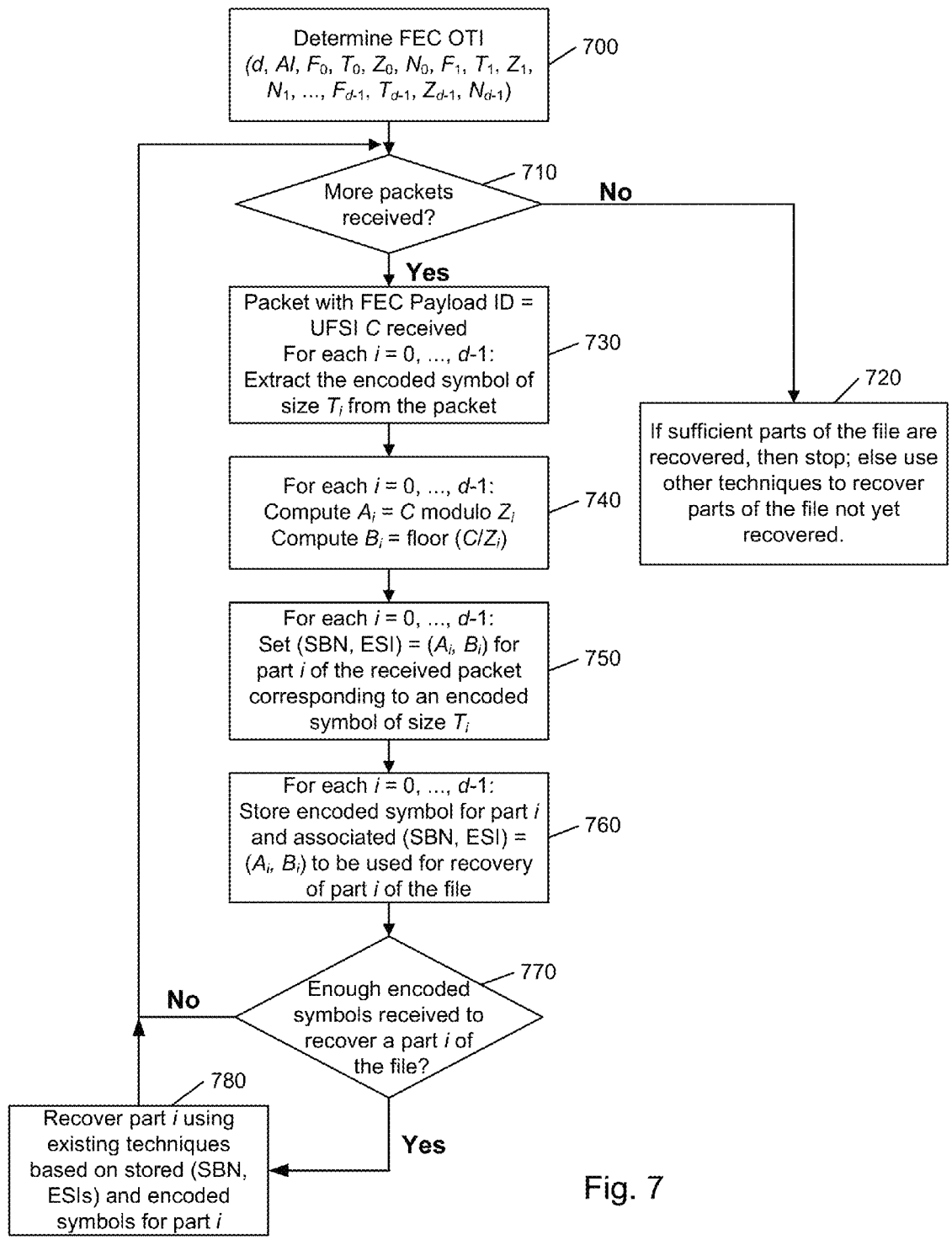
FIG. 7 is a flow chart that illustrates a receiver UFD-UEP method.

The receiver UFD-UEP method is described with reference to FIG. 7. The receiver can use existing techniques to determine the FEC OTI (d, Al, $F_0$, $T_0$, $Z_0$, $N_0$, $F_1$, $T_1$, $Z_1$, $N_1$, . . . , $N_{d-1}$, $T_{d-1}$, $Z_{d-1}$, $N_{d-1}$) in the same format as described above as for the sender, as shown in Step 700 of FIG. 7. For example the FEC OTI may be embedded in a FLUTE session description, or the FEC OTI may be encoded into a URL, or the FEC OTI may be obtained via an SDP message. In Step 710, the receiver sees if more packets are received, and it may stay at this step until it either receives another packet, in which case the receiver proceeds to Step 730, or the receiver determines that more packets are not going to be received, in which case the receiver proceeds to Step 720 and either determines that enough parts of the file have been recovered and stops, or else tries to recover additional parts of the file using other means, for example using HTTP requests to a file repair server, or the receiver may wait for another session to receiver more packets at a later time.

When another packet is available, in Step 730 the receiver determines the UFSI C of the received packet and, for each i=0, . . . , d−1, extracts the encoded symbol of size $T_i$ from the packet for each i=0, . . . , d−1. In Step 740, for each i=0, . . . , d−1, the receiver calculates $A_i$=C modulo $Z_i$, and $B_i$=floor(C/$Z_i$) based on the number $Z_i$ of source blocks and the UFSI C, and in Step 750 the receiver sets the (SBN, ESI) for the encoded symbol for part i to ($A_i$, $B_i$), and in Step 760 the receiver stores the value of the encoded symbol for part i and ($A_i$, $B_i$) to be used to recover part i of the file. In Step 770 the receiver determines, for each i=0, . . . d−1, if there are enough encoded symbols received to recover part i of the file, and if so proceeds to recover part i of the file in Step 780, and if not proceeds to receive more packets in Step 710.

There are many variations of the receiver UFD-UEP method. For example, the sender can send, and thus the receiver can receive, more than one encoded symbol for each part of the file in at least some of the packets, in which case the FEC Payload ID may be set to an UFSI corresponding to the first encoded symbol for each part contained in the packet and additional symbols for each part in the packet may have corresponding UFSI values that are consecutive. For example, if there are three encoded symbols for each part of the file carried in the packet and the first symbol for each part corresponds to UFSI=4,234, then the other two encoded symbols for each part can correspond to UFSIs 4,235 and 4,236, respectively, and the UFSI carried in the packet might be UFSI=4,234.

As examples of other alternatives, the receiver may predetermine how many encoded symbols to receive before attempting recovery, or may calculate packet loss statistics during the session and decide based on this which parts of the file to attempt to recover. As another example, the receiver may do some processing that is specific to the FEC code used to determine if enough encoded symbols have been received to recover each part of the file. As another example, the UFSI values may be used directly without an intermediate step of generating the (SBN, ESI) values in the recovery process for each file part. As another example, recovery of parts of the file may happen concurrently with reception of encoded symbols.

As another example, other forms of FEC OTI information may be used. For example, a base UFSI $BU_i$ may be specified in the FEC OTI for the part i independently of the other parts, that can be used as follows: the UFSI to be used by the FEC sender and receiver for an encoded symbol for part i contained in a packet is U+$BU_i$, where U is the UFSI carried in the packet carrying the encoded symbol. Thus, for example, if a packet carries U=1,045, and the base UFSI in the FEC OTI for part i is $BU_i$=2,000,000, then the encoded symbol UFSI is 2,001,045.

Usage of the base UFSI has several advantages. For example, in the case where only repair symbols are to be transmitted for the different parts (for reasons that are described later), it can be advantageous to set $BU_i$=$KT_i$, where $KT_i$ is the number of file symbols in part i. In this case, the sequence of UFSIs in the sent packet sequence can be 0, 1, 2, 3, etc., and nevertheless for each part only repair symbols generated from that part will be sent in packets.

This paragraph describes another example advantage of usage of the base UFSI. The protocol suite described in [FLUTE], [ALC], [LCT], [FEC BB] associates a Transmission Object Identifier, also called a TOI, with the FEC OTI of a file or object to be transported. It is possible that encoded symbols for the same parts may be sent at different times or in different sessions and may be associated with different TOIs. Also, it is advantageous to be able to send encoded packets starting with the UFSI=0 for the packets associated with each different TOI. By having the ability to specify a base UFSI as part of the FEC OTI independently for each part, a different base UFSI for each part can be associated with each TOI for which encoded symbols are to be sent for the file without sending duplicate encoded symbols for the different TOIs. For example, encoded symbols for the same part may be sent in packets associated with TOI=1 and associated with TOI=2, wherein the base UFSI for the part associated with TOI=1 is set to 0, and wherein the base UFSI for the same part associated with TOI=2 is set to 1,000,000. Then, the encoded packets for both TOI=1 and TOI=2 can contain the sequence of UFSIs 0, 1, 2, etc., and there will be no duplicate encoded symbols for the part sent amongst the encoded symbols sent associated with the two TOIs as long as less than 1,000,000 encoded symbols are sent for the part with TOI=1. It may also be advantageous to have a base UFSI that is to be used by all of the parts in the FEC OTI, instead of specifying a different base UFSI for each part, as this can reduce the number of octets needed to convey the FEC OTI while at the same time sharing many of the advantages of specifying a separate base UFSI for each part in the FEC OTI, especially when the FEC code used in conjunction with this method is an information additive FEC code such as described for example in Luby I, since in this case the valid range of UFSIs for all the parts can be very large.

Combining the UFD-UEP method with the techniques described in [RaptorQ-RFC-6330] for determining the source block and sub-block structure provides many advantages. In particular, all of the advantages of the basic UFD method also hold for the UFD-UEP method. For example, what previous methods called source symbols that were identified by a combination of a SBN and ESI for purposes of transmitting one of the UEP parts of the file can be viewed as file symbols for that part that are identified by a UFSI when using the UFD-UEP method. Note that $KT_i=\text{ceil}(F_i/T_i)$ is the total number of file symbols in part i of the file. When the source block structure and sub-blocking structure is determined for each part of the file as for example described in [RaptorQ-RFC-6330], and the UFD-UEP method described above is used to convert the identification of a symbol for a part of the file from (SBN, ESI) format to and from UFSI format, the range of UFSIs for the file symbols are $0, 1, 2, \ldots, KT_i-1$, and any repair symbols generated from the file will have UFSIs in the range $KT_i$, $KT_i+1, KT_i+2$, etc. This property allows the determination of whether a symbol is part of the original part i of the file or is a repair symbol generated from part i of the file by simply comparing its UFSI to the value of $KT_i$. This can be useful for example to allow receivers that do not support FEC decoding to determine which parts of a packet contain parts of the original file (and their position within the file) and which parts of a packet contain repair symbols that can be ignored, based on the UFSI value carried in packets, and on the values $T_i$ and $KT_i$ for each part i of the file.

FIGS. 8A and 8B illustrate an example, where in this case the file comprises two parts. The first part is partitioned into 5 source blocks, wherein the first 3 of these source blocks have 6 source symbols each and the remaining 2 source blocks have 5 source symbols each, wherein each of these symbols is of size for example 48 octets, and thus the first part is 28*48=1,344 octets in size. The second part is partitioned into 4 source blocks, wherein the first 3 of these source blocks have 4 source symbols each and the remaining 1 source block has 3 source symbols each, wherein each of these symbols is of size for example 256 octets, and thus the second part is 15*256=3,840 octets in size.

FIG. 9 shows a possible packetization for the file structure illustrated in FIGS. 8A and 8B. In this example, each packet comprises the UFSI C, a first encoded symbol of size $T_1=48$ octets generated from the first part of the file structure shown in FIGS. 8A and 8B based on C as described previously with reference to FIG. 6, and a second encoded symbol of $T_2=256$ octets generated from the second part of the file structure shown in FIGS. 8A and 8B based on C as described previously with reference to FIG. 6. The unshaded portions of the packets carry source symbols of the corresponding part of the file, whereas shaded portions carry repair symbols generated from the corresponding part of the file. In this example, the minimal number of packets needed to recover the first part of the file is 28, whereas the minimal number of packets needed to recover the second part of the file is 15.

FIG. 9 depicts 28 packets with UFSIs $0, \ldots, 27$, and thus all of the encoded symbols for the first part of the file carried in these packets are source symbols. Any additional packets generated with UFSI values at least 28 will carry repair symbols for the first part of the file.

Another advantage of the UFD-UEP method is that if the encoded symbols are sent in the order defined by their UFSI, i.e., in the UFSI order $0, 1, 2, 3, 4, \ldots$, then the encoded symbols for the $Z_i$ source blocks of part i of the file are sent in interleaved order, i.e., the $Z_i$ encoded symbols with ESI 0 from each of the $Z_i$ source blocks are sent first, followed by the $Z_i$ encoded symbols with ESI 1 from each of the $Z_i$ source blocks, etc. This property is true for all the parts of the file, even though each part has an independent source block structure. For most transmissions, this simple sending order is sufficient and preferred. However, in the case that packet loss experiences some periodicity that might be synchronized with the number of source blocks $Z_i$, a potentially better sending order is to randomly permute each set of Z UFSI-consecutive encoded symbols before sending them, where Z is the maximum value of $Z_i$ for all $i=0, \ldots, d-1$, i.e., the first Z encoded symbols with UFSIs $0, \ldots, Z-1$ are sent in random permuted order, and then the next Z encoded symbols with UFSIs $Z, \ldots, 2*Z-1$ are sent in random permuted order, etc. Another potential sending order is to randomly permute all of the encoded symbols to be sent before sending them.

Using the UFD-UEP method provides many additional advantages over previous methods or simple extensions of previous methods. For example, the UFD-UEP method using the FEC Payload ID field comprising the UFSI field, the total number of possible encoded symbols for each part of the file is only limited by the size of the UFSI field, and is independent of the source block structure of each part of the file. Furthermore, the usage of the UFSI field provides a universal and succinct FEC Payload ID that allows the concurrent identification of symbols of generated from completely different source block structures for each part of the file. For example, when using a 32-bit UFSI resulting in a 32-bit FEC Payload ID, the total number of encoded symbols that can be generated for a file is 4,294,967,296, independent of how many source blocks into which the file is partitioned, and independent of the sub-block structure of the file if sub-blocking is used, for each part of the file. Thus, if a symbol for the first part of the file is 256 octets in size and a symbol for the second part of the file is 1,024 octets in size, then in this example the first part of the file is 1 GB in size and the second part of the file is 4 GB in size, then the number of encoded symbols could be 1,024 times the number of source symbols for each file part, independent of whether each file part is partitioned into one source block, 16,384 source blocks, or 4,194,304 source blocks.

FIG. 10 illustrates the performance of a simple UEP file delivery method using [RaptorQ-RFC-6330]. In the example there, the UEP file delivery is for 30 source packets, protected with 100 repair packets and 970 source packets protected with 900 repair packets.

Figure 11:
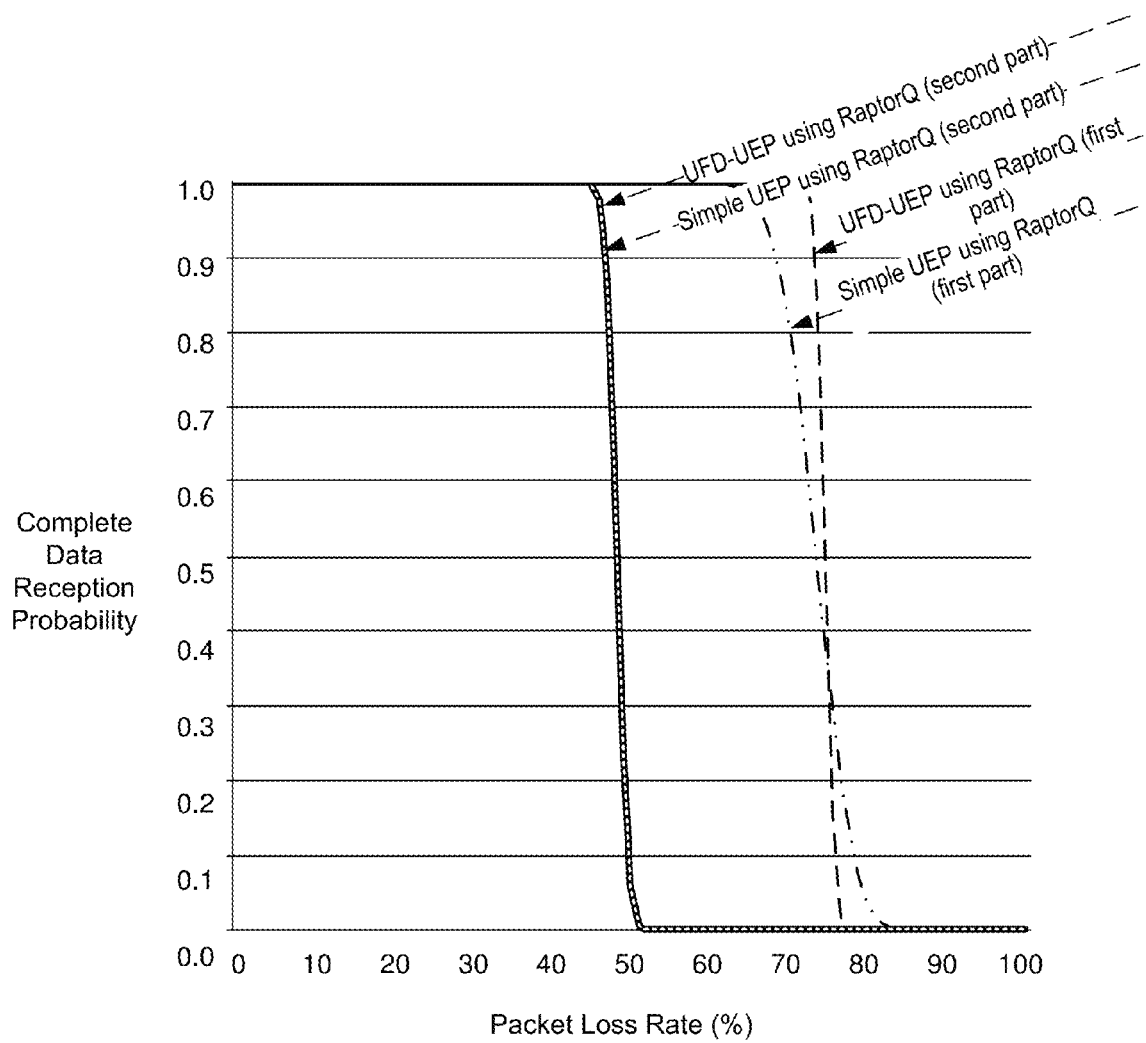
FIG. 11 illustrates an example performance comparison between a simple UEP file delivery method and a UFD-UEP file delivery method, both using [RaptorQ-RFC-6330].

FIG. 11 illustrates an example of improvements that a UFD-UEP file delivery method provides over the simple UEP file delivery method of FIG. 10. In this example, a file of 1 MB is partitioned into a first part of 32 KB and a second part of 992 KB. For both methods, the FEC codes specified in [RaptorQ-RFC-6330] are used, the size within each packet to carry encoded symbols is 1,024 octets, and a total of 2,048 packets are transmitted.

For the simple UEP file delivery method example shown in FIG. 11, the first part of the file and the second part of the file are processed and delivered independently, where in both cases exactly one encoded symbol of size 1,024 octets is carried in each packet. The source for the first part of the file is carried in 32 packets, and a total of 128 packets are sent containing encoded symbols. The source for the second part of the file is carried in 992 packets, and a total of 1,920 packets are sent containing encoded symbols.

For the UFD-UEP file delivery method example shown in FIG. 11, the first part of the file and the second part of the file are processed and delivered in a combined way, i.e., each packet sent contains an encoded symbol for each of the two parts, where for the first part the size of the encoded symbol is 64 octets and for the second part the size of the encoded symbol is 960 octets. The source for the first part of the file is carried in 512 packets, and all 2,048 packets contain an encoded symbol for the first part. The source for the second part of the file is carried in 1059 packets (the encoded symbol in the last packet of the source an encoded symbol for the second part that is padded out with zeroes to the full symbol size of 992 octets), and all 2,048 packets contain an encoded symbol for the second part.

As can be seen in FIG. 11, the recovery performance of the simple UEP file delivery method and the UFD-UEP file delivery method are practically identical for the second part of the file as a function of the packet loss rate, i.e., in both cases the second part of the file is recovered fairly consistently up to a packet loss rate that is approaching 48%. On the other hand, the recovery performance of the UFD-UEP file delivery method is significantly better than that of the simple UEP file delivery method for the first part of the file: the simple UEP file delivery method can consistently recover the first part of the file for packet loss rates less than 65%, whereas the UFD-UEP file delivery method can consistently recover the first part of the file for packet loss rates approaching 75%.

A Universal File Delivery Method and System for Bundled File Delivery Services

Most previous file delivery methods do not support bundled file delivery, i.e., the delivery of multiple files as a single bundled file. A straightforward method of delivering several files is to deliver each file independently. However, this straightforward method has some drawbacks. For example, the protection provided is far from ideal if the files are small, because there can be large variance in packet loss statistics if the number of packets containing encoded symbols for each file is small.

Figure 12:
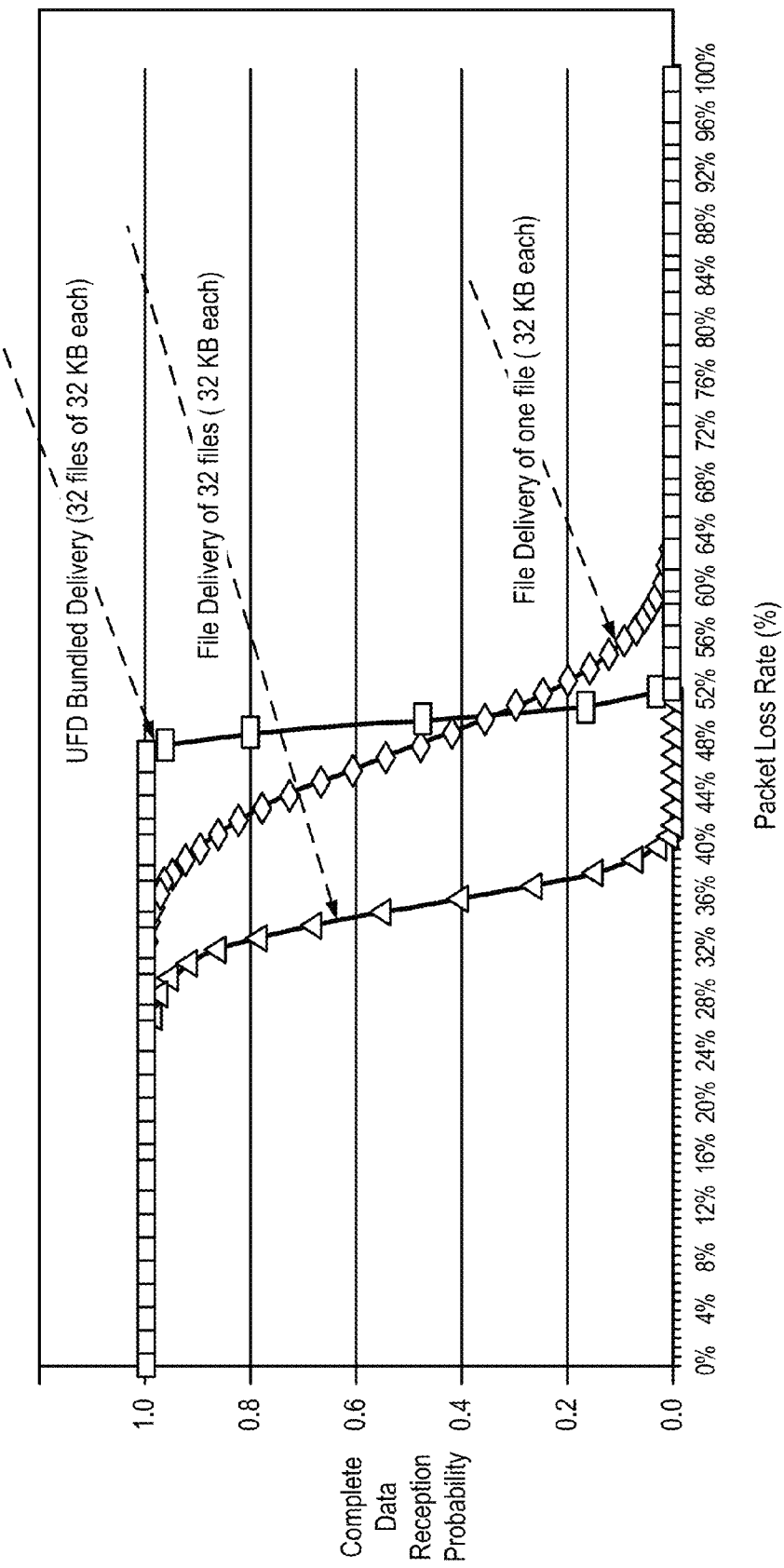
FIG. 12 illustrates an example performance comparison between file delivery of one file, file delivery of multiple files, and a UFD-bundled file delivery method, all using [RaptorQ-RFC-6330].

FIG. 12 illustrates this issue. In FIG. 12, the reliability of the file delivery of a 32 KB file is shown as a function of the percent of packet loss in the network during the delivery. In this file delivery example, symbols are of size 1,024, and the 32 source symbols of the file are encoded into 64 encoded symbols using the FEC codes specified in [RaptorQ-RFC-6330], and each encoded symbol is sent in a separate packet. As can be seen in FIG. 12, the percent of loss under which reliable delivery of the file can be achieved is far less than 50% due to this variance.

Furthermore, if many small files are encoded and transmitted independently, then the percent of packet loss under which all the files are reliably received is even less. FIG. 12 shows this behavior for the delivery of 32 files, each of size 32 KB, where the encoding and transmission of each file is performed independently of the other files using the same parameters as described in the previous paragraph. As can be seen, the delivery of all 32 files can only be reliably achieved when the packet loss is below around 25%, which is far less than 50%.

The UFD-UEP file delivery method can be extended as follows to provide a UFD-bundled file delivery method. The UFD-bundled file delivery method can use the same methods as the UFD-UEP file delivery method, but instead of signaling the delivery of d parts of the same file, instead signal that each part is a separate file and that d files are being delivered as a bundle. Suppose the sender wants to provide the bundled delivery of d files of sizes $F_0, F_1, \ldots, F_{d-1}$, respectively. The sender UFD-bundled method partitions the packet size T into d parts of sizes $T_0, T_1, \ldots, T_{d-1}$, and thus T is equal to the sum over i of $T_i$. This partitioning of T is based on $F_0, F_1, \ldots, F_{d-1}$ and the priorities of the corresponding files.

The ratio $F_i/T_i$ determines how many packets need to be received to recover file i assuming an ideal FEC code is used to protect part i of the file as one source block, and thus the smaller the ratio $F_i/T_i$ the higher the priority of part i of the file. In practice, slightly more than $F_i/T_i$ packets may be needed to recover part i of the file, for example because the FEC code is not perfect and exhibits some reception overhead, or because that part of the file is partitioned into multiple source blocks and the encoded symbols for some source blocks are lost at a higher rate than for other source blocks, or because $F_i/T_i$ is not an integer. If the priority of all the files to be delivered is desired to be the same, then $T_i$ is set so that $F_i/T_i \approx F/T$. Many details of the UFD-bundled file delivery method, for both the sender and receiver, are almost identical to the UFD-UEP file delivery method and are thus omitted.

The UFD-bundled file delivery method can be extended to simultaneously provide both bundled file delivery and UEP file delivery, i.e., the priority of each file in the bundle may be set differently. Furthermore, the UFD-bundled file delivery method can support both delivery of prioritized delivery of multiple files and prioritized delivery of parts of a file, with the proper signaling. For example, if three objects are to be encoded and sent using UFD-bundled file delivery methods, then the first two objects might be different parts of the same file with different priorities, and the third object may be a different file with yet a different priority. The receiver can decide, based on many factors, which of the bundled files and or file parts it is interested in recovering, and recover only those files or parts of files independently of the other files or parts of files. As one skilled in the art will recognize, upon reading this disclosure, there are many possible alternative versions of the UFD-bundled file delivery methods.

As a simple example of UFD-bundled file delivery, suppose that a bundle of 32 files are to be delivered, each file of size 32 KB, where each file has the same priority. Suppose that T=1,024 octets. In this case, for each i=0, . . . , 31, the value of $T_i$=32 octets. Each packet will contain a 32-octet encoded symbol for each of the 32 files, and the UFSI that identifies the 32 encoded symbols in the packet. In this example, there will be 1,024 packets that contain source symbols from each of the 32 equal-size files, and these are the packets with UFSIs in the range 0 through 1,023. Suppose in this example that 1,024 additional repair symbols are generated for each file and sent in an additional 1,024 packets with UFSIs in the range 1,024 through 2,047.

FIG. 12 illustrates the recovery properties of this UFD-bundled file delivery example as a function of packet loss. In this example, all 32 files can be reliably recovered using the UFD-bundled file delivery method for packet loss rates approaching 50%, which is a substantial improvement over the approximately 25% packet loss rate that allows reliably delivery of all 32 files using separate encoding and sending of each file.

UFD and UEP file delivery methods may have many other applications. For example, the segments of DASH formatted content may be delivered over a multicast or broadcast network, such as networks according to the 3GPP eMBMS standard. In that case, the DASH formatted content might be delivered to end user mobile devices to be played back later, and each segment of the DASH formatted content might comprise 8 seconds of video content encoded at 1 Mbps, i.e., each segment is 1 MB in size.

When the DASH formatted content is eventually played back by the end user on a mobile device, full fidelity of the play back is desirable, i.e., without video artifacts or skips or buffering, and the end user may only desire to play back portions of the content delivered. For efficiency and flexibility in the transport and playback, e.g., to be able to format the content once into DASH format and deliver it over a variety of transports without reformatting, it is desirable that each segment be delivered as a separate file.

For network efficiency, it is desirable that each DASH segment be FEC protected and delivered fully-interleaved with the other segments, wherein preferably the interleaving provided by UFD and UEP delivery methods within packets can be utilized. For example, suppose that there are 150 segments to be delivered, and thus overall the size of the DASH content to be delivered is 150 MB comprising 1200 seconds, or equivalently 20 minutes, of play back presentation time. Suppose the content is to be delivered in packets with payloads of 1200 bytes each. Then, using the UFD and UEP delivery methods described herein, 8 bytes of each packet might be allocated to each of the 150 segments, i.e., each packet carries an 8-byte symbol for each of the 150 DASH segments. Then, independent of packet loss patterns, each DASH segment can be recovered upon the arrival to a mobile receiving device of approximately 131,072 packets, i.e., upon the arrival of 1 MB of data for each of the 150 segments. In this example, each of the 150 DASH segments can be decoded and optionally played back at the receiving mobile device without having to decode the other DASH segments.

As another example of the UFD and UEP file delivery methods described herein, consider delivering DASH formatted content delivered over a multicast or broadcast network, such as a network according to the 3GPP eMBMS standard, wherein the DASH content comprises a sequence of video segments and audio segments, wherein each video segment comprises 8 seconds of video content encoded at 1 Mbps, i.e., each video segment is 1 MB in size, and wherein each audio segment comprises 8 seconds of corresponding audio content encoded at 32 Kbps, i.e., each audio segment is 32 KB in size, wherein the video segment and the corresponding audio segment contain content for largely the same interval of 8 seconds of presentation time.

In this example, the DASH content is to be streamed, i.e., each video segment and corresponding audio segment is to be delivered in sequence in order of their presentation times. Suppose the content is to be delivered in packets with payloads of 1200 bytes each. Then, using the UFD and UEP delivery methods described herein, 1160 bytes of each packet might be allocated to a video segment and the remaining 40 bytes of each packet might be allocated to the corresponding audio segment, i.e., each packet carries a 1160-byte symbol for the video segment and a 40-byte symbol for the corresponding audio segment. Then, independent of packet loss patterns, a video segment can be recovered from reception of approximately 905 packets containing symbols for that segment, and the corresponding audio segment can be recovered from approximately 820 packets containing symbols for that segment.

Thus, overall, reception of any 820 packets corresponding to an 8 second interval of presentation time for which there is a corresponding video and audio segment allows the mobile receiving device to recover the audio segment, and reception of an additional 85 packets, or 905 packets in total, also allows recovery of the corresponding video segment. In this example, audio is more protected than video, which is in many cases preferable, for example because the timing of the video play back is dictated by the timing of the audio play back, and in many cases is it preferable to at least play back the audio if not enough data is received to play back both audio and video.

Methods for Native HTTP Support of Unicast Repair Requests

A file or file part may be organized into and made available as an "HTTP file" with an associated URL that can be used by standard HTTP web cache servers to store and provide access to the file or file parts by receivers. The file or file part in its original order made available as an HTTP file is herein called an "Original-order HTTP file". Generally, a method for native HTTP support of unicast repair requests can translate repair requests for symbols and sub-symbols of source blocks of the HTTP file, based on SBNs and ESIs, into standard HTTP (e.g., native HTTP/1.1) octet range requests within the HTTP file (often called HTTP partial GET requests with a specified byte range). This allows standard HTTP web cache servers to be able to service these repair requests, avoiding the need to massively deploy specialized HTTP web cache servers that understand how an HTTP file is partitioned into source blocks and source symbols within a source block.

In such scenarios, when a systematic FEC code is in use, it is often advantageous to only send repair symbols in some of the sessions, e.g., the broadcast/multicast sessions, as this allows the receivers to request only source symbols in a unicast repair requests. This has the advantage of only requiring the HTTP file, or a simple reordering transformation of the HTTP file as described in greater detail below, to be provided to the unicast repair servers, which can be standard HTTP web cache servers, making the logistics of defining the HTTP file and distributing the HTTP file simpler, since these logistics are independent of FEC encoding. Another advantage is that, if no source symbols are sent in the sessions, the receiver can request any sequence of source symbols in the unicast repair requests, since all of the source symbols are "missing", which can be preferable since this allows repair requests for consecutive sequence of source symbols. For example, suppose an FEC code with perfect recovery properties is used and a source block of a part comprises 1,000 source symbols, and 700 repair symbols are received for the source block (even though some of the repair symbols may be lost in transmission, and thus the pattern of ESIs of received repair symbols may be far from consecutive). Then, the receiver can request the first 300 consecutive source symbols for the source block in the unicast repair requests, and combine these source symbols with the 700 repair symbols to recover the source block. If the source symbols are consecutive in the HTTP file, then a single HTTP octet range request can be used to request and receive all 300 consecutive source symbols.

The receiver doesn't necessarily need to make a prefix request (i.e., a request for a set number of bytes of a file that starts with the first byte), but requiring that all UEs make prefix requests significantly improves the caching efficiency in the HTTP servers as the resulting requests from the UEs will greatly overlap, even when there are many receiving devices and there are arbitrarily differing loss patterns experienced by different receiving devices when receiving packets from a broadcast or multicast session.

Based on some of those benefits described, the above-described techniques can be advantageous for the network or a network device to signal to the receivers that only repair symbols are being broadcast. When signaled this indication, the receivers do not have to keep track of what source symbols they receive and may only have to track the number of symbols they receive. For example, based on the total symbols received, the receivers can then determine how many more source symbols to request from the repair server. To improve caching efficiency, the receivers can be configured to make prefix requests for the missing number of source symbols based on their knowledge of the indication that only repair symbols are broadcast.

Alternatively, a separate signaling indication can be given to the receivers to make prefix requests. In another embodiment, receivers can be configured so that they always select the missing source symbols with the lowest symbol index values (i.e., those closest to the beginning of a source block or sub-block) whenever the receivers have the flexibility to choose between different subsets of missing source blocks. This can be the case when both source and repair symbols are sent over the broadcast channel.

In another embodiment, receiving devices keep track of received symbol identifiers, ESIs, and determine if they receive ESIs corresponding to only repair symbols, based on for example the FEC OTI or based on the FEC Payload ID carried in receive packets. If this is the case, then such receivers can make prefix requests. In this embodiment, without using explicit signaling, receives will send requests for prefixes of the source blocks and sub-blocks in the repair requests if they only receive repair symbols. Even in the case where receiving devices receive repair symbols from a broadcast channel, the repair requests can still be largely or fully prefix requests, depending on the pattern of received symbols and the trade-offs between making simple requests and potentially receiving redundant data already received via the broadcast channel.

When signaling that only repair symbols are broadcast and signaling that receivers make prefix requests, some advantages occur when HTTP byte range file repair requests or symbol-based file repair requests are used. Therefore these methods can be applied to receivers and networks that support either, or both, request formats.

The signaling to indicate that only repair symbols are broadcast can be sent out-of-band (via unicast) or in-band (via broadcast). The indication can be applicable to the service level, session level, media level, or even file level, depending on the desired level of granularity. For example, the signaling can be added in the User Service Description ("USD"). The USD might indicate that only repair symbols are broadcast for the delivery of all of the identified services. The signaling could also be added in the Media Presentation Description ("MPD"), where the MPD indicates which media are broadcast using only repair symbols. The signaling could be added in the Session Description Protocol ("SDP") to indicate whether it applies to the delivery of the entire session or media components in the session. The signaling could also be added in the File Description Table ("FDT") to indicate that the broadcast of repair symbols only applies on a file level.

The signaling to require receivers to make prefix requests for repair data can also be delivered via in-band and out-of-band transports. The indication can also be made to apply to the service level, session level, media level, or even file level, depending on the desired level of granularity.

Thus, there are a variety of methods and apparatus for providing such an indication and receivers can be programmed and/or configured to respond differently in the case where such an indication is received and where such an indication is not received.

The request can be for a specific number of bytes or symbols. In some cases, the receiver will determine the number of source symbols to request based on the number of repair symbols received and the number of source symbols anticipated to be contained in the files or objects to be received. In other cases, the receiver might perform a scheduling operation, wherein the receiver determines how to decode using only the repair symbols it has already received, and thus can note a more specific number of source symbols needed. For example, it might be that some of the repair symbols are redundant of other repair symbols, in which case more source symbols might be required. In other instances, it might turn out that fewer source symbols are needed.

The receiver can translate requests for source symbols of an Original-order HTTP file corresponding to particular (SBN, ESI) pairs into HTTP octet range requests based on the FEC OTI. For example, suppose the FEC OTI for a file is (F, Al, T, Z, Al), and the SBN for a source symbol to be requested is A and the ESI for the source symbol is B, and suppose for sake of simplicity that N=1, i.e., that source blocks are not further partitioned into sub-blocks in this example of a file structure. Then, the receiver can apply for example the methods described in Section 4.4 of [RaptorQ-RFC-6330] to determine (KL, KS, ZL, ZS), where the first ZL source blocks have KL source symbols and the remaining ZS source blocks have KS source symbols. Then, based on A, B, and the symbol size T, the receiver can determine that the start octet index SI of the source symbol within the file is as shown in Equation 1, wherein the end octet index of the source symbol within the file is EI=SI+T−1. Then, the receiver can use a standard HTTP octet range request for the source symbol, requesting octets SI through EI.

$$SI = P(KL*\min\{A, ZL\} + KS*\max\{A-ZL, 0\} + B) \quad \text{(Eqn. 1)}$$

There are many extensions and improvements to these methods, as one skilled in the art will recognize. For example, a single HTTP octet range request may be made if multiple consecutive source symbols are requested from the Original-order HTTP file if sub-blocking is not used. As another example, the HTTP web cache servers may have files containing repair symbols, in addition to or instead of the Original-order HTTP file, or the Original-order HTTP file may already have been extended to contain repair symbols, and the receiver can use similar methods to those described herein to make HTTP octet range requests for repair symbols. As another example of an enhancement, these methods can be extended to handle the case when sub-blocking is used, using similar methods as will be recognized by those skilled in the art. For example, the receiver can use the methods described in Section 4.4 of [RaptorQ-RFC-6330] to determine (TL, TS, NL, NS), where the first NL sub-blocks of a source block are of size TL*Al and the remaining NS sub-blocks of a source block are of size TS*Al. Then, based on A, B, and the symbol size T, the receiver can determine that the start and end octet index of the N sub-symbols within the file that correspond to a source symbol, and make the requests for these octets using standard HTTP octet range requests.

As another example, the receiver can translate requests for source symbols of a file or file part corresponding to particular UFSIs into HTTP octet range requests based on the FEC OTI.

The following methods can greatly enhance the efficiency of using standard HTTP byte range requests by the receiver to recover symbols of an HTTP file, while at the same time using standard HTTP web caching servers to deliver the requested octet range requests to receivers.

A straightforward method to support the HTTP octet range requests as described is to use the Original-order HTTP file. This method has the advantage that no transformation of the original file or file part is needed to generate the Original-order HTTP file for the HTTP web cache servers, but many different HTTP octet range requests might be needed to request source symbols, even when only consecutive source symbols are requested for each source block. There are at least two reasons for this: (1) there might be multiple source blocks, and missing source symbols from each source block, in which case separate octet range requests might be required for each source block; (2) there might be multiple sub-blocks per source block, and thus even to request a single source symbol from one source block might require multiple HTTP octet range requests for the multiple sub-symbols comprising a source symbol, since the sub-symbols for a source symbol may not be consecutive in the Original-order HTTP file.

An advantageous method to support the HTTP octet range requests described above first reorganizes the file or file part into a new format, herein called the "UFSI-order HTTP file", based on the FEC OTI for the original file or file part. This method is useful when there are multiple source blocks and/or multiple sub-blocks per source block. The order of the data in the UFSI-order HTTP file is in order of the file symbol with UFSI 0, the file symbol with UFSI 1, the file symbol with UFSI 2, etc., i.e., the order of the data in the UFSI-order HTTP file is organized into file symbols ordered according to increasing consecutive UFSIs, as determined by the FEC OTI. A URL can be associated with the UFSI-order HTTP file, and the URL can be provided to the HTTP web caching system. The receiver can then use HTTP octet range requests to request portions of the UFSI-order HTTP file as needed. One advantage of the UFSI-order HTTP file is that, if the receiver receives approximately the same number of repair symbols from each of the source blocks then the number of HTTP octet range requests needed to obtain enough source symbols to recover the original file or file part can be minimal, e.g., one HTTP octet range request may be sufficient if exactly the same number of repair symbols is received for each source block. For example, a request for the first $L*T*Z$ consecutive octets of the UFSI-order HTTP file is sufficient to receive the first L source symbols of size T from each of the Z source blocks of the original file or file part. If K−L repair symbols are received in one or more sessions for each of the Z source symbols and if the FEC code has ideal recovery properties then the $L*T*Z$ octets received from the HTTP octet range request is sufficient to FEC decode the HTTP file, where in this example it is presumed that K is the number of source symbols in each of the Z source blocks.

Another advantageous method to support the HTTP octet range requests described above first reorganizes the file or file part into a different new format, herein called the "SS-order HTTP file", based on the FEC OTI for the original file or file part. This method is useful when there are multiple sub-blocks per source block, as in this case each source symbol may not be a consecutive portion of the original file or file part, i.e., the sub-symbols of a source symbol can be scattered throughout the source block in the original file ordering. The order of the data in the SS-order HTTP file is in order of all the source symbols of the first source block, followed by all the source symbols of the second source block, followed by all the source symbols of the third source block, etc., i.e., the order the data in the SS-order HTTP file is organized into source symbols ordered according to increasing consecutive ESI order within a source block, and is the concatenation of the source blocks in increasing consecutive SBN order, as determined by the FEC OTI. A URL can be associated with the SS-order HTTP file, and the URL can be provided to the HTTP web caching system. The receiver can then use HTTP octet range requests to request portions of the SS-order HTTP file as needed. The SS-order HTTP file is especially advantageous if the receiver receives different numbers of repair symbols from each of the source blocks. For example, if there are two source blocks of 1,000 source symbols each, and if the receiver receives 900 repair symbols for the first source block and 100 repair symbols for the second source block from one or more sessions, then the receiver can make one request for the first $T*100$ octets of the SS-order HTTP file and receive 100 source symbols for the first source block, and the receiver can make another request for octets $T*1,000$ through $T*1,900−1$ of the SS-order HTTP file and receive 900 source symbols for the second source block, wherein in this example T is the symbol size in octets for both source blocks.

A combination of both of the methods just described might also be used, i.e., both the UFSI-order HTTP file and the SS-order HTTP file might be made available through different URLs to receivers, and then a receiver might use a combination of HTTP octet requests to the two differently formatted HTTP files. For example, if there are 10 source blocks with 1,000 source symbols each, and if 800 repair symbols are received for each of the first 8 source blocks, 820 repair symbols are received for the $9^{th}$ source block, and 500 repair symbols are received for the $10^{th}$ source block in one or more sessions, then the receiver might make an HTTP octet range requests to the UFSI-order HTTP file to receive 200 source symbols for each of the 10 source blocks, and an additional HTTP octet range request to the SS-order HTTP file to receive an additional 300 source symbols for the $10^{th}$ source block. In this example, the receiver may receive an unneeded 20 source symbols for the $9^{th}$ source block (assuming an FEC code with ideal recovery properties), but in some cases requesting more than the minimum needed octets for some source blocks using a smaller number of HTTP octet range requests may be more efficient than requesting exactly the needed number of source symbols for each source block, which may require a much larger number of different HTTP octet range requests.

It can be advantageous to signal when this HTTP byte-range request can be used by the receivers to repair files. This enables the gradual introduction of this feature into deployed networks that are currently using other request messages for file repair. A system operator that is planning to transition their network operations to conventional HTTP-based file repair servers can start deploying receivers capable of making HTTP byte-range requests before the feature is fully supported over their entire network or in roaming partner networks. Then, as the number of deployed HTTP-capable receivers increases, the operator can begin deploying the HTTP servers to match the estimated request load from these terminals. Signaling can be used in a particular network to indicate to the receivers that they can use the HTTP byte-range requests in that network.

Another approach for signaling the network support of HTTP byte-range requests is to provide a descriptor alongside the repair server URI that indicates that the server supports HTTP byte-range requests only (e.g., tag the server URI as a "byteRangeServiceURI" type object). This method is useful in networks that have already deployed repair servers only accepting symbol-based requests, typically identified by a "serviceURI" descriptor. Definition of the new "byteRangeServiceURI" allows new receivers to use byte range requests with these servers while preventing legacy receivers that do not recognize this descriptor from erroneously making symbol-based requests from these HTTP servers.

Another embodiment for signaling the network support of HTTP byte-range request is to provide a descriptor alongside the repair server URI that indicates whether the server supports HTTP byte-range requests only, or supports HTTP-byte range requests and other request formats, such as symbol-based requests. In another embodiment, the descriptor indicates one of three possibilities: (1) whether the repair server supports HTTP byte-range requests only, (2) whether the repair server supports another type of request format only (e.g., symbol-based), or (3) whether the repair server supports HTTP-byte range requests and other request formats. The descriptor can also indicate which of the request formats are preferred or required to be used if supported by the receiver. This descriptor of the request formats supported by the servers can be sent along with the list of repair server URIs.

Another descriptor (e.g., "useFileURI" element) can also be sent to receivers indicating that they can use HTTP byte-range requests to retrieve portions of a file or all of a file directly from the content server where the file is stored, e.g., a location on the Internet. This enables an architecture where the network operator (such as a mobile network operator) does not have to deploy dedicated file repair servers and instead can rely on the content servers of the files to provide source data for the repair procedures. When files are downloaded via a broadcast channel, they might be sent with a File Descriptor Table that includes the URI of the file, e.g., www.<news providersite>.com/latest_news.3gp. The presence of the "useFileURI" element would indicate to the terminals that they can use HTTP byte-range requests to retrieve source data from www.<news providersite>.com/latest_news.3gp. Thus, instead of directing a receiver to www.<mobile-oper-cached-file-server-of-news>.com/newsfile_003.3gp, the receiver would go directly to the site where the content is already available, typically for browsers that access the content using conventional HTTP protocols. There might be another element signaling the file format, e.g., Original-order or UFSI-order or SS-order or Extended-original-order HTTP file format.

Independent of dedicated repair procedures, the content delivery system might include mechanisms for signaling to a receiver that, in addition to the broadcasted content, some or all of a file's content is available by unicast. This signaling might be data provided as part of the broadcast, wherein the data points to a unicast location. For example, the broadcast data might include an indication of file availability and a URL for the file. Different embodiments might use these available files differently. For example, the file indicated by the URL that is broadcast can be a file used for repair processing, used to speed up downloading, and/or to support faster initial playout.

In some embodiments, the file exists in more than one network or physical location. For that, signaling on the broadcast channel may include a list of URLs indicating a plurality of locations where the file is accessible. In some embodiments, there are multiple URLs that actually point to the same physical location, thus pointing to the same file or object.

The resource(s) indicated by the URL(s) can be restricted, for example by being available for only a limited amount of time. It can be beneficial to enable a mapping of an object (specified through an identifier in the broadcast distribution) to possibly multiple URLs. For each of the URLs, additional information may be provided, such as an indication that a file is physically accessible at one location using the HTTP protocol and available at other locations or the same location using other protocols. Other examples of such additional information include a time when the resource is accessible at the specific URL, and/or rules on the priority of the selection of a URL among a plurality of URLs to access the resource, for example priority lists, or priority lists depending on the access network available, etc.

Another descriptor can also be sent with the server URI list to provide a prioritization of which servers or domains the receiver should try first when requesting repair data. In a preferred embodiment, a "priorityURI" element can be associated with certain URIs to indicate that they should be prioritized by the receiver in selecting a server. This enables two levels of prioritization whereby the receiver tries servers with the "priorityURI" first and only sends requests to the other servers if the prioritized servers are unresponsive. In another embodiment, groups of server URIs can be structured into "priortyGroups" with the groups listed in order of decreasing priority. This indicates to the receiver that it should choose from the highest priority group first. If requests to all of these servers fail, then the receiver proceeds to selecting a server from the next group of servers, etc., thereby enabling multiple levels of prioritization.

Two general methods are now described through which the descriptors and list of server URIs can be signaled to the receiver. In one, the signaling is over the broadcast channel for all the receivers (in-band) and in the other, the signaling is through a unicast channel to each receiver (out-of-band). The information can be added to a variety of existing message types used in the file-repair feature such as the Associated Procedure Description (configuration file), the User Service Description ("USD"), the Media Presentation Description ("MPD"), the Session Description Protocol ("SDP"), or the File Description Table ("FDT").

When the server is configured to signal FDTs and USDs for distributing such information, and receivers are configured to read and understand those FDTs and USDs, this provides a facility for sending various useful information.

For example, the information might include an "Alternative-Content-Location" element in the File element in FLUTE, which can include multiple alternative URLs for the same file. This element may be extended to also add other parameters (such as indicators of resource availability, formats in which it is available, time that it is available, priority, etc.).

As another example, a "BaseURL" element can be included in the FDT element (and thus not needed in the File element) to indicate to the receiver that each of the files in the FDT can be resolved against any of the BaseURL elements. Flags as above and timing may be present as well. This can cover many deployment options. In a variation, the BaseURL element is presented on the USD level instead of on FLUTE. Thus, the USD can be provided as a way to do a BaseURL resolution for MBMS, while being compatible with FLUTE.

In another embodiment, some optional elements can be introduced into the File element of the File Delivery Table (FDT), such as an "Alternate-Content-Location-1" element and an "Alternate-Content-Location-2" element. Each of these elements can be used to provide the URL of the file on a content server or on a common dedicated server. In one embodiment, these URLs are prioritized by the terminal before making a request from symbol-based file repair servers when either of these elements is present. It is also possible to require that when both elements are present, the "Alternate-Content-Location-1" element is selected before the "Alternate-Content-Location-2" element. The URLs can be absolute URLs or relative references as described in RFC 3986.

In another embodiment, an optional "Availability-Time" element is associated with each of the above "Alternate-Content-Location-x" attributes, to indicate the availability time, if known.

In another embodiment, optional elements "Base-URL-1" and "Base-URL-2" might be used in the File Delivery Table. When present, "Base-URL-1" provides a base URL against which to resolve a relative reference included in any "Alternate-Content-Location-1" element of the FDT File elements. When present, "Base-URL-2" provides a base URL against which to resolve a relative reference included in any "Alternate-Content-Location-2" element of the FDT File elements.

Other options may be considered and combinations of the above options may be considered as well. For example, embedding the file format type into other URLs grouped according to the file format available.

As the terminals in the operator's network churn and more receivers are capable of HTTP byte-range requests, the operator can shift more of the file repair capacity to conventional HTTP servers and indicate their capabilities via this signaling method.

Upon receiving an indication that certain repair servers support HTTP byte-range requests, a terminal supporting the HTTP byte-range requests might use the byte-range message to request data from one of the supporting servers.

In another embodiment where the descriptor indicates a preference or requirement for which request format to use, the receiver follows the preferences or requirements indicated.

Another approach is to signal to receivers that HTTP-byte range requests are supported by the repair servers without identifying which particular servers have this capability. The signaling would indicate that all the repair servers are capable of HTTP byte-range requests only, or all are capable of HTTP byte-range requests and other request message formats, e.g., symbol-based requests.

In another embodiment, the signal indicates one of three possibilities as listed above, namely: (1) whether all repair servers support HTTP byte-range requests only, (2) whether the repair servers support another type of request format only (e.g., symbol-based), or (3) whether the repair servers support HTTP-byte range requests and other request formats. When this simplified signaling is used, the operator might upgrade all of the file repair servers to support the indicated request format(s) before signaling this to the receivers. The file format type might also be signaled, e.g., Original-order, UFSI-order, SS-order, Extended-original-order or other types of HTTP file formats. There might be a default file format type if no file format type is explicitly signaled, e.g., the Original-order HTTP file format might be the default in case no file format type is signaled.

Similar to the descriptor and server URI information, this signaling can also be signaled to the receiver using two general methods. In one, the signaling is over the broadcast channel for all the receivers (in-band) and in the other, the signaling is through a unicast channel to each receiver (out-of-band). The indication can be added to a variety of existing message types used in the file-repair feature such as the Associated Procedure Description (configuration file), the User Service Description ("USD"), the Media Presentation Description ("MPD"), the Session Description Protocol ("SDP"), or the File Description Table ("FDT").

Two general methods are now described through which the descriptors and list of server URIs can be signaled to the receiver.

As one skilled in the art will recognize, there are many variations on these methods. For example, an Original-order HTTP file, a UFSI-order HTTP file and a SS-order HTTP file could all be made available for requests. As another example, a SS-order HTTP file may be split up and made available as a multitude of HTTP files, one such HTTP file for each source block. As other example of variants, methods and protocols other than those based on HTTP might be used, such as methods based on RTP/UDP, or proprietary protocols built on top of UDP, might be used.

Hardware Systems and Examples

The methods and systems described above can be implemented in hardware, software and/or appropriately organized computer-readable media containing program code or other instructions. Program code might be provided on non-transitory media or sent as a download, etc. to be executed on a suitable hardware platform. Some examples of systems that might use the above teachings are provided herein.

Figure 13:
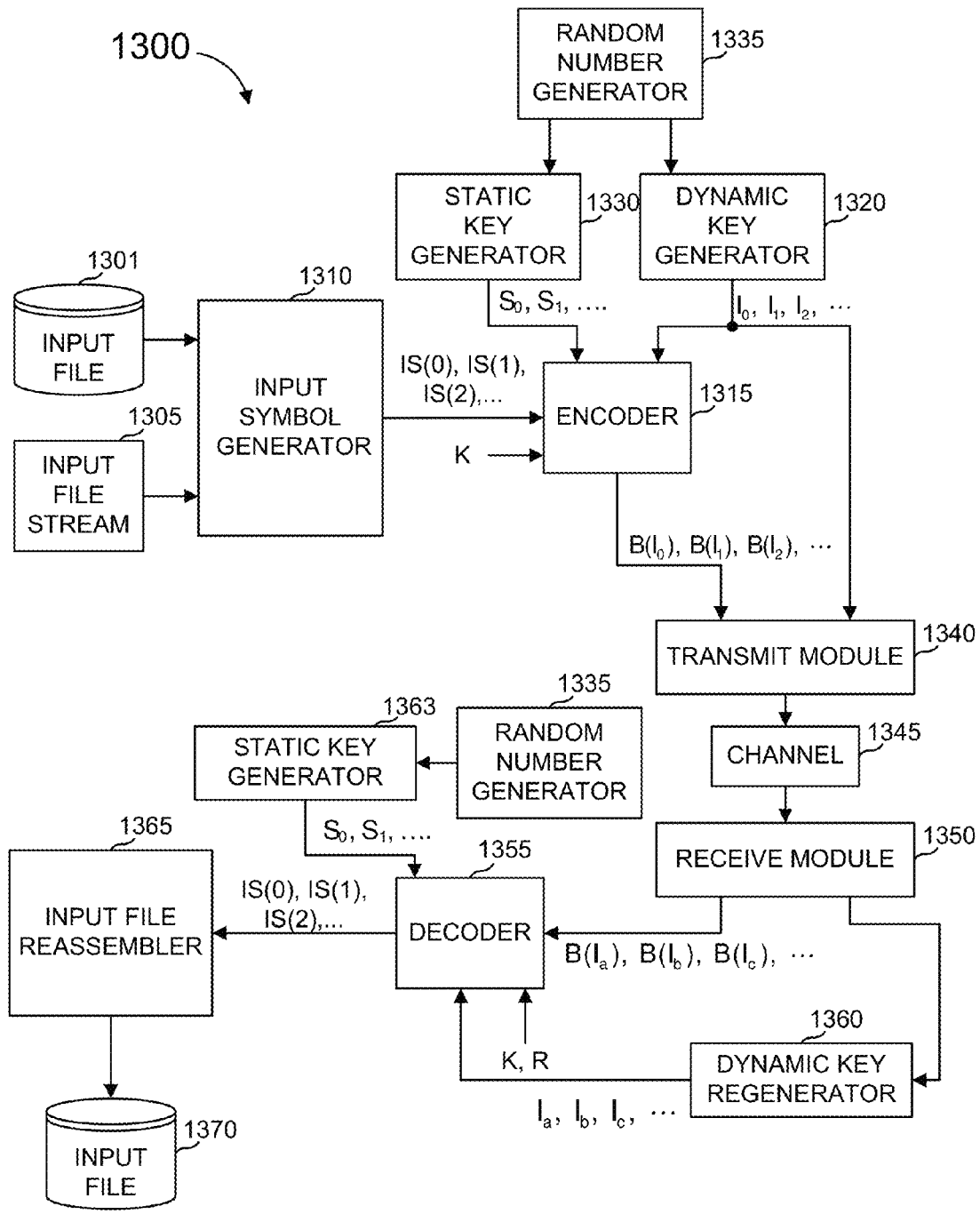
FIG. 13 is a block diagram of a communications system that might be used for generating, sending and receiving Raptor, RaptorQ or other packets as part of a file delivery.

FIG. 13 is a block diagram of a communications system 1300 that uses multi-stage coding as might be used to send packets as part of a file delivery system as described herein. Of course, other codes and/or hardware might be used instead.

In communications system 1300, an input file 1301, or an input stream 1305, is provided to an input symbol generator 1310. Input symbol generator 1310 generates a sequence of one or more input symbols (IS(0), IS(1), IS(2), . . . ) from the input file or stream, with each input symbol having a value and a position (denoted in FIG. 13 as a parenthesized integer). As explained above, the possible values for input symbols, i.e., its alphabet, is typically an alphabet of $2^M$ symbols, so that each input symbol codes for M bits of the input file. The value of M is generally determined by the use of communication system 1300, but a general purpose system might include a symbol size input for input symbol generator 1310 so that M can be varied from use to use. The output of input symbol generator 1310 is provided to an encoder 1315.

Static key generator 1330 produces a stream of static keys $S_0$, $S_1$, . . . . The number of the static keys generated is generally limited and depends on the specific embodiment of encoder 1315. The generation of static keys will be subsequently described in more detail. Dynamic key generator 1320 generates a dynamic key for each output symbol to be generated by the encoder 1315. Each dynamic key is generated so that a large fraction of the dynamic keys for the same input file are unique. A random number generator 1335 might provide an input to generator 1320 and/or generator 1330. For example, Luby I describes embodiments of key generators that can be used. The outputs of dynamic key generator 1320 and the static key generator 1330 are provided to encoder 1315.

From each key I provided by dynamic key generator 1320, encoder 1315 generates an output symbol, with a value B(I), from the input symbols provided by the input symbol generator. The operation of encoder 1315 will be described in more detail below. The value of each output symbol is generated based on its key, on some function of one or more of the input symbols, and possibly one or more redundant symbols that had been computed from the input symbols. The collection of input symbols and redundant symbols that give rise to a specific output symbol is referred to herein as the output symbol's "associated symbols" or just its "associates". The selection of the function (the "value function") and the associates is done according to a process described in more detail below. Typically, but not always, M is the same for input symbols and output symbols, i.e., they both code for the same number of bits.

In some embodiments, the number K of input symbols is used by the encoder 1315 to select the associates. If K is not known in advance, such as where the input is a streaming file, K can be just an estimate. The value K might also be used by encoder 1315 to allocate storage for input symbols and any intermediate symbols generated by encoder 1315.

Encoder 1315 provides output symbols to a transmit module 1340. Transmit module 1340 is also provided the key of each such output symbol from the dynamic key generator 1320. Transmit module 1340 transmits the output symbols, and depending on the keying method used, transmit module 1340 might also transmit some data about the keys of the transmitted output symbols, over a channel 1345 to a receive module 1350. Channel 1345 is assumed to be an erasure channel, but that is not a requirement for proper operation of communication system 1300.

Modules 1340, 1345 and 1350 can be any suitable hardware components, software components, physical media, or any combination thereof, so long as transmit module 1340 is adapted to transmit output symbols and any needed data about their keys to channel 1345 and receive module 1350 is adapted to receive symbols and potentially some data about their keys from channel 1345. The value of K, if used to determine the associates, can be sent over channel 1345, or it may be set ahead of time by agreement of encoder 1315 and decoder 1355. Other elements shown in FIG. 13 (and elsewhere herein, whether described as a module, a step, a process, etc., can also be implemented using hardware, software, and/or program code stored on electronically-readable media).

As explained above, channel 1345 can be a real-time channel, such as a path through the Internet or a broadcast link from a television transmitter to a television recipient or a telephone connection from one point to another, or channel 1345 can be a storage channel, such as a CD-ROM, disk drive, Web site, or the like. Channel 1345 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 1345 is assumed to be an erasure channel, communications system 1300 does not assume a one-to-one correspondence between the output symbols that exit receive module 1350 and the output symbols that go into transmit module 1340. In fact, where channel 1345 comprises a packet network, communications system 1300 might not even be able to assume that the relative order of any two or more packets is preserved in transit through channel 1345. Therefore, the key of the output symbols is determined using one or more of the keying schemes described above, and not necessarily determined by the order in which the output symbols exit receive module 1350.

Receive module 1350 provides the output symbols to a decoder 1355, and any data receive module 1350 receives about the keys of these output symbols is provided to a dynamic key regenerator 1360. Dynamic key regenerator 1360 regenerates the dynamic keys for the received output symbols and provides these dynamic keys to decoder 1355. Static key generator 1363 regenerates the static keys $S_0$, $S_1$, . . . and provides them to decoder 1355. The static key generator has access to random number generator 1335 used both during the encoding and the decoding process. This can be in the form of access to the same physical device if the random numbers are generated on such device, or in the form of access to the same algorithm for the generation of random numbers to achieve identical behavior. Decoder 1355 uses the keys provided by dynamic key regenerator 1360 and static key generator 1363 together with the corresponding output symbols, to recover the input symbols (again IS(0), IS(1), IS(2), . . . ). Decoder 1355 provides the recovered input symbols to an input file reassembler 1365, which generates a copy 1370 of input file 1301 or input stream 1305.

File delivery can be done with multiple receivers and/or multiple senders. These concepts are illustrated in FIGS. 14-15.

Figure 14:
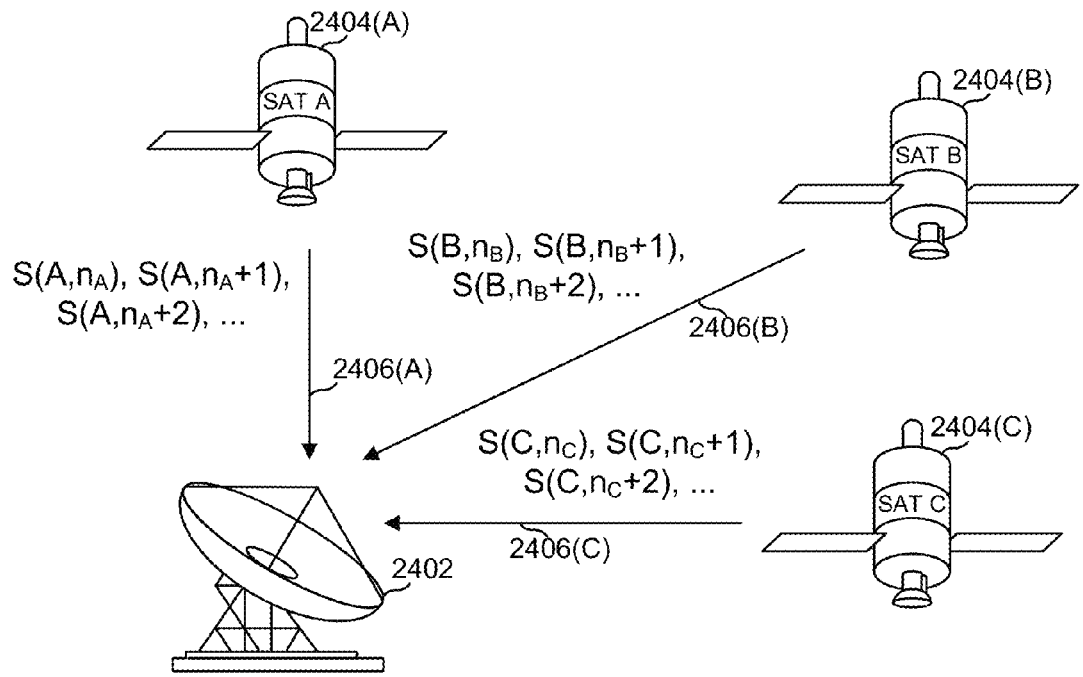
FIG. 14 is an illustration of a communication system where file delivery might be done wherein one receiver receives output symbols from multiple, usually independent, senders.

FIG. 14 illustrates an arrangement wherein one receiver 2402 receives data from three transmitters 2404 (individually denoted "A", "B" and "C") over three channels 2406. This arrangement can be used to triple the bandwidth available to the receiver or to deal with transmitters not being available long enough to obtain an entire file from any one transmitter. As indicated, each transmitter 2404 sends a stream of values, S( ). Each S( ) value represents an output symbol B(I) and a key I, the use of which is explained above. For example, the value $S(A, n_A)$ is the "$n_A$"-th output symbol and "$n_A$"-th key in a sequence of output symbols generated at transmitter 2402(A). The sequence of keys from one transmitter is preferably distinct from the sequence of keys from the other transmitters, so that the transmitters are not duplicating efforts. This is illustrated in FIG. 14 by the fact that the sequence SQ is a function of the transmitter.

Note that transmitters 2402 do not need to be synchronized or coordinated in order not to duplicate efforts. In fact, without coordination, each transmitter is likely to be in a different location in its sequence (i.e., $n_A \ne n_B \ne n_C$).

Figure 15:
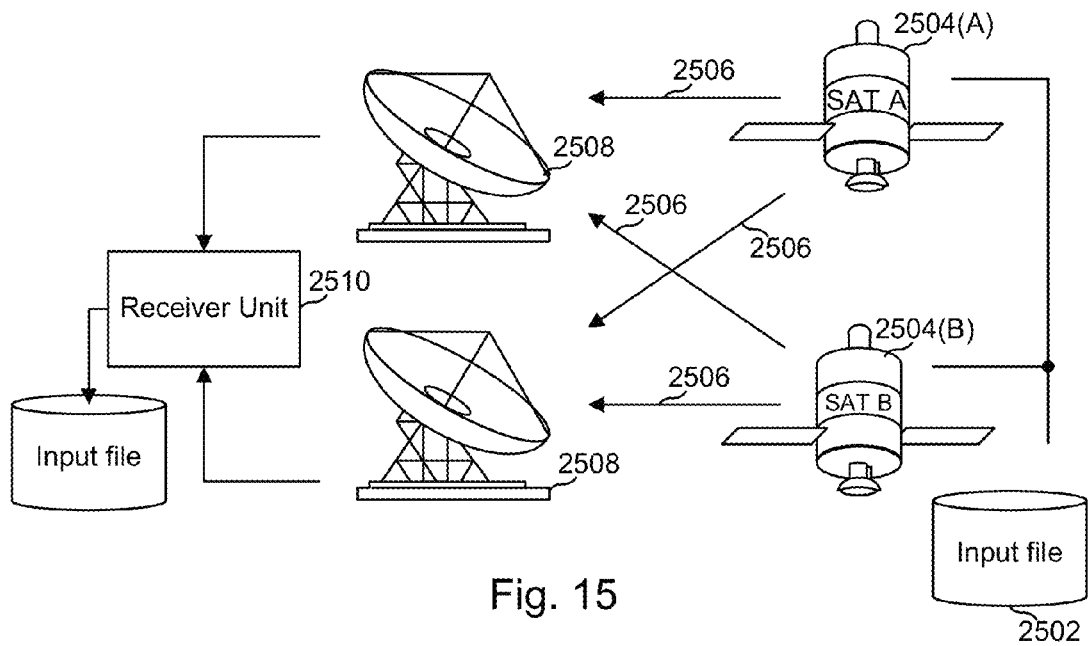
FIG. 15 is an illustration of a communication system where file delivery might be done where multiple, possibly independent, receivers receive output symbols from multiple, usually independent, senders to receive an input file in less time than if only one receiver and/or only one sender is used.

In FIG. 15, copies of one input file 2502 are provided to a plurality of transmitters 2504 (two of which are shown in the figure). Transmitters 2504 independently transmit output symbols generated from the contents of input file 2502 over channels 2506 to receivers 2508. Each transmitter of the two shown might need to only transmit (K+A)/2 output symbols before the receiver's decoder is able to recover the entire input file.

Using two receivers and two transmitters, the total amount of information received by a receiver unit 2510 can be as much as four times the information available over one channel 2506. The amount of information might be less than four times the single channel information if, for example, the transmitters broadcast the same data to both receivers. In that case, the amount of information at receiver unit 2510 is at least double and often more, if data is lost in any channel. Note that, even if the transmitters broadcast only one signal, but the receivers are in view at different times, there is an advantage to having more than one receiver listening to each transmitter. In FIG. 15, receiver unit 2510 performs the functions similar to the functions of receive module 1350, decoder 1355, dynamic key regenerator 1360 and input file reassembler 1365 shown in FIG. 13.

In some embodiments, input file 2502 is encoded in one computing device having two encoders so that the computing device can provide one output for one transmitter and another output for the other transmitter. Other variations of these examples should be apparent upon review of this disclosure.

It is to be understood that the coding apparatus and methods described herein may also be used in other communication situations and are not limited to communications networks such as the Internet. For example, compact disk technology also uses erasure and error-correcting codes to handle the problem of scratched disks and would benefit from the use of chain reaction codes in storing information thereon. As another example, satellite systems may use erasure codes in order to trade off power requirements for transmission, purposefully allowing for more errors by reducing power and chain reaction coding would be useful in that application. Also, erasure codes have been used to develop RAID (redundant arrays of independent disks) systems for reliability of information storage. The current invention may therefore prove useful in other applications such as the above examples, where codes are used to handle the problems of potentially lossy or erroneous data.

In some preferred embodiments, sets of instructions (or software) to perform the communication processes described above are provided to two or more multi-purpose computing machines that communicate over a possibly lossy communications medium. The number of machines may range from one sender and one recipient to any number of machines sending and/or receiving. The communications medium connecting the machines may be wired, optical, wireless, or the like. The above-described communications systems have many uses, which should be apparent from this description.

A block-request streaming system using an HTTP streaming server might deliver files as described above. Below, an example implementation of such a system is described. With HTTP streaming, the sources might be standard web servers and content delivery networks (CDNs) and might use standard HTTP.

On the client side, requests may be made, using HTTP, for individual segments that are seamlessly spliced together by the client. Advantages of HTTP streaming include the use of standardized and existing infrastructure.

Figure 16:
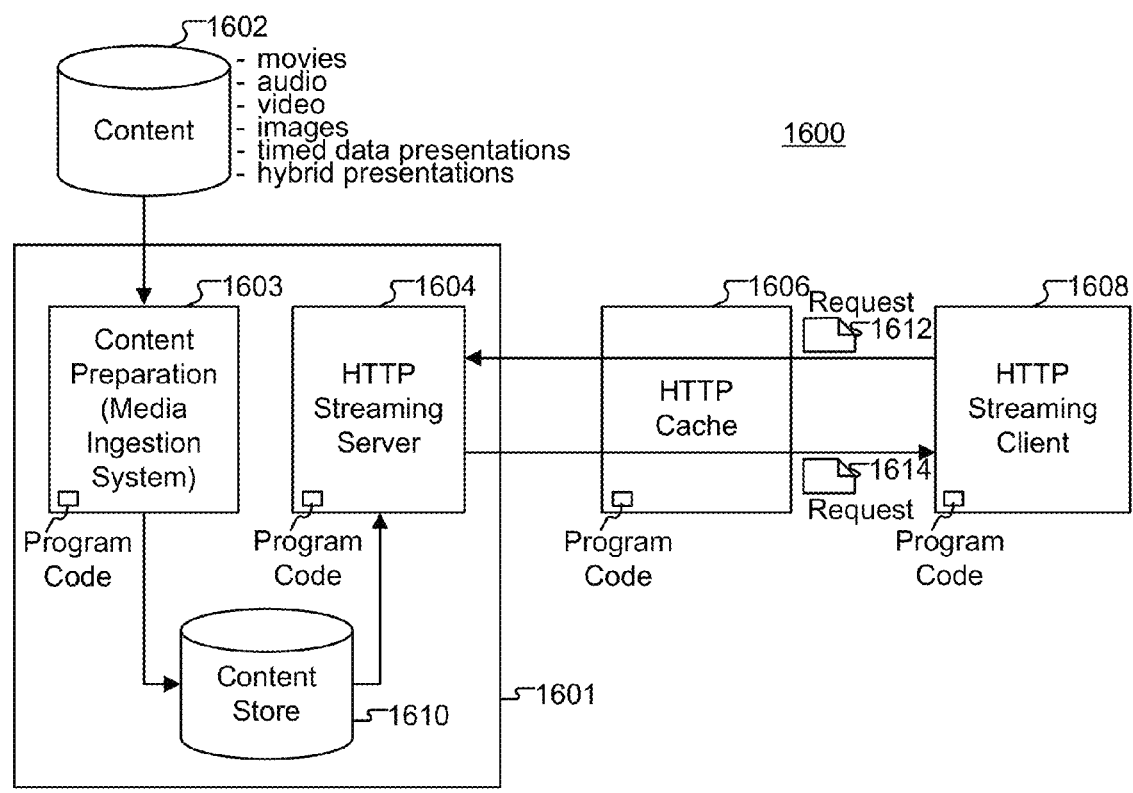
FIG. 16 depicts elements of a block-request streaming system that might be used to provide for file delivery using HTTP streaming servers.

FIG. 16, which shows a simplified diagram of a block-request streaming system that might deliver files. In FIG. 16, a block-streaming system 1600 is illustrated, comprising block serving infrastructure ("BSI") 1601 in turn comprising an ingestion system 1603 for ingesting content 1602, preparing that content and packaging it for service by an HTTP streaming server 1604 by storing it into a content store 1610 that is accessible to both ingestion system 1603 and HTTP streaming server 1604. As shown, system 1600 might also include an HTTP cache 1606. In operation, a client 1608, such as an HTTP streaming client, sends requests 1612 to HTTP streaming server 1604 and receives responses 1614 from HTTP streaming server 1604 or HTTP cache 1606. In each case, elements shown in FIG. 16 might be implemented, at least in part, in software, therein comprising program code that is executed on a processor or other electronics.

Figure 17:
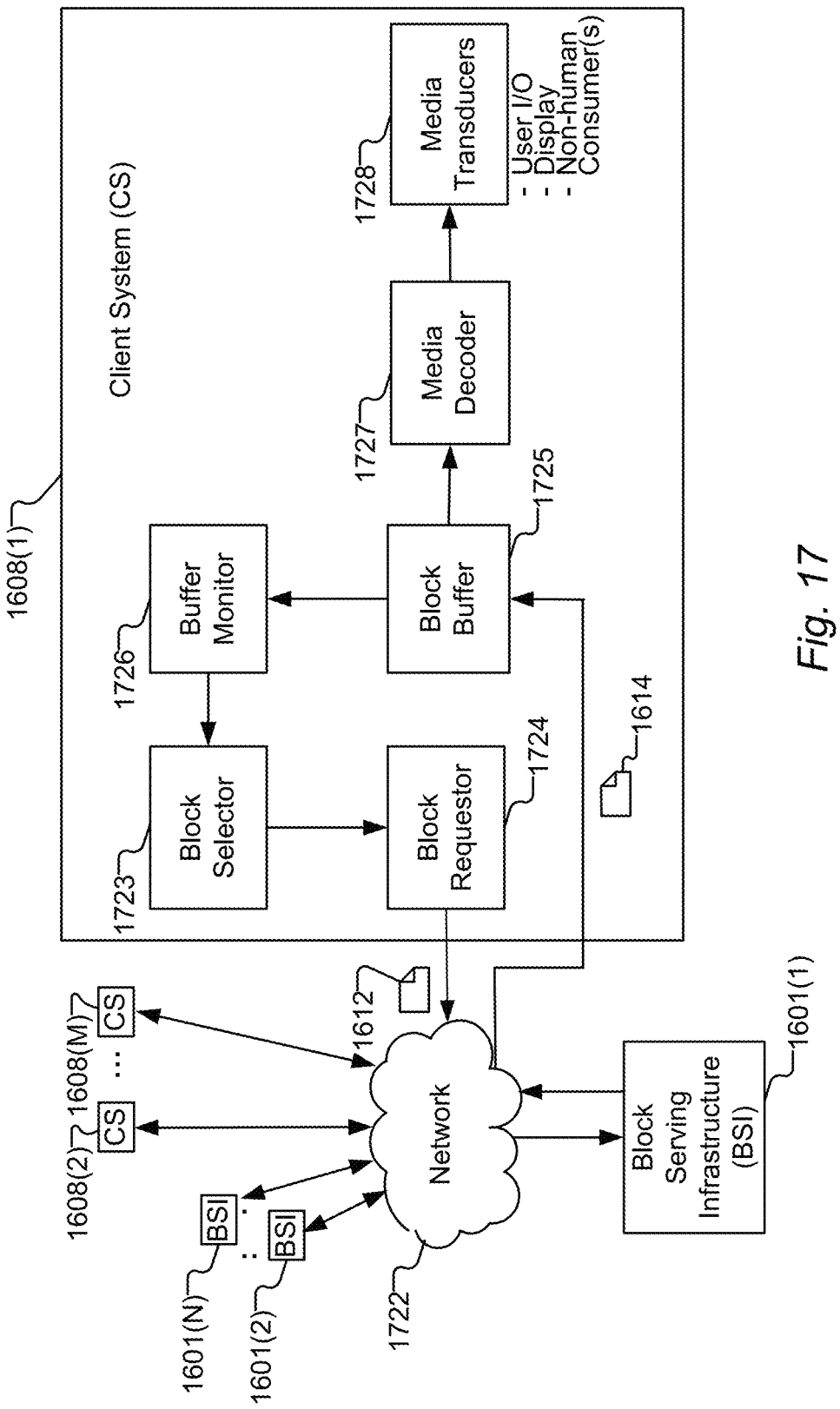
FIG. 17 illustrates elements of the block-request streaming system of FIG. 16, showing greater detail in the elements of a client system that is coupled to a block serving infrastructure ("BSI") to receive data that is processed by a content ingestion system, as might be used for file delivery.

As illustrated in FIG. 17, media blocks may be stored within a block serving infrastructure 1601(1), which could be, for example, an HTTP server, a Content Delivery Network device, an HTTP proxy, FTP proxy or server, or some other media server or system. Block serving infrastructure 1601(1) is connected to a network 1722, which could be, for example, an Internet Protocol ("IP") network such as the Internet. A block-request streaming system client is shown having six functional components, namely a block selector 1723, provided with the metadata described above and performing a function of selecting blocks or partial blocks to be requested from among the plurality of available blocks indicated by the metadata, a block requestor 1724, that receives request instructions from block selector 1723 and performs the operations necessary to send a request for the specified block, portions of a block, or multiple blocks, to block serving infrastructure 1601(1) over network 1722 and to receive the data comprising the block in return, as well as a block buffer 1725, a buffer monitor 1726, a media decoder 1727 and one or more media transducers 1728 that faciliate media consumption.

Block data received by block requestor 1724 is passed for temporary storage to block buffer 1725, which stores the media data. Alternatively, the received block data can be stored directly into block buffer 1725. Media decoder 1727 is provided with media data by block buffer 1725 and performs such transformations on this data as are necessary to provide suitable input to media transducers 1728, which render the media in a form suitable for user or other consumption. Examples of media transducers include visual display devices such as those found in mobile phones, computer systems or televisions, and might also include audio rendering devices, such as speakers or headphones.

Buffer monitor 1726 receives information concerning the contents of block buffer 1725 and, based on this information and possibly other information, provides input to block selector 1723, which is used to determine the selection of blocks to request, as is described herein.

A block-request streaming system (BRSS) comprises one or more clients that make requests to one or more content servers (for example, HTTP servers, FTP servers, etc.). An ingestion system comprises one or more ingestion processors, wherein an ingestion processor receives content (in real-time or not), processes the content for use by the BRSS and stores it into storage accessible to the content servers, possibly also along with metadata generated by the ingestion processor.

The BRSS also might contain content caches that coordinate with the content servers. The content servers and content caches might be conventional HTTP servers and HTTP caches that receive requests for files or segments in the form of HTTP requests that include a URL, and may also include an octet range, in order to request less than all of the file or segment indicated by the URL. The clients might include a conventional HTTP client that makes requests of HTTP servers and handles the responses to those requests, where the HTTP client is driven by a novel client system that formulates requests, passes them to the HTTP client, gets responses from the HTTP client and processes those (or storing, transforming, etc.) in order to provide them to a presentation player for playout by a client device. Typically, the client system does not know in advance what media is going to be needed (as the needs might depend on user input, changes in user input, etc.), so it is said to be a "streaming" system in that the media is "consumed" as soon as it is received, or shortly thereafter. As a result, response delays and bandwidth constraints can cause delays in a presentation, such as causing a pause in a presentation as the stream catches up to where the user is in consuming the presentation.

In order to provide for a presentation that is perceived to be of good quality, a number of details can be implemented in the BRSS, either at the client end, at the ingestion end, or both. In some cases, the details that are implemented are done in consideration of, and to deal with, the client-server interface at the network. In some embodiments, both the client system and the ingestion system are aware of the enhancement, whereas in other embodiments, only one side is aware of the enhancement. In such cases, the entire system benefits from the enhancement even though one side is not aware of it, while in others, the benefit only accrues if both sides are aware of it but when one side is not aware, it still operates without failing.

Figure 18:
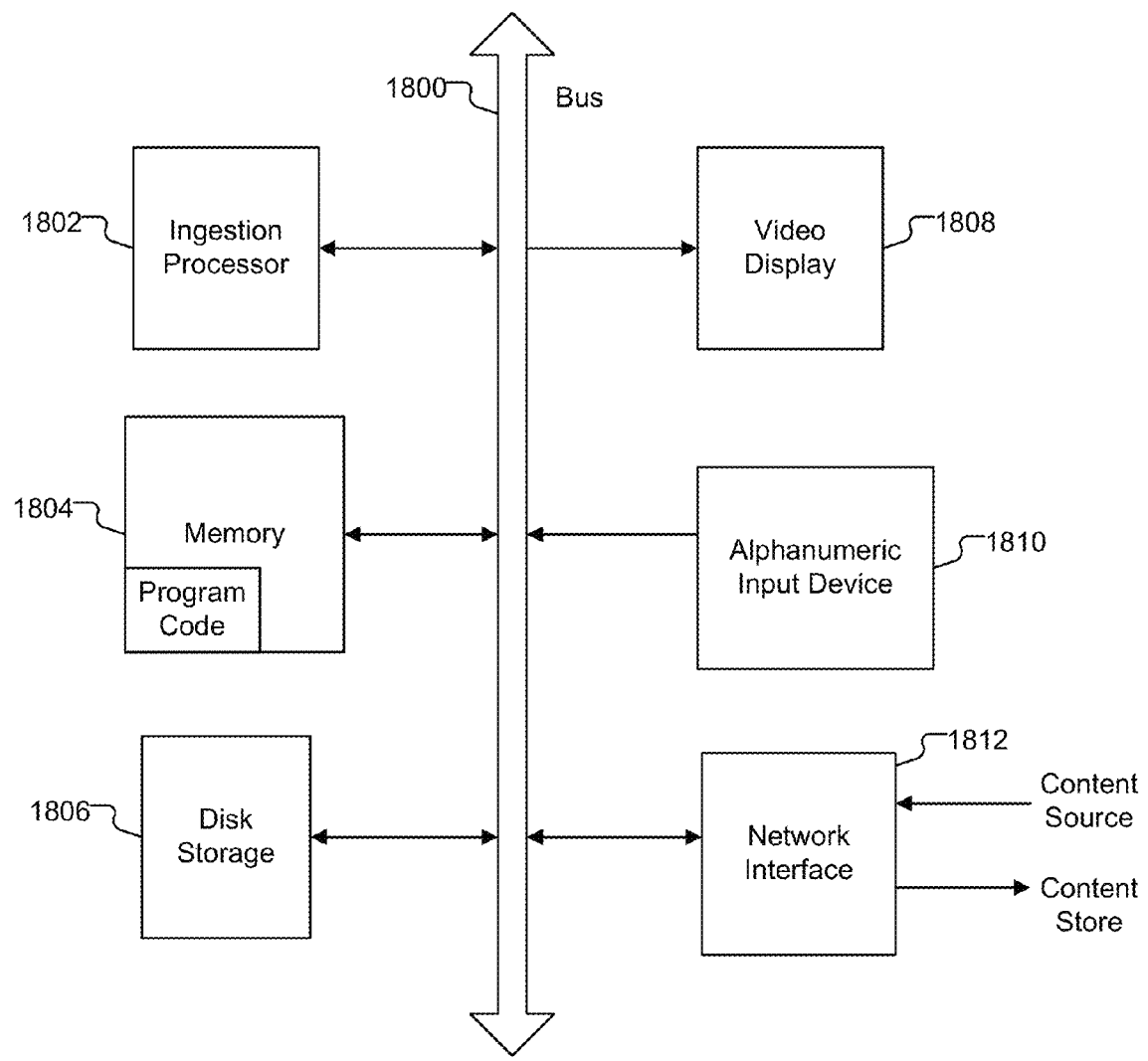
FIG. 18 illustrates a hardware/software implementation of an ingestion system that might be used to prepare files for file delivery.

As illustrated in FIG. 18, the ingestion system may be implemented as a combination of hardware and software components, according to various embodiments. The ingestion system may comprise a set of instructions that can be executed to cause the system to perform any one or more of the methodologies discussed herein. The system may be realized as a specific machine in the form of a computer. The system may be a server computer, a personal computer (PC), or any system capable of executing a set of instructions (sequential or otherwise) that specify actions to be taken by that system. Further, while only a single system is illustrated, the term "system" shall also be taken to include any collection of systems that individually or jointly execute a set (or multiple sets) of instructions to perform any one or more of the methodologies discussed herein.

The ingestion system may include the ingestion processor 1802 (e.g., a central processing unit (CPU)), a memory 1804 which may store program code during execution, and disk storage 1806, all of which communicate with each other via a bus 1800. The system may further include a video display unit 1808 (e.g., a liquid crystal display (LCD) or cathode ray tube (CRT)). The system also may include an alphanumeric input device 1810 (e.g., a keyboard), and a network interface device 1812 for receiving content source and delivering content store.

The disk storage unit 1806 may include a machine-readable medium on which may be stored one or more sets of instructions (e.g., software) embodying any one or more of the methodologies or functions described herein. The instructions may also reside, completely or at least partially, within the memory 1804 and/or within the ingestion processor 1802 during execution thereof by the system, with the memory 1804 and the ingestion processor 1802 also constituting machine-readable media.

Figure 19:
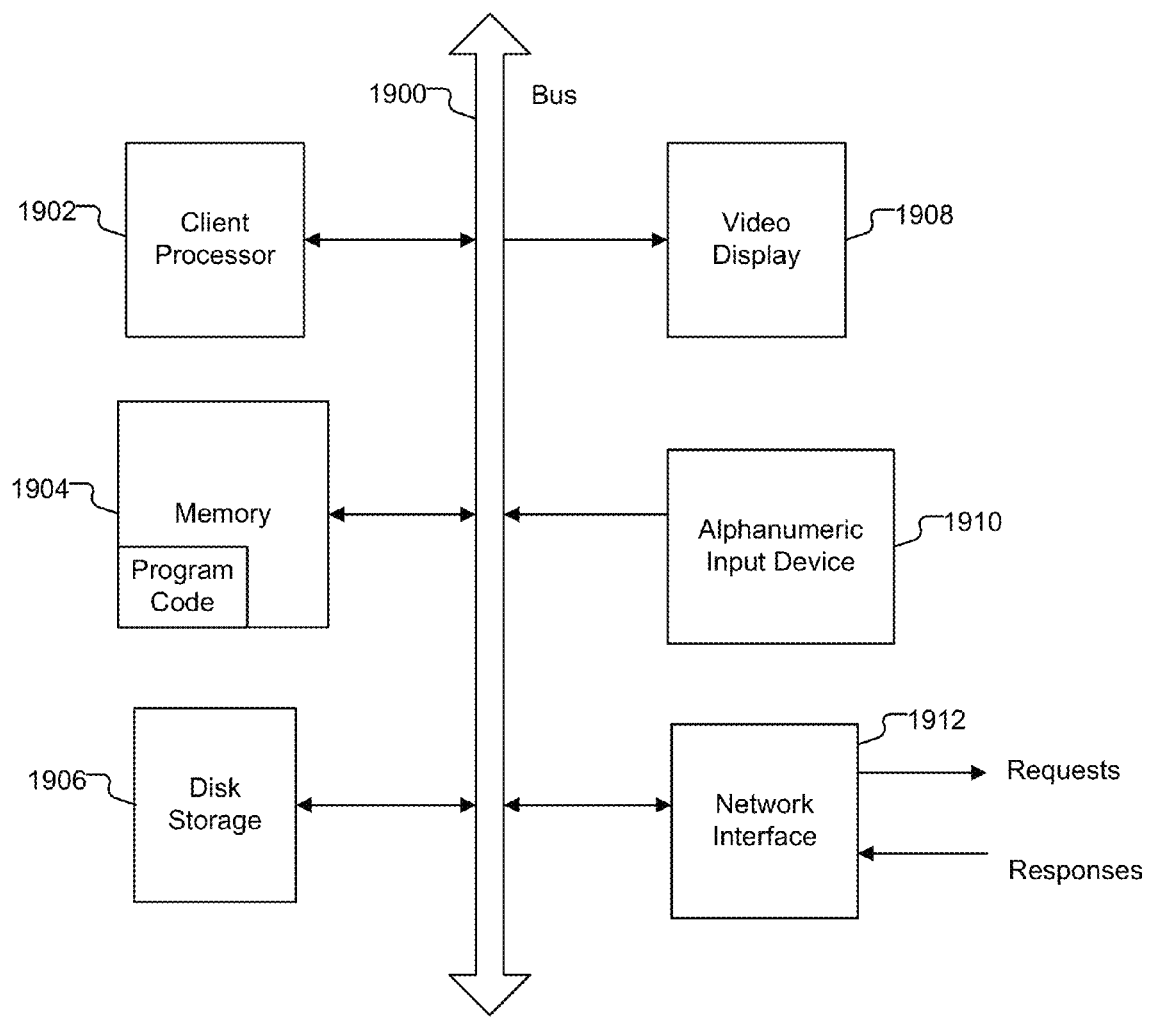
FIG. 19 illustrates a hardware/software implementation of a client system that might be used to receive files delivered to the client system.

As illustrated in FIG. 19, the client system may be implemented as a combination of hardware and software components, according to various embodiments. The client system may comprise a set of instructions that can be executed to cause the system to perform any one or more of the methodologies discussed herein. The system may be realized as a specific machine in the form of a computer. The system may be a server computer, a personal computer (PC), or any system capable of executing a set of instructions (sequential or otherwise) that specify actions to be taken by that system. Further, while only a single system is illustrated, the term "system" shall also be taken to include any collection of systems that individually or jointly execute a set (or multiple sets) of instructions to perform any one or more of the methodologies discussed herein.

The client system may include the client processor 1902 (e.g., a central processing unit (CPU)), a memory 1904 which may store program code during execution, and disk storage 1906, all of which communicate with each other via a bus 1900. The system may further include a video display unit 1908 (e.g., a liquid crystal display (LCD) or cathode ray tube (CRT)). The system also may include an alphanumeric input device 1910 (e.g., a keyboard), and a network interface device 1912 for sending requests and receiving responses.

The disk storage unit 1906 may include a machine-readable medium on which may be stored one or more sets of instructions (e.g., software) embodying any one or more of the methodologies or functions described herein. The instructions may also reside, completely or at least partially, within the memory 1904 and/or within the client processor 1902 during execution thereof by the system, with the memory 1904 and the client processor 1902 also constituting machine-readable media.

Example of a Particular Embodiment

A specific embodiment is described in this section of a fully-specified FEC scheme for universal object delivery using the RaptorQ FEC scheme specified in [RaptorQ-RFC-6330]. The UOSI FEC payload ID can be used together with RaptorQ FEC Scheme in [RaptorQ-RFC-6330] (herein referred to as the "UOD-RaptorQ FEC Scheme") to provide simplified and enhanced object delivery capabilities. In particular, more flexible and simpler support is provided for basic object delivery, and support is also provided for unequal error protection (UEP) object delivery, for bundled object delivery, and for combinations of UEP and bundled object delivery. It should be understood that suitable hardware and/or software can be used to implement the "UOD-RaptorQ FEC Scheme" between communicating devices.

The FEC Payload ID format is a 4-octet field as illustrated in FIG. 2, where in this specific implementation, the Universal File Symbol Identifier (UFSI), a 32-bit, unsigned integer, is generalized by a Universal Object Symbol Identifier (UOSI), also a 32-bit, unsigned integer. The UOSI is a non-negative integer that, in conjunction with the FEC OTI, is used to identify the encoding symbols contained within a packet carrying that payload ID.

For the delivery of a single object, or multiple objects, or a single object partitioned into parts with different priorities, or any combination of these, the FEC OTI is as described below. It should be noted that for each object delivered, the FEC OTI can be the same as specified by the RaptorQ FEC Scheme. A delivery might comprise d objects, for some positive integer d. Each object may comprise different parts of the same file, or different files, or combinations thereof. The relationship between the size, $F_i$, of an object, i, and the size, $T_i$, of the encoding symbol to be used for object i can be used to determine the priority of object i in the transmission.

FIG. 20 illustrates an example of a Common FEC OTI field. As used therein, there is an 8-bit, unsigned integer for the number of objects, d, delivered and the example shown is for d=2. A default value might be d=1. Other subfields include are, for each of the d objects (i.e., for i=1, ..., d), the Common FEC OTI elements specific to object i include a 16-bit unsigned integer for the symbol size, $T_i$, a positive integer that is less than $2^{16}$, indicating the size of a symbol for object i in units of octets, a 40-bit unsigned integer for the transfer length, $F_i$, of object i, which is a non-negative integer that is at most $2^{40}$, indicating the transfer length of object i in units of octets. Suitable padding is provided.

In contrast to the Common FEC OTI field, there might be a Scheme-Specific FEC OTI element, such as is shown in FIG. 21. As shown in that example, the Scheme-Specific FEC OTI element includes a symbol alignment parameter (Al) (8 bits, unsigned integer), Scheme-Specific FEC OTI elements for each object, comprising the number, $Z_i$, of source blocks for object i (12 bits, unsigned integer), and the number, $N_i$, of sub-blocks for object i. The encoded Scheme-specific Object Transmission Information is a (1+3*d)-octet field. The example in FIG. 21 is for d=2. The encoded FEC OTI can then be a (2+10*d)-octet field comprising a concatenation of the encoded Common FEC OTI and the encoded Scheme-specific FEC OTI elements.

Content delivery using the encoded FEC OTI can involve an information exchange between devices, computers, programs of systems using the UOD-RaptorQ FEC Scheme and a content delivery protocol ("CDP") that makes use of the UOD-RaptorQ FEC Scheme for object delivery. The CDP should provide an encoder device and decoder device with d, Al, and for each object, $F_i$, $T_i$ (a multiple of Al), $Z_i$ and $N_i$. The encoder is provided with each object, indexed by i. The encoder device that uses the UOD-RaptorQ encoder scheme would supply the CDP, for each packet to be sent, the packet's UOSI and the encoding symbol(s) for the d object(s).

Examples of Parameter Selection

In one example, the example parameter derivation described in Section 4.3 of [RaptorQ-RFC-6330] might be used, applied independently to each of the d objects. In an example, Al=4 octets, SS=8 (which implies that the each sub-symbol will be at least SS*Al=32 octets), and $T_i$ for object i is preferably at least SS*Al octets, with $T_i$ being a multiple of Al, while the payload size of each encoding packet is preferably of size at least T, where T is the sum over i=1, ..., d of $T_i$.

For source block construction, the procedures in Section 4.4.1 of [RaptorQ-RFC-6330] might be applied independently to each of the d objects.

For encoding packet construction, each encoding packet would contain a UOSI and the encoding symbol(s) for the d object(s). For compatibility between the (SBN, ESI) format of the FEC Payload ID used by the RaptorQ FEC Scheme of

[RaptorQ-RFC-6330] and the UOSI format used by the UOD-RaptorQ FEC Scheme might be a specific format. For example, for each object, the mapping from a UOSI value, C, to the corresponding (SBN, ESI) values (A, B) for an object i might be where B=floor(C/$Z_i$) and A=C−B*$Z_i$. Similarly, for each object, the mapping from (SBN, ESI) values (A, B) for object i to a corresponding UOSI value C would be C=A+B*$Z_i$.

For each object i=1, . . . , d, UOSI values from 0 to $KT_i$−1 identify the source symbols of object i in source block interleaved order, wherein $KT_i$=ceil($F_i/T_i$). UOSI values from $KT_i$ onwards identify repair symbols generated from the source symbols of object i using the RaptorQ encoder.

Encoding packets may contain source symbols, repair symbols, or combinations of source and repair symbols. A packet may contain any number of symbols from the same source block of object i. Where the last source symbol in a source packet for object i includes padding octets added for FEC encoding purposes, these octets should be included in the packet, so that only whole symbols are included in each packet.

The Universal Object Symbol Identifier, C, carried in each encoding packet is the UOSI of the first encoding symbol for each object carried in that packet. The subsequent encoding symbols in the packet for each object have the UOSIs numbered from C+1 to C+G−1, in sequential order, where G is the number of encoding symbols for each object in the packet. In other embodiments, there might be a base UOSI $U_i$ specified as part of the FEC OTI information for each object i, in which case the UOSI for the first symbol in the packet for object i is C+$U_i$.

In a preferred implementation, there is one encoded symbol for each of the d objects in each encoding packet. In a preferred implementation, encoding packets are generated and sent according to the following procedure. For each UOSI value C=0, 1, 2, 3, . . . , the encoder generates and sends an encoding packet as follows with the value of the FEC Payload ID of the encoding packet set to the UOSI value, C, and for each object i in i=1, . . . , d, the encoder determines the (SBN, ESI) values ($A_i$, $B_i$) that correspond to UOSI value C, generates an encoding symbol, $E_i$, of size $T_i$ that corresponds to (SBN, ESI) values ($A_i$, $B_i$) from object i according to the procedures of the RaptorQ FEC Scheme [RaptorQ-RFC-6330], adds encoding symbol $E_i$ to the payload of the encoding packet and sends the encoding packet. Note that it is not necessary for the receiver to know the total number of encoding packets.

Unicast Source Servers and Broadcast Repair Servers

In most of the embodiments described in this section, the repair symbols are sent in a broadcast fashion and source symbols are sent in a unicast fashion in response to UE requests for some sets of the source symbols. There are other embodiments, some described in this section and some described elsewhere herein, for which at least some source symbols are sent in a broadcast fashion, and there are also embodiments where at least some repair symbols are sent in a unicast fashion in response to UE requests.

An example broadcast file delivery system is an eMBMS file delivery system. An example unicast file delivery system is an HTTP byte-range request capable system. However, a unicast system wherein only whole files can be requested and provided could possibly be used, but many benefits would be lost. Earlier sections herein show some example systems.

In the examples of this section, repair data is sent in the broadcast session, and only source data is sent in the unicast repair session. The unicast repair requests are standard HTTP 1.1 byte range requests for parts of the original file. Since the broadcast session only had repair symbols, there will not be overlapping data between the two sessions. It should be noted that in some implementations, both the earlier-described system and the system of this section could co-exist and/or be combined.

As explained above, UEs (e.g., end-user devices; such as a mobile user device) can be configured to determine what source symbols the UE is missing and convert from source block number, encoding symbol id of the missing source symbols to standard HTTP 1.1 byte range requests and make those requests.

By sending repair symbols in the broadcast session, the unicast repair server only needs an original copy of the file, and the requests will be simple requests for a consecutive range of source symbols or for a consecutive large range of consecutive bytes rather than requests for individual symbols or requests for many small ranges of bytes. The UE might determine how many symbols to request based on simply counting how many are received and how many are needed, or based on running a decoding schedule to determine for example the prefix number of source symbols that will allow decoding of a source block, or prefix number of source sub-symbols that will allow decoding of a source sub-block, or prefix byte range size that will allow decoding of a sub-block or source block. Note that in this context and other contexts herein, "prefix" is meant to designate the "prefix of a portion of a file corresponding to a sub-block" or "prefix of a portion of a file corresponding to a source block", i.e., "prefix" may not refer to prefix of the entire file, but instead prefix of a relevant portion of the file, where the relevant portion can be inferred from the context in which "prefix" is used.

When sub-blocking is not used, a request for consecutive source symbols of a source block can be translated into a request for a consecutive sequence of bytes. When sub-blocking is used, a request for a consecutive number of source sub-symbols of a sub-block can be translated into a request for a consecutive sequence of bytes of the file.

As explained herein, the UE can derive the byte range request in the file from a request for a consecutive number of source sub-symbols of a sub-block.

In some implementations, different broadcast servers have different sets of repair symbols, perhaps based on different geographies. This is beneficial for UEs that move from one geography to another during the broadcast transmission in order to ensure that there is not duplicate reception for the same device.

The UEs request a byte range prefix of a sub-block (or block, in the case where sub-blocks are not used) in HTTP requests, largely independent of which repair sub-symbols (symbols, in the case where sub-blocks are not used; this parenthetical applies below as well) they receive in the broadcast session and only depending on how many repair symbols they received in the broadcast session. For some codes, such as the Reed-Solomon codes specified in IETF RFC 5510, the byte range prefix requested can be completely independent of which repair symbols are received in the broadcast session. For other codes, such as the RaptorQ codes specified in IETF RFC 6330, the size of the byte range prefix may depend weakly on which repair symbols are received in the broadcast session. For example, if there are K source sub-symbols in a source sub-block, and K−L repair sub-symbols are received for that sub-block, the requesting a byte range prefix that corresponds to the first L source sub-symbols will allow decoding with probability at least 99%, and requesting L+1 sub-symbols will allow decoding with probability at least 99.99%, and requesting L+2 sub-symbols will allow decoding with probability at least 99.9999%. Whether or not decoding is possible depends on the pattern of sub-symbols that are used for decoding, and the receiving device and determine before making the request whether a particular sequence of received sub-symbols will allow decoding and thus determine which requests to make to guarantee decoding. Thus, the size of the prefix requested for repair can depend weakly on the pattern of received sub-symbols in the broadcast session.

However, for simplicity, the receiving device might simply make a request for L+2 sub-symbols, in which case the request size is independent of which sub-symbols are received in the broadcast session, at the expense of an overhead of receiving potentially 2 redundant sub-symbols, i.e., K−L sub-symbols from the broadcast session and L+2 from the repair request for a total of K+2 sub-symbols received to recover the K source sub-symbols, and at the expense of a very small probability of failing to decode. Some reasons for making the size and pattern of the request independent of which data is received, and only depend on how much data is received in the broadcast session, include:

(a) The UE requests can be simple, and always request from the beginning of the source sub-block (block), one byte range request per source sub-block (block) at most (in some cases if enough repair sub-symbols (symbols) are received in the broadcast session then no additional HTTP requests are needed).

(b) A UE can start playing out the content of the sub-block (block) while it is downloading over HTTP from the repair server, then once it has downloaded enough, it can use the already received over broadcast repair sub-symbols to recover the remaining portion of the sub-block (size of remaining sub-block (block) is essentially the size of the repair sub-symbols (symbols) for the sub-block (block) received in the broadcast session).

It could be even the case that the receiver is receiving repair data concurrently over broadcast while at the same time trying to play back the content, downloading over HTTP enough for each sub-block until when combined with what has been received over broadcast is enough to decode and recover the remaining portion of the sub-block. In this case, as the broadcast continues, the amount of HTTP downloaded needed for each sub-block (block) becomes less and less as the UE receives more and more repair sub-symbols (symbols) for all the sub-blocks (blocks) via broadcast.

(c) Because the UEs are requesting prefixes of source sub-blocks, the overlap between UE requests for portions of the file will be as high as possible, e.g., two UEs that receive the same amount of repair sub-symbols (symbols) for a source sub-block (block) will make exactly the same byte range request for that source sub-block (source block), even when the pattern of repair symbols that each receives is independent and can be completely different.

When different UEs receive differing number of repair sub-symbols from the broadcast session for a sub-block, the UEs that receive the least amount of repair sub-symbols will generally make the largest prefix byte range request for the source sub-block, and all requests from other UEs will be a subset of this request. Thus, if an HTTP server has already fetched and served the byte range request for one UE for a sub-block (block), then the HTTP server can cache this response and have it available for the next UE that makes a repair request for the same sub-block (block). An HTTP caching server may proactively request from an upstream server a larger byte range than is requested by the UE, thus reducing the time till data beyond the size of the request is available if there are further requests from the same or other UEs for portions of the data beyond the current request. Thus, if one UE makes a request for a prefix of data from a relevant portion of a file, when a subsequent UE makes a request for a larger prefix of data from the same relevant portion of a file the HTTP caching server may already have that cached and be able to respond to the request with the corresponding prefix of data immediately.

If an HTTP repair server receives multiple requests, e.g., beyond some threshold, for overlapping byte-ranges, the server can also be configured to decide to forward a request to the BMSC requesting broadcast of this byte range of data to avoid redundantly loading the unicast channels to these receivers. The repair server would only have to unicast to each receiver the source data that was not going to be broadcast by the BMSC. The BMSC can convert the byte-range request into the necessary source symbols required and can then broadcast these source symbols, or better, broadcast these many new repair symbols. This allows the terminals to receive enough non-redundant symbols to repair their files with less loading to the unicast channels.

In some cases, it is an advantage for the UE to only make unicast requests for source symbols (sub-symbols) for a source block (sub-block) when the UE is ready to play back the content associated with that source block (sub-block), i.e., to use a "streaming mode" for making requests. One reason is that the UE only requests repair data for content it is actually going to play back, and if for some reason it never plays back some of the content, then it never wastes the unicast network resources requesting data for that block (sub-block).

For example, the UE may start playing back a content (file) from the middle, and only play back one quarter of the content. In this example, only making the requests when the play back is imminent reduces the unicast network resources to around one-fourth of what would be needed if the unicast repair requests are made to recover the entire content file before play back. Of course, once enough source symbols (sub-symbols) for a source block (sub-block) have been received, there is never any need for the UE to request additional data from the unicast repair server for the source block (sub-block).

A system operator can benefit from these approaches. For example, the deployment of unicast repair servers can be simplified and can be much less expensive. It also eliminates the need to purchase, deploy and operate specialized repair servers instead of relying upon much cheaper and easier to deploy and manage HTTP web servers. As another example, the operator may deploy a service whereby Internet content files are transparently captured, FEC repair data for them are broadcast to UEs, and then the UEs include methods to use the received FEC repair data broadcast to them, determine what HTTP 1.1 byte range requests to make that combined with FEC repair data received over broadcast allow them to recover the portions of the file they are going to play back, make the appropriate HTTP 1.1 byte range requests over the Internet for portions of the Internet-available content file that may already be cached in existing CDNs (not necessarily operated by the operator, nor is the content necessarily sourced by the operator).

By doing so, the operator may provide a valuable service of providing better user experience (since files are available much more reliably and much faster) while at the same time reducing the amount of overall network traffic on their network needed to deliver the files (since the broadcast data is useful to all UEs and takes less network resource to send than sending the data over many individual unicast connections to each individual UE), and at the same time the operator can avoid the cost of deploying any unicast repair servers to support their service, since the content is already available from standard HTTP web servers provided by others and this is what is used to support the unicast repair.

The system operator can also repurpose existing HTTP web servers and create new service opportunities, such as intercepting and broadcasting repair symbols for files that are delivered from other content providers via HTTP web servers to UEs.

Additionally, this approach can save operator network bandwidth capacity. The cost is the amount of broadcast data sent over a network, while the benefit is the sum over all UEs that play back content of amount of broadcast data received by that UE. This can provide better user experience on the operator network as well as faster and more reliable delivery of content.

The session description and the MBMS download delivery protocol, FLUTE, provide the client (i.e., a UE) with sufficient information to determine the source block and encoding symbol structure of each file. From this, a client is able to determine which source symbols can be requested and used to recover the file. Thus, an MBMS client is able to identify the number of required source symbols that would complete the reconstruction of a source block (of a file).

When the MBMS FEC scheme is used, as specified in 3GPP TS 26.346, the MBMS client can consider already received repair symbols when making the determination of the further source symbols required. In this case, the client should identify for each source block (of the file) a number, r, and make a repair request for the first r source symbols of the source block that will allow the MBMS FEC decoder to recover the file.

Once missing file data is identified, the MBMS client sends one or more messages to a file repair server requesting transmission of data that allows recovery of missing file data. All file repair requests and repair responses for a particular MBMS transmission can take place in a single TCP session using the HTTP protocol. Alternatively, the byte range request may be partitioned into multiple requests over different potentially overlapping HTTP/TCP connections, or FTP connections, or RTP connections or the like. Responses to repair requests may be delivered at a very slow or high bit-rate, depending on network availability and how busy the receiving device is and its capabilities. The repair request can be routed to the file repair server IP address resolved from the selected "serviceURI." The timing of the opening of the TCP connection to the server, and the first repair request, of a particular MBMS client can be randomized over a time window, so that not all UEs make their unicast requests at the same time.

When a MBMS UE identifies symbols to be requested in repair requests, the reply will be the corresponding symbols so identified, and should include all the symbols from the relevant source block identified in the request. The MBMS UE may instead make requests for sub-symbols of source sub-blocks when sub-blocking is used. Alternatively, as described herein, byte range requests may be made to request symbols or sub-symbols.

The MBMS UE may combine this with other methods. For example, the MBMS UE may receive data in the broadcast session and store it in long term storage without de-interleaving or decoding the original source file, as described in Luby VI. The MBMS UE may trigger de-interleaving and decoding portions of the original source file in response to an end user making requests to play back those portions of the source file, for example when the source file is a video file. If the MBMS UE doesn't receive enough data from the broadcast session to recover the portions of the original source file that are being requested for play back, then the MBMS UE may make repair requests as described herein for the relevant portions of the source file that the end user is requesting to play back. Thus, the MBMS UE may only make requests to receive additional data for certain sub-blocks or source blocks only if not enough data is received in the broadcast session to recover them, and the requests are only made at or near the time when the end user desire to play back portions of the source file that intersect those sub-blocks or source blocks. This embodiment minimizes network resources, as repair data for portions of the source file is only requested when the end user requests play back of those portions, and thus if portions of the file are never played back then repair requests for those portions are never made. Furthermore, this embodiment minimizes device resources required to read in from long term storage and de-interleave and decode the data for recovering sub-blocks or source blocks, since these operations are only performed if the end user requests play back of these portions of the source file.

Alternatively, the MBMS UE may make repair requests for sub-blocks or source blocks for which not enough data has been received to recover from the broadcast session when the MBMS UE has appropriate network connection and idle capacity to make such repair requests, and then store the response data to long term storage for later recovery of the sub-blocks or source blocks, in addition to the data received from the broadcast session for these sub-blocks or source blocks. When the user requests play back of portions of the original file, the MBMS UE can read back from long storage the combination of the interleaved and encoded data received from the broadcast session and from the repair requests for the sub-blocks or source blocks intersecting the user requested portions of the file and recover those sub-blocks or source blocks and provide them directly for play back to the video player. This alternative has the advantage that the repair data can be requested when the MBMS UE is connected to the appropriate network to make repair requests and receive responses, whereas when the user requests play back the MBMS UE may not be connected to the appropriate network. Furthermore, the play back response time to user requests for play back may be smaller, since all the data needed for play back is stored locally at the time of the user request on the device instead of requiring delivery over a network.

As another alternative, the MBMS UE can request repair data for all of the sub-blocks or source blocks for which additional data is required to recover, and recover all of the file and store it in long term storage for later play back or usage. The MBMS UE may perform these operations at any point in time in any order, i.e., the repair data in some case may be requested before receiving data from the broadcast session, for example if it is known that not enough data will be sent over the broadcast session to fully recover the sub-blocks or source blocks of the file, or if for example the end user desires to start playing back the content before the broadcast session has ended (and potentially before it has begun).

In some embodiments, there are UEs that do not perform FEC (and thus would prefer all source symbols and no repair symbols). In such cases, the UE would use a "No-code FEC" and would receive source symbols in the broadcast session and in any repair request responses, although this might not be as scalable as many different UEs experience different loss patterns and so make different source symbol repair requests.

In some embodiments, the repair broadcast sessions use partial reordering of broadcast data as illustrated in Luby VI at the UE. There, the combination of the unicast repair service using HTTP as described above can be combined with the methods described in Luby VI. The symbols/sub-symbols received in the broadcast transmission could be stored into flash or other memory as described in Luby VI. In some cases it is preferable to only send repair symbols in the broadcast session, but in other cases it is preferable to send at least some, if not all, of the source symbols in the broadcast session. When symbols or sub-symbols are requested in the repair service, over HTTP with byte range requests or with other MBMS methods, two different possibilities arise (and both may be used at the same time):

(1) The methods described in Luby VI can be used to write the symbols or sub-symbols received from a broadcast session into flash memory, and then when a source block or sub-block is to be recovered the methods described in Luby VI can be used to read into RAM the symbols or sub-symbols for the source block or sub-block stored in flash memory from the broadcast session. These can then be combined with the symbols or sub-symbols received via HTTP and stored directly into RAM, and the source block or sub-block is decoded in RAM using the combination of these symbols or sub-symbols and then the recovered source block or sub-block can be provided directly for play back.

(2) Some methods described in Luby VI can be used to write the symbols or sub-symbols received via HTTP into flash memory, and the same for symbols or sub-symbols received via a broadcast session, and then at any point in time a source block or sub-block can be recovered on the fly by reading into RAM from flash memory the combination of the symbols or sub-symbols for the source block or sub-block stored in flash memory based on the HTTP request and the symbols or sub-symbols for the source block or sub-block stored in flash memory from the broadcast session.

In the above embodiments, preferably the symbols or sub-symbols received via the broadcast session and the symbol or sub-symbols received in the repair session are largely different sets of symbols or sub-symbols.

Figure 22:
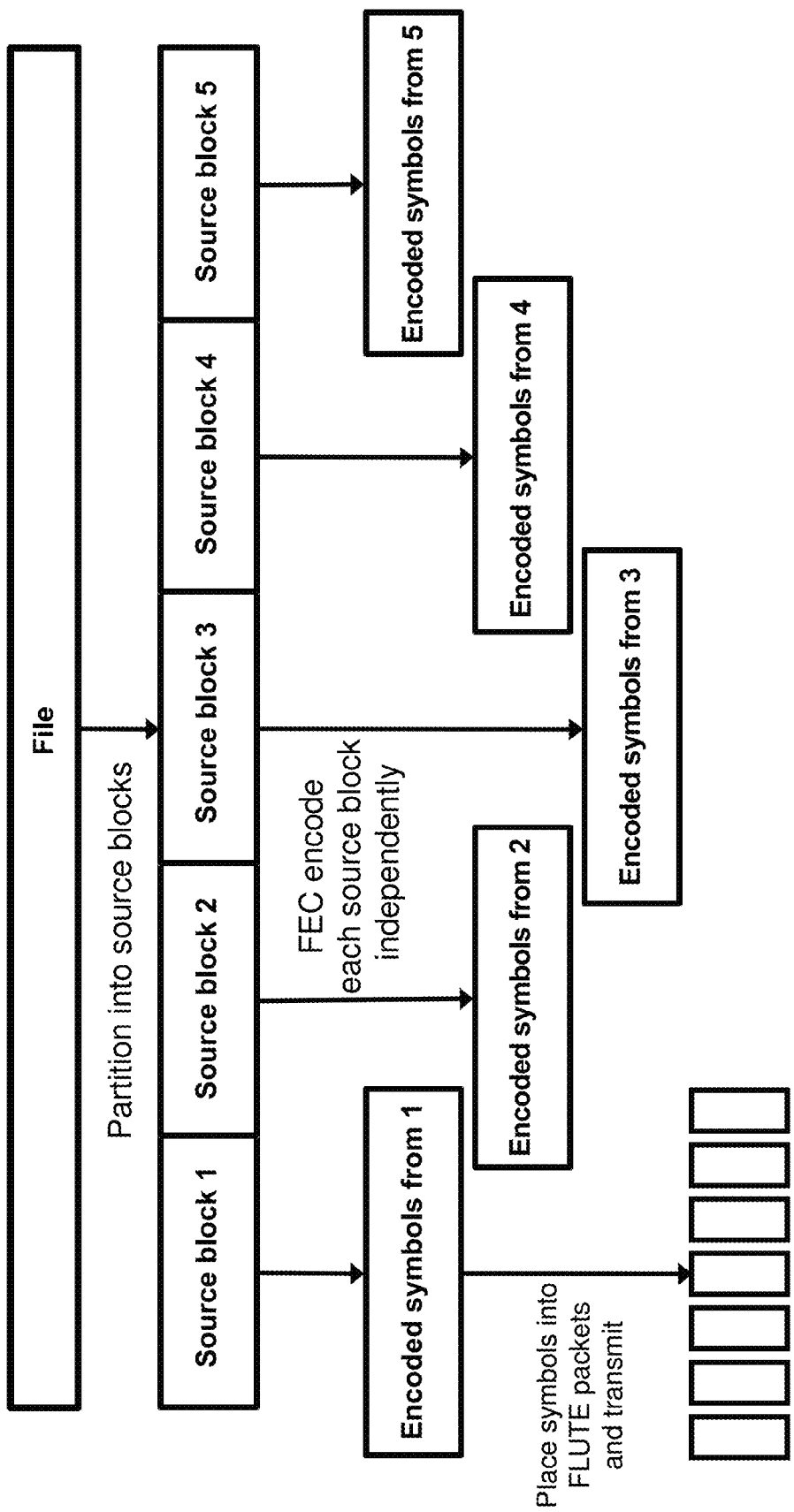
FIG. 22 illustrates basic FLUTE file delivery.

FIG. 22 illustrates basic FLUTE file delivery. Note that the FEC Payload ID could instead comprise the UOSI or UOFI described herein.

Figure 23:
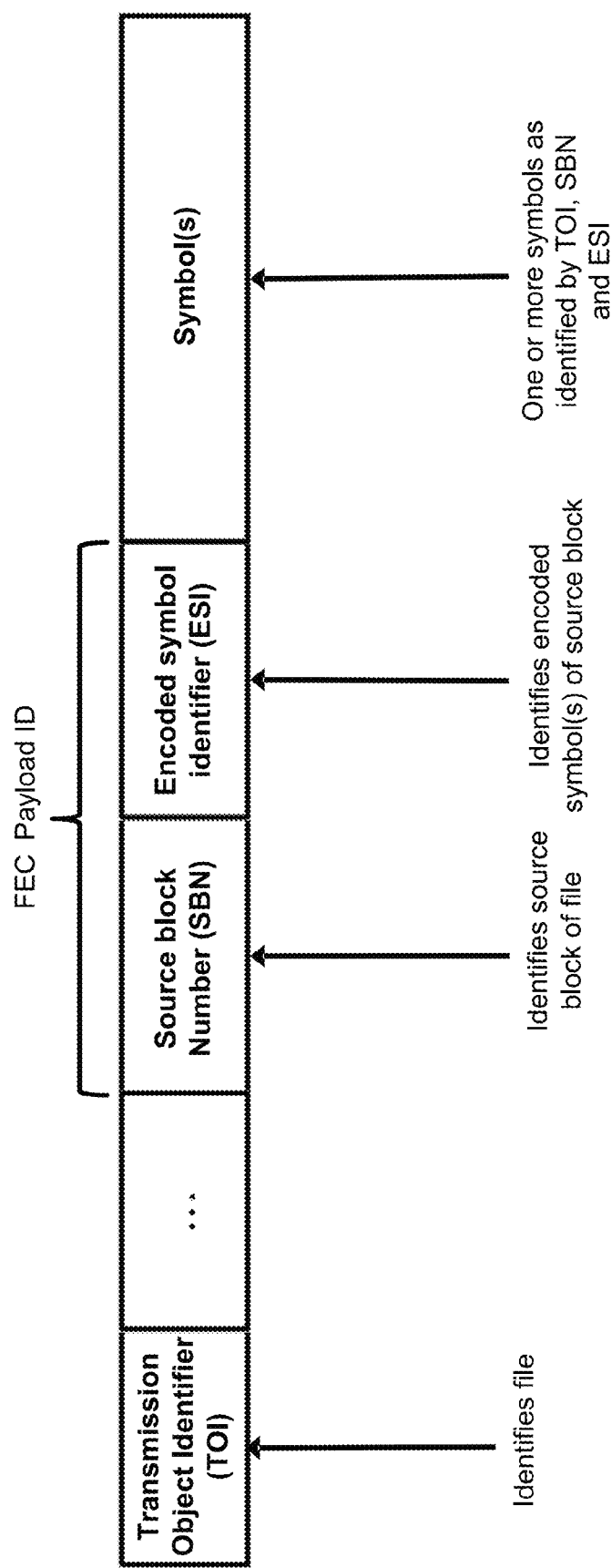
FIG. 23 illustrates basic FLUTE packet format.

FIG. 23 illustrates some portions of a basic FLUTE packet format.

Figure 24:
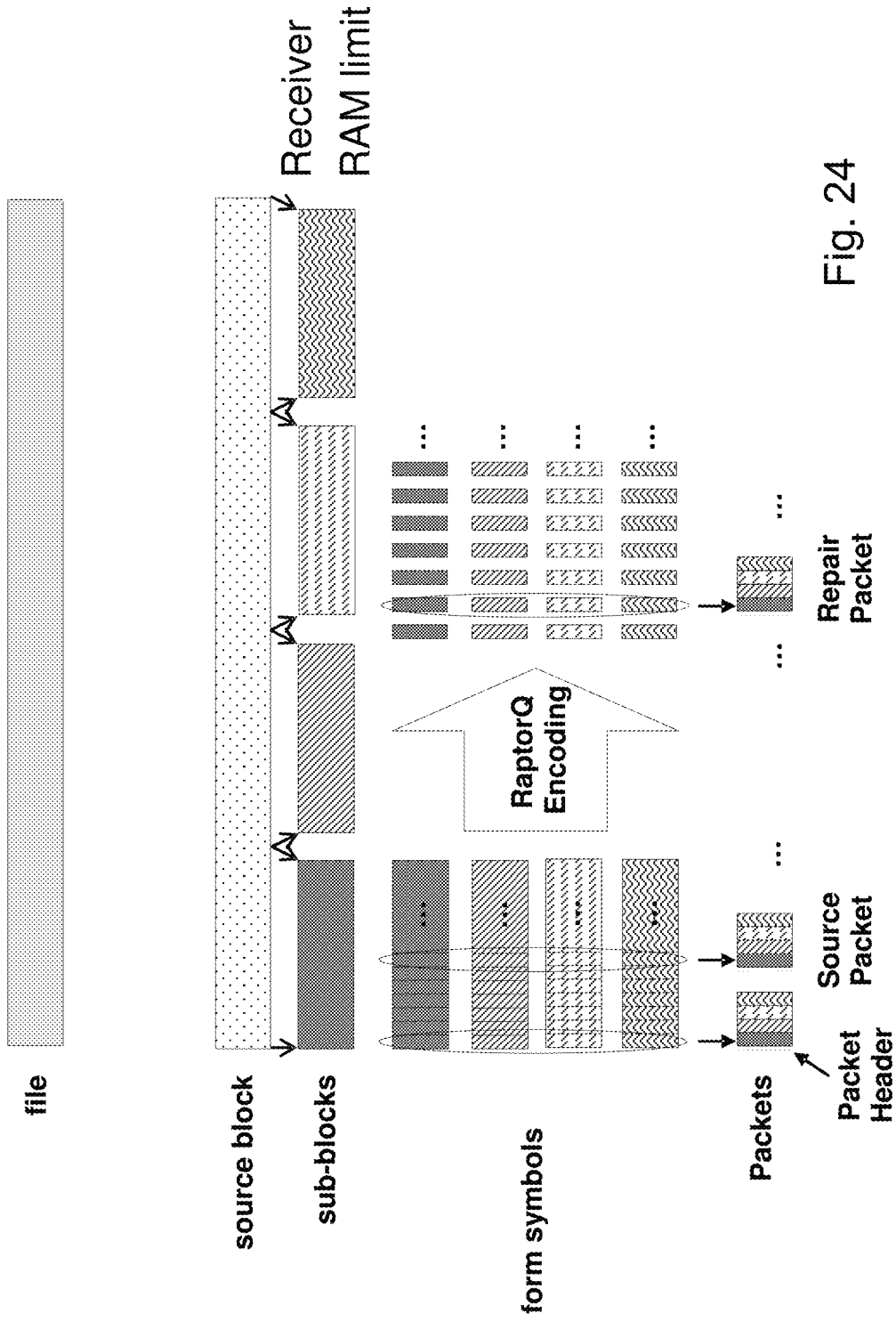
FIG. 24 illustrates sub-block encoding that occurs at a sender that uses sub-blocks.

FIG. 24 illustrates sub-block encoding that occurs at a sender that uses sub-blocks. As illustrated there, a file can be organized as one or more source block (one in this example) and divided into sub-blocks, which are arranged to form symbols from sub-symbols.

Figure 25:
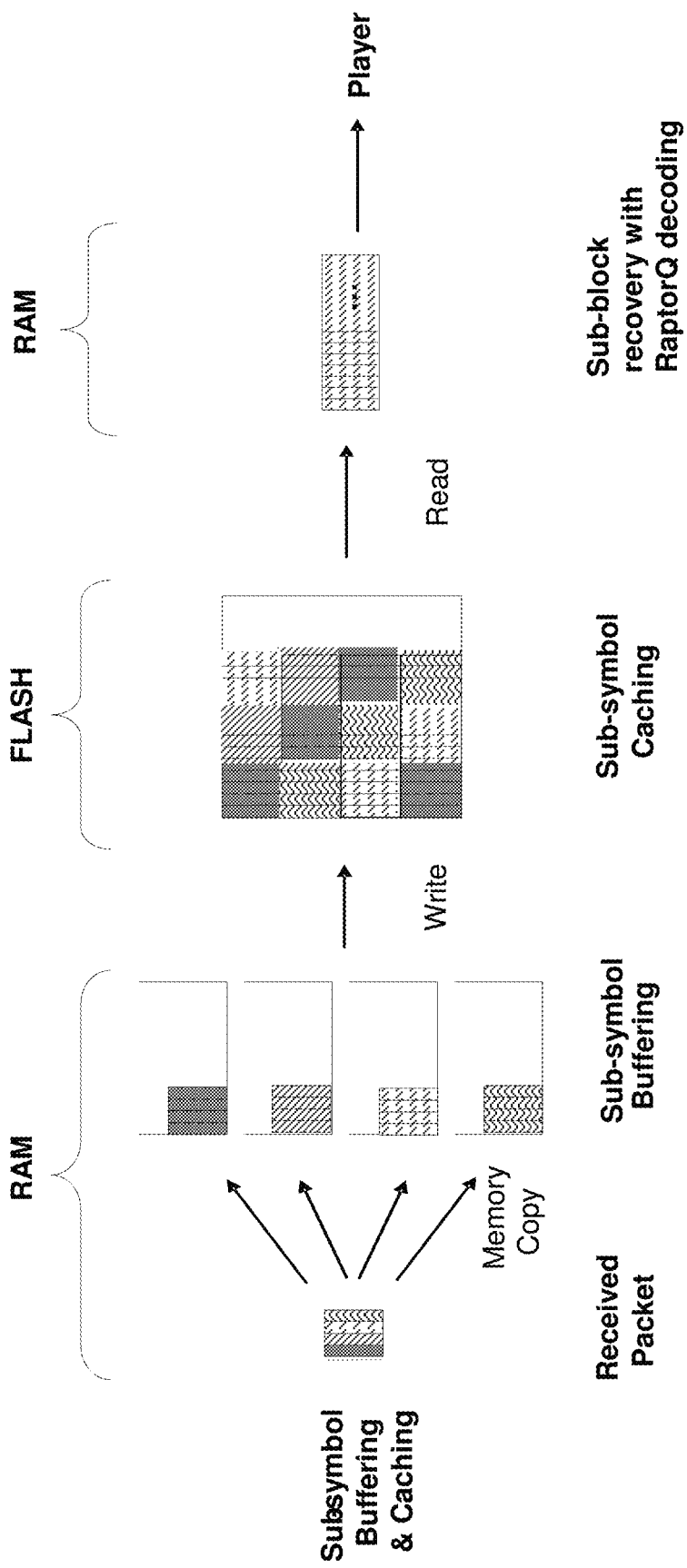
FIG. 25 illustrates sub-block decoding that occurs at a receiver that uses sub-blocks.

FIG. 25 illustrates sub-block decoding that occurs at a receiver that uses sub-blocks. In some cases, there is partial reordering before storing at the receiver. This might be useful, for example, where there is asymmetry in a storage element between reading and writing.

Figure 26:
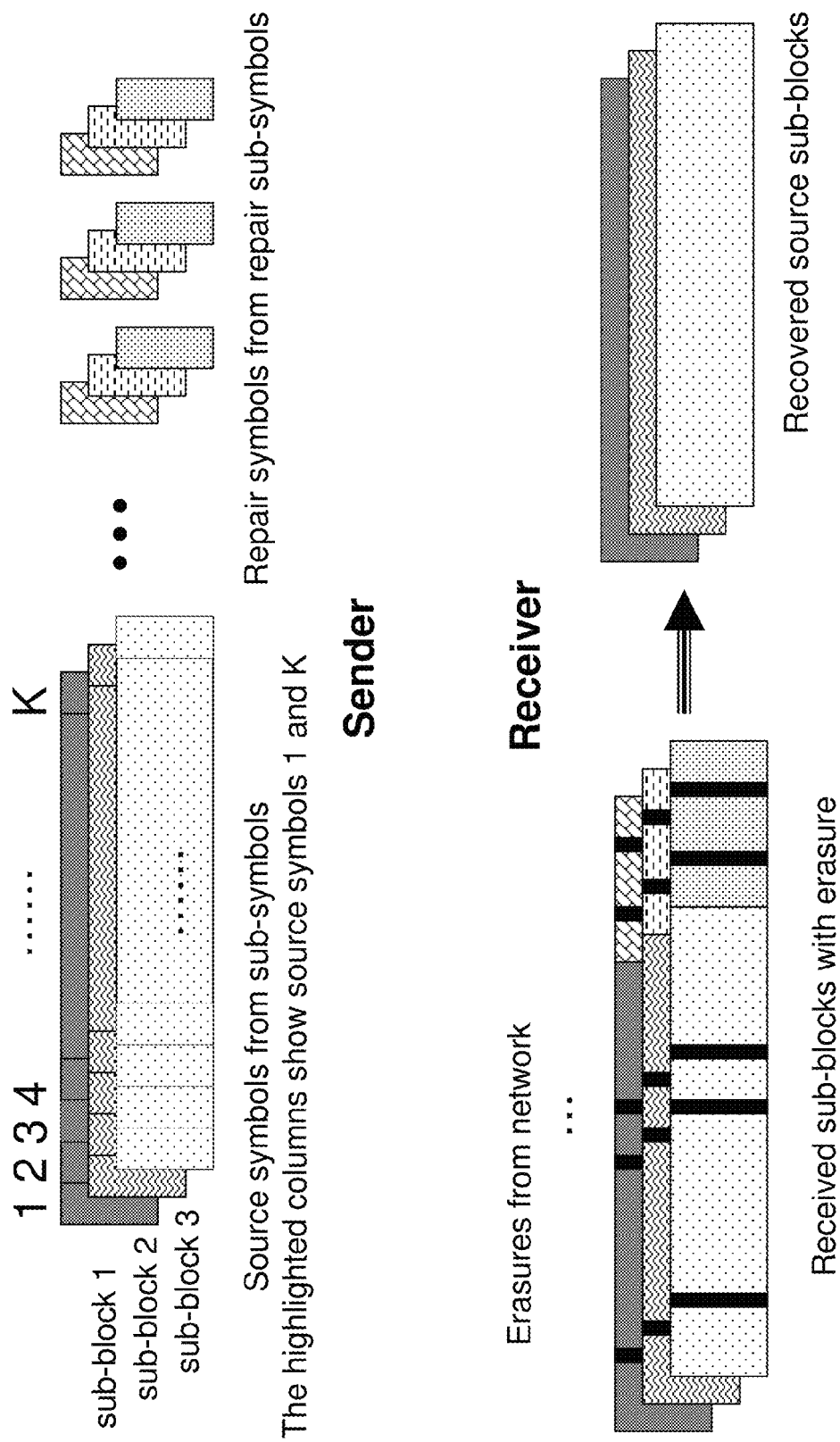
FIG. 26 illustrates file delivery using sub-blocking.

FIG. 26 illustrates file delivery using sub-blocking. In the typical case, the receiver sees the same loss pattern within each sub-block. From transport perspective, a file might be one source block and each packet might contain one symbol. From a decoding perspective, a schedule of decoding operations can be the same for all sub-blocks, with the same loss or reception pattern of sub-symbols for each sub-block, and the receiver computes the schedule once for all sub-blocks. The schedule of decoding operations is then applied to each sub-block separately, operating on sub-symbols and applying the same schedule to all sub-blocks. The decoder's CPU can perform well even operating on large source blocks, using only a small amount of scratch RAM memory and allowing for access and decoding of sub-blocks of media when they are played back.

Figure 27:
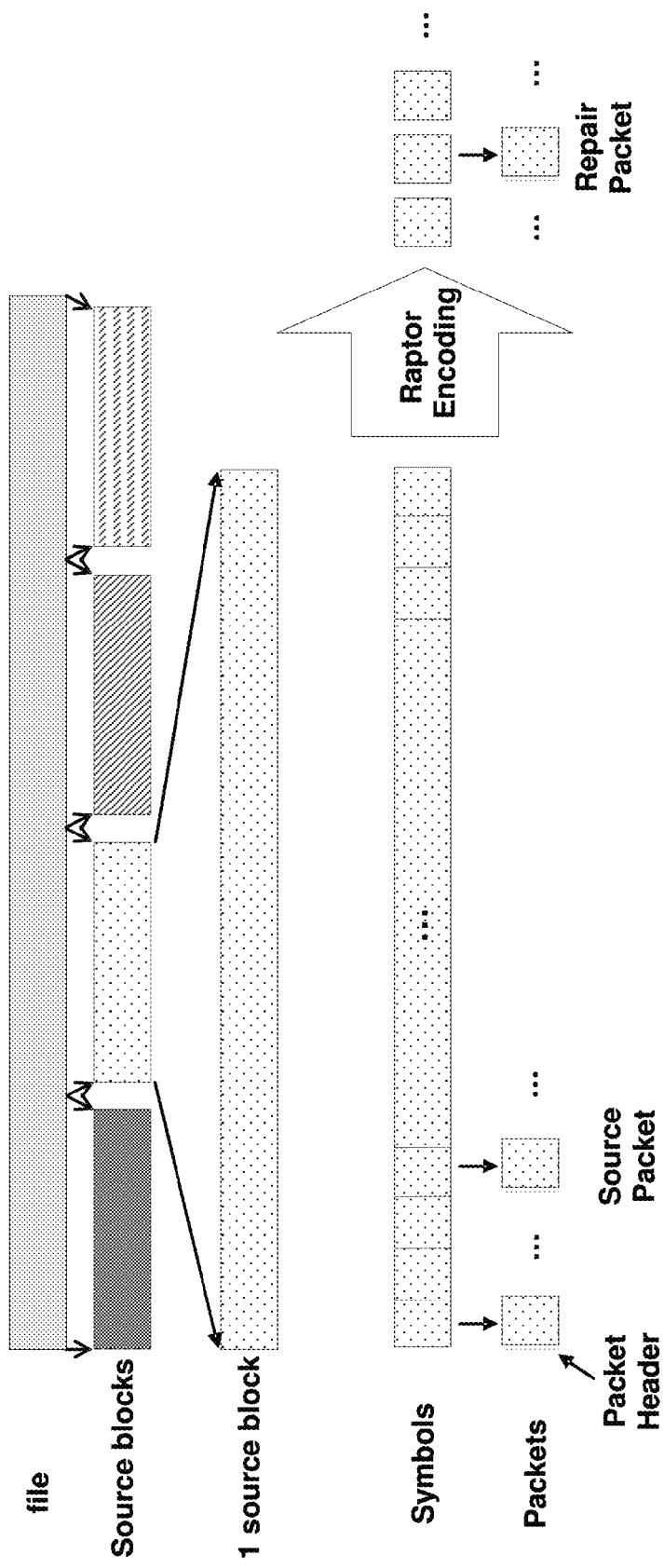
FIG. 27 illustrates the handling of multiple source blocks.

FIG. 27 illustrates an example of the handling of multiple source blocks. In some cases, for good network efficiency, the symbols are sent in a round-robin fashion, with one symbol from each source block sent each round. In other cases, for easier client recovery or end-to-end latency reasons, the symbols are sent in a sequential fashion, i.e., for each source block all symbols are sent in a consecutive sequence without interspersing symbols from other source blocks. Sub-blocking can be used in all cases.

Figure 28:
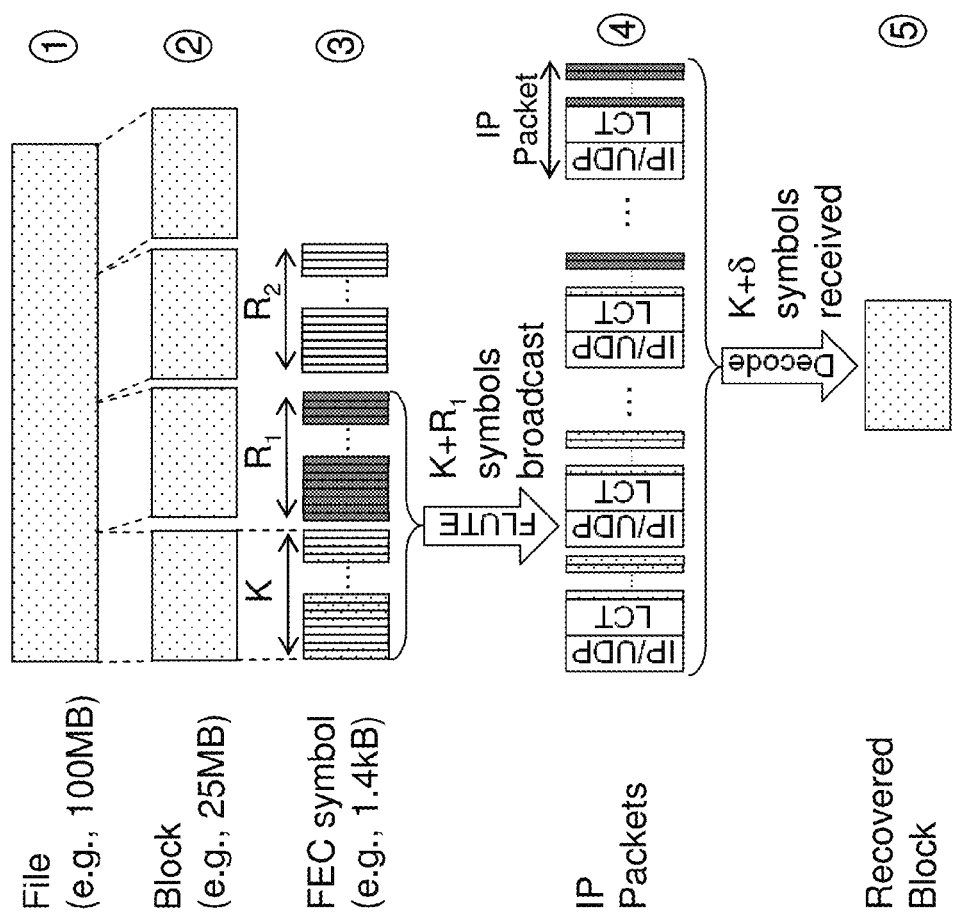
FIG. 28 illustrates a workflow using FEC and FLUTE.

FIG. 28 illustrates a workflow using FEC and FLUTE. In step 1, a file is defined to be carried in a FLUTE session. In step 2, the file may be segmented into blocks. The need for segmentation is driven by the max size the FEC scheme can handle.

In step 3, FEC is applied to a block, each block is divided into K equal sized systematic symbols, and $R_1+R_2$ repair FEC symbols are generated. In step 4, $K+R_1$ symbols are sent via FLUTE over a broadcast transmission, or alternatively via unicast using UDP, or via unicast using HTTP. Each IP/UDP/LCT packet carries one or more symbols depending on symbol size. In step 5, the receiver collects enough packets such that $K+\delta$ symbols are available for FEC decoding. In some embodiments using RaptorQ, $\delta=2$. However, other values are possible, e.g., $\delta=0$ or $\delta=0.01*K$. The additional $R_2$ symbols generated in step 3 might be provided to HTTP servers to provide an HTTP-based repair service for receivers that don't receive $K+\delta$ symbols from the transmission in step 4.

Figure 29:
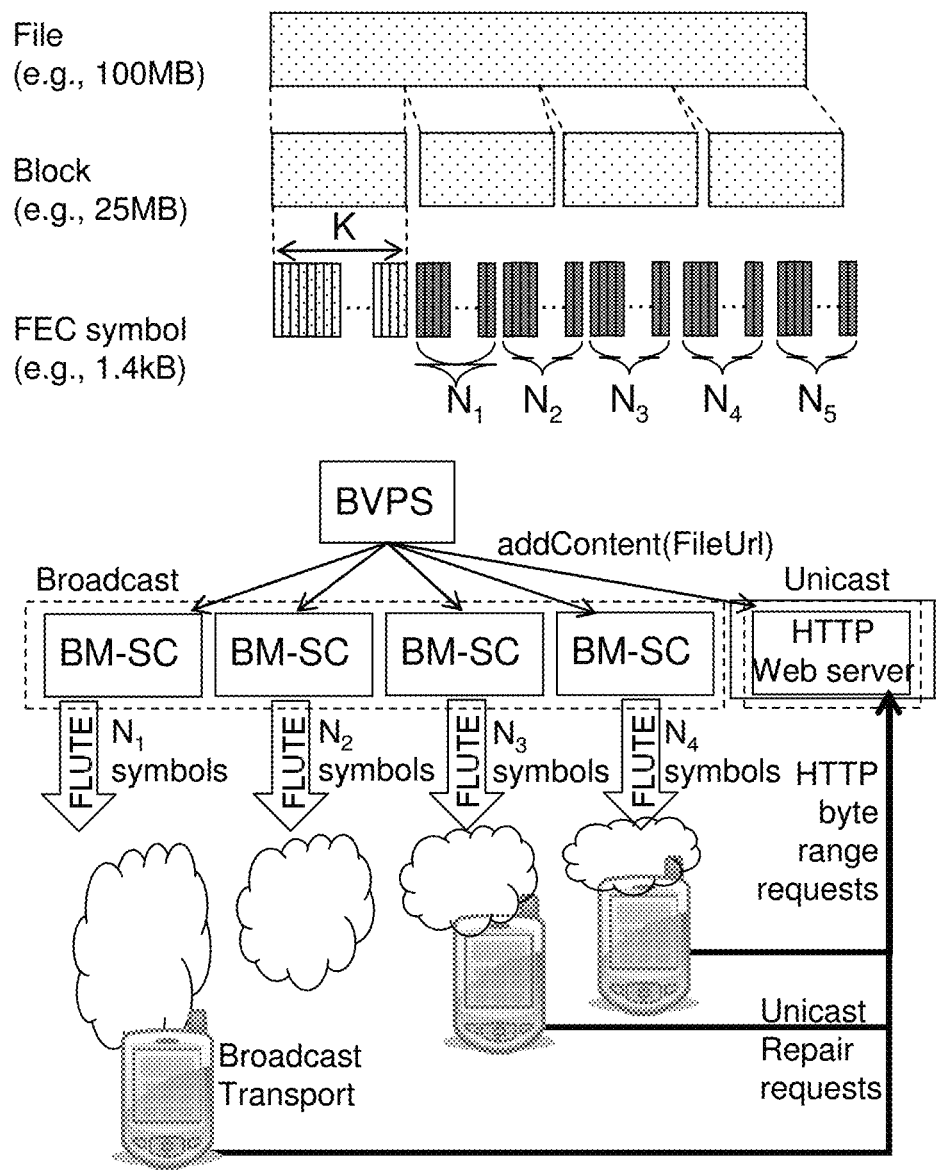
FIG. 29 illustrates a broadcast/repair, unicast/source configuration.

FIG. 29 illustrates the above-described broadcast/repair, unicast/source configuration. A large number of repair symbols can be generated. A UE needs any $K+\delta$ of those symbols for successful FEC decoding. In the embodiment shown each broadcast BM-SC sends N different Raptor repair symbols of a file and each BM-SC sends only repair symbols, i.e., those with ESI in the range $\{K, K+1, \ldots\}$.

One advantage of the above embodiments is that when a UE is roaming between the coverage areas of different BM-SCs, a UE can use symbols from different BM-SCs and not worry about duplicate reception of symbols, allowing for more efficient FEC decoding. The UE can make simple repair requests for source symbols (although this may require specialized repair request servers), but could also make HTTP byte range requests, using conventional HTTP web servers that have only the original source file as described in more detail elsewhere herein. This allows for more cost effective and converged Internet/MBMS solutions.

Figure 30:
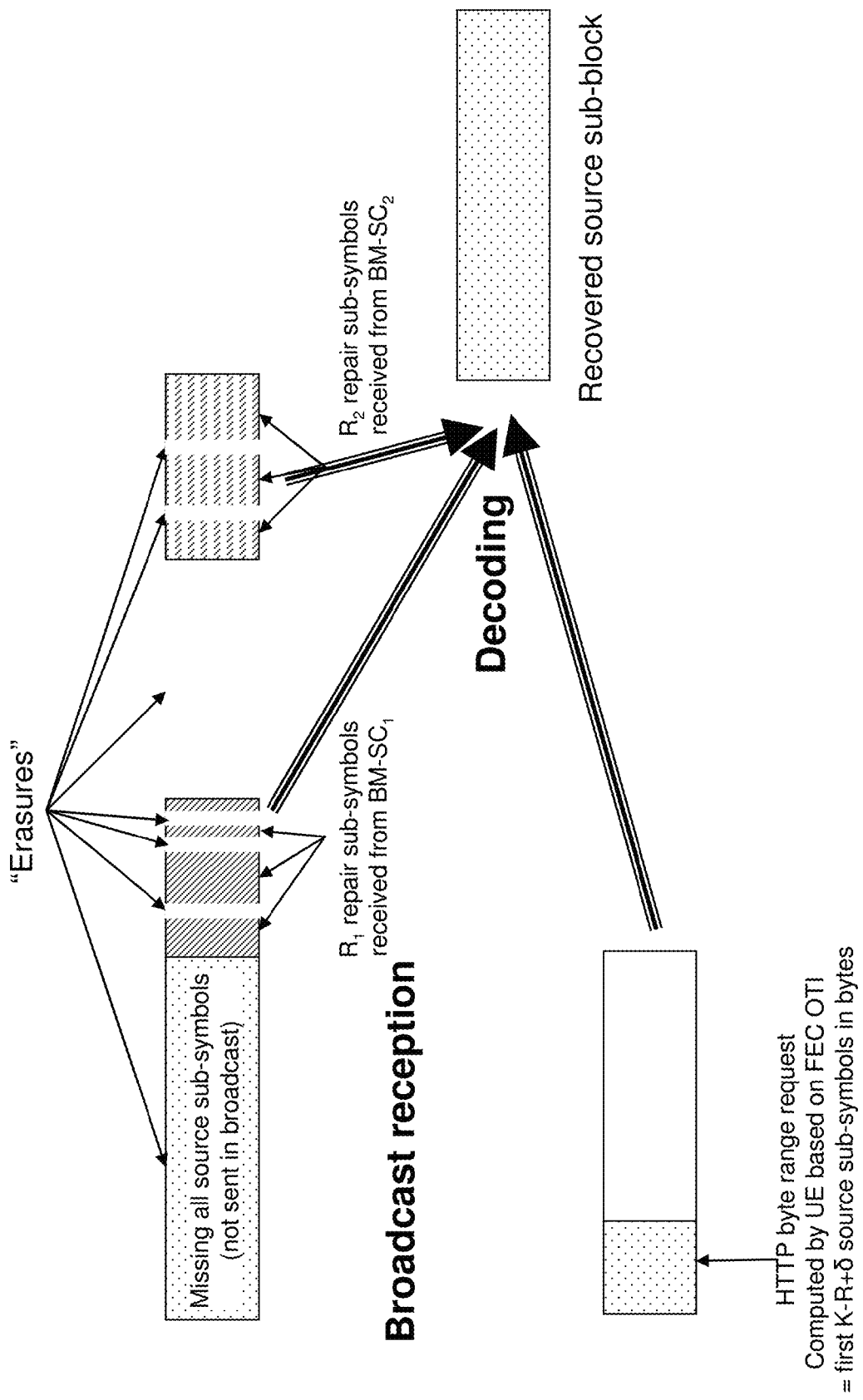
FIG. 30 illustrates how a system would broadcast only repair symbols over the MBMS bearer.

FIG. 30 illustrates how a system would broadcast only repair symbols over the MBMS bearer and the UE would request only a contiguous set of source symbols. The UE typically needs $K+\delta$ symbols to successfully decode the source block, but has only received $K+\delta-R$ repair symbols over the MBMS bearer. To recover the source block, the UE requests the first R (or K, when R>K) source symbols of the source block. It could request some other R source symbols, but if all UEs are requesting overlapping sets of source symbols, downstream caches are more likely to be able to deliver the requested source symbols to most receivers from their local cache.

This provides for simple and efficient caching at the repair server. Since only repair symbols are sent over the broadcast channel, the source symbols of the source block are all distinct from the symbols already received at the UE. Therefore the repair server only has to store the source symbols of the source block and does not have to store or generate new repair symbols. This allows for simpler repair servers that do not have to implement the FEC scheme or store new repair symbols.

Simple UE processing of received symbols is possible. The UE only has to track the number of repair symbols it has received and then calculate the number of source symbols it needs (R, when R is less than or equal to K, or K when R is greater than K). The UE does not have to track which particular source symbols are missing and then generate a request for only the missing source symbols.

Additionally, the UE can request a contiguous set of source symbols from the repair server using the Initial ESI+(the value of R). This keeps the requests very simple and short. This can also simplify the server construction of the response as the server does not have to retrieve and append disjoint sets of source symbols. This can be especially advantageous in deployments that do not use "no-code" FEC schemes as the server only has to handle contiguous source symbol requests.

Figure 31:
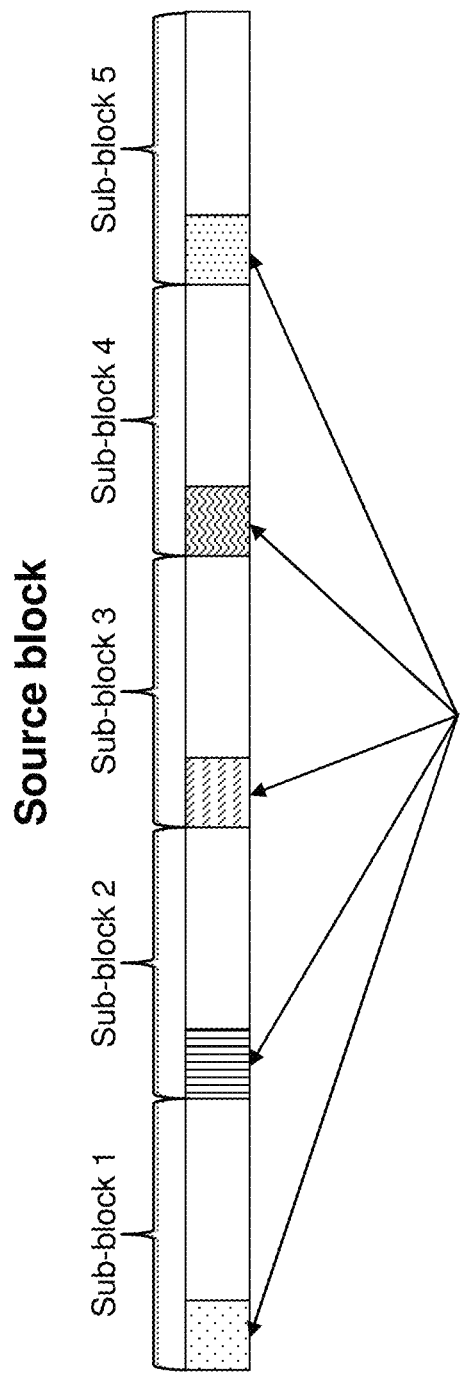
FIG. 31 illustrates using unicast repair via HTTP byte range requests.

FIG. 31 illustrates using unicast repair via HTTP byte range requests when sub-blocking is used.

With an HTTP byte range repair request, the UE can request the same number of bytes for each sub-block for the same source block. One request of a byte-range for each sub-block can be used in most circumstances when no source symbols are sent in the broadcast session.

HTTP requests can be made on an "as needed" basis. The UE can make a request for each sub-block when it is time to play back content within that sub-block. The UE can request and play back content for sub-block over HTTP until it has enough sub-symbols in combination with the sub-symbols receiver over other transports such as a broadcast session to decode and recover the sub-block. Once enough sub-symbols are received and decoded, the UE can seamlessly continue play back from locally recovered sub-blocks. The UE does not need to make HTTP requests for sub-blocks that are never played back.

Example of Byte-Range Calculations

A receiver might perform calculations explained in this section, in order to determine which byte ranges to request. The calculations might rely on the FEC structure. The receiver can then send a request to the server to obtain the symbols the receiver needs based on byte range requests.

In a preferred embodiment, the receiver uses the FEC Object Transmission Information ("FEC OTI") to recognize what symbols it has not received. The FEC OTI determines the source block, sub-block, symbol, and sub-symbol structure of the file, and is comprises the object transport size, F, the alignment factor, Al, the symbol size, T, the number of source blocks, Z, and the number of sub-blocks per source block, N. The receiver uses all of this information together with the properties of the FEC code itself to determine exactly how many and what symbols it needs, with each symbol or sub-symbol identified by the SBN, ESI and SuBN (source block number, encoding symbol identifier, sub-block number, respectively). In this embodiment, source symbols or source sub-symbols are requested. The receiver uses the FEC OTI information to calculate the byte-ranges in the file that correspond to these symbols or sub-symbols as described in the following:

When sub-blocking is not used (i.e., when N=1), for a given SBN and ESI, the receiver can compute the starting byte number and ending byte number in the file of the corresponding source symbol identified by the (SBN, ESI) pair.

A calculation process will now be described. This can be done by a program in the receiver or logic in the receiver. Let KT=ceil(F/T) be the number of source symbols in the file (rounded up to the nearest integer, where the last source symbol can be thought of as padded out with zeroes to a full source symbol).

Let KL=ceil(KT/Z) and KS=floor(KT/Z), ZL=KT−KS*Z and ZS=Z−ZL, where KL is the number of source symbols in the first ZL source blocks and KS is the number of source symbols in the remaining ZS source blocks.

For each i=0, ..., Z−1, let $K_i$ be the number of source symbols in source block i, i.e., $K_i$=KL for i=0, ..., ZL−1 and $K_i$=KS for i=ZL, ..., Z−1.

Then, the start byte associated with the symbol identified by SBN and ESI can be calculated as in Equation 2. The end byte position of this sub-symbol can be calculated by adding T−1 to the start byte position.

$$\sum_{i<SBN} K_i \cdot T + ESI \cdot T \qquad \text{(Eqn. 2)}$$

When sub-blocking is used (i.e., when N>1), for a given SBN, SuBN, and ESI, the receiver can compute the starting byte number and ending byte number in the file of the corresponding source sub-symbol identified by this (SBN, SuBN, ESI) triplet. The calculations for KT, KL, KS, ZL, ZS, and $K_i$ for i=0, ..., Z−1 can be identical to the calculations for the case where sub-blocking is not used (N=1).

The additional calculations for identifying the sub-block byte locations can be performed as follows below.

Let TL=ceil(T/(N*Al)) and TS=floor(T/(N*Al)), NL=T/Al−TS*N and NS=N−NL, where TL*Al is the size of the sub-symbols in the first NL sub-blocks and TS*Al is the size of the sub-blocks in the remaining NS sub-blocks.

For each j=0, ..., N−1, let $T_j$ be the size of the sub-symbols of sub-block j, i.e., $T_j$=TL*Al for j=0, ..., NL−1 and $T_j$=TS*Al for j=NL, ..., N−1.

Then, the start byte associated with the symbol identified by SBN, ESI, and SuBN can be calculated as in Equation 3. The end byte position of this sub-symbol can be calculated by adding $T_{SuBN}$−1 to the start byte position.

$$\sum_{i<SBN} K_i \cdot T + \sum_{j<SuBN} T_j \cdot K_{SBN} + ESI \cdot T_{SuBN} \qquad \text{(Eqn. 3)}$$

Based on these calculations for the start and end byte positions of requested symbols or sub-symbols, the receiver can determine the byte-range requests it needs to send to the server. In cases where there are contiguous missing symbols or sub-symbols, the receiver can start the byte range request from the start byte position of the first missing symbol or sub-symbol and end the range at the end byte position of the last missing symbol or sub-symbol.

To illustrate how the above calculations are made when sub-blocking is used, assume that a receiver has a broadcast download session and is trying to obtain a 3gp file with a URI of www.<mobile-operator>.com/news/weather.3gp, to be delivered with an FEC OTI of object size F=20,000,000 bytes, alignment factor Al=4 bytes, symbol size T=1320 bytes, number of source blocks Z=2, and number of sub-blocks per source block of N=12. In this example, the total number of source symbols in the file is KT=15,152, and the first source block with SBN=0 and the second source block with SBN=1 each have 7,576 source symbols. In this case, each source block is further partitioned into 12 sub-blocks each, each with 7,576 source sub-symbols, wherein the first 6 sub-blocks have sub-symbols of size 112 bytes and the remaining 6 sub-blocks have sub-symbols of size 108 bytes. After the broadcast download session, suppose the receiver recognized that it did not receive the 18 consecutive source symbols with ESIs 12-29 from the first source block with SBN=0, and the 18 consecutive source symbols with ESIs 12-29 from the second source block with SBN=1, and that it needs at least this many more symbols from each of these source blocks to decode these source blocks.

For the first source block with SBN=0, the starting byte positions of the 12 sub-symbols that constitute the source symbol with ESI=12 (the first of the 18 lost source symbols) can be calculated as shown in FIG. 32. FIG. 32 also shows how the end byte positions of the 12 sub-symbols that constitute the source symbol with ESI=29 (the last of 18 lost source symbols) can be calculated.

Similarly, FIG. 33 shows how the start byte positions of the 12 sub-symbols constituting the symbols with ESI=12 can be calculated for the second source block with SBN=1. FIG. 33 also shows how to calculate the end byte positions for the 12 sub-symbols constituting the source symbols with ESI=29.

If the selected repair server URI is http://mbmsrepair2.<mobile-operator>.com, the HTTP GET request might be as follows:

```
GET www.<mobile-operator>.com/news/weather.3gp
HTTP/1.1
Range: bytes = 1344-3359,849856-851871,1698368-
1700383,2546880-2548895,3395392-3397407,4243904-
4245919,5092368-5094311,5910576-5912519,6728784-
6730727,7546992-7548935,8365200-8367143,9183408-
9185351,10001664-10003679,10850176-10852191,11698688-
11700703,12547200-12549215,13395712-13397727,14244224-
14246239,15092688-15094631,15910896-15912839,16729104-
16731047,17547312-17549255,18365520-18367463,19183728-
19185671
Host: mbmsrepair2.<mobile-operator>.com
```

Header: Statistics Gathering

In some embodiments, statistics are gathered as they relate to the various requests being made for content. These statistics might be useful, for example, for a system operator to be able to tell how many files are not entirely sourced from broadcasts of content. This could be done by just looking at the HTTP logs for the repair servers that provide repair data in a unicast fashion. However, if the repair server is also serving as a direct source for the content (such as from requests from a device that does not attempt receipt of broadcast symbols or simply looks to a repair server as a primary HTTP source for the content), then statistics would overcount the requests. The system operator could have the devices themselves report broadcast/unicast statistics (and not report unicast-only requesting), but this relies on the devices and that can be cumbersome. In one solution, the HTTP repair servers collect the statistics and are able to distinguish between requests that are for repair data due to broadcast losses and requests that are direct unicast requests for content.

In one specific approach, a repair server determines the type of request (repair request vs. direct request) and which terminal is making the request. The first part distinguishes between HTTP requests it is receiving that are for repairing a file received over the broadcast channel and requests from terminals that are merely requesting or repairing a file they received over unicast. The terminal identification allows the server to map requests from the same terminal and also provide detailed reception statistics for each terminal. This might be useful to reduce double-counting and also to better map repair patterns.

To implement this ability of a server to determine the type and the terminal, there are several ways of doing this.

The server URL or the URL of the file might be specific to repair-type requests to distinguish from direct unicast-type requests. For example, these URLs might be only provided in the Associated Delivery Procedures of the broadcast service, or File Delivery Table of the file being broadcast. These URLs would not be provided for terminals to directly download a file that was not broadcast. The server can determine that requests to the particular URLs are for repairing broadcasted files and collect repair statistics based on these requests. For identifying requests from the same terminal, the server can use the source IP address of the HTTP GET request.

The server can use the IP address of the terminal to identify which terminal is making the request. The server can also use the IP address to determine whether the request is coming from a broadcast terminal if the HTTP server knows which IP addresses belong to broadcast terminals. Note that this approach is not as reliable for collecting broadcast statistics if a terminal is allowed to request data for files it did not receive via broadcast. So some restrictions could be placed on broadcast terminals directly requesting a file from these servers.

In another approach, an extension can be added to the HTTP GET request used by the terminal to request data from the HTTP server. The extension will identify that the request is for repairing a broadcasted file. The extension can also identify a unique ID of the terminal such as the Mobile Directory Number or the International Mobile Subscriber Identity (IMSI). Another example of an extension header is to use the "X-3GPP-Intended-Identity extension-header" as defined in 3GPP TS 24.109. A hash or encryption can be applied to these IDs if the operator does not want to send these in the clear for privacy or security purposes.

All of the above approaches could require customization of repair servers and thus make it difficult to use standard HTTP servers. The server support of the above procedures might be an optional feature. That way, system operators who are willing to rely on reception reporting from the UE (i.e., terminals) can still use standard HTTP servers.

Generalized Allocation of Source Symbols and Repair Symbols

In examples described above, a content delivery system might comprise clients such as UEs and servers such as an MBMS broadcast server and/or HTTP servers, preferably those that support byte-range requests in addition to URL file requests. In that approach, it might be that only repair symbols are broadcast and only source symbols are available via requests to an HTTP server. However, in a more generalized case, repair and/or source symbols might be broadcast and repair and/or source symbols might be available from HTTP servers.

In one example, the nature of what is available from the HTTP server is expressed and/or signaled as a range of UOSI values (alternatively, called UOFI values). Where the range of UOSI values is the same as the UOSI values corresponding to the original file, i.e., UOSI values 0 through ceil(F/T)−1, where F is the file size in octets and T is the symbol size in octets, then it is the original file in the original format that is available from the HTTP repair server, i.e., the Original-order HTTP file format. Where the range of UOSI values ranges over UOSIs of repair symbols or repair and source symbols, then those symbols are available as well, in a format that is a natural extension of the Original-order HTTP file format, further described below and hereinafter referred to as the "Extended-original-order HTTP file format". This allows for one type of request to handle various types of symbols and do so seamlessly. For example, the HTTP server could treat repair files having only source symbols identically to repair files having repair symbols only or repair files having repair symbols and source symbols (mixed format), just by signaling the UOSI range or some other signaling. Note that this scheme will work even when sub-blocking is used and when block size is variable between different source blocks of a file.

In the UOSI-ordering of symbols, a repair file that contains only source symbols would have a UOSI range of 0 through KT−1, where KT is the total number of source symbols in the original file. This is the range that can be signaled. For example, if a file is 20,000,000 bytes and the symbol size is 1,000 bytes, then KT=20,000, and thus signaling a UOSI range of [0, 19,999] indicates that the repair file is the original source file (independent of the number of source blocks in the original file), i.e., the Extended-original-order HTTP file in this case is the same as the Original-order HTTP file.

Suppose instead that content delivery system wanted to signal that the repair file carries only repair symbols. It could then use and UOSI range of [20,000, X], where x is greater than or equal to 20,000. Suppose further that this source file is partitioned into Z=19 source blocks, as signaled in the FEC Object Transmission Information ("OTI"), and thus the first 12 source blocks have 1053 source symbols and the remaining 7 source blocks have 1052 source symbols. Then, to signal that the repair file carries only repair symbols, and that the number of repair symbols for each source block is at least 3 more than the number of source symbols in that source block, then the UOSI range could be signaled as [20,000, 40,063], i.e., signaling that there are 1056 repair symbols in the repair file for each of the 19 source blocks.

Furthermore, if sub-blocking is used, then the sub-symbols of each sub-block are in order within each source block, i.e., there will be 1056 sub-symbols for the first sub-block, followed by 1056 sub-symbols for the second sub-block, etc., within the repair data for a source block, i.e., it need not be the case that repair symbols are consecutive within the repair data for the source block and can thus have the same organization as that of source data in the original source file, i.e., the Extended-original-order HTTP file format is a natural extension of the Original-order HTTP file format. For example, suppose that the each of the 19 source blocks is partitioned into N=3 sub-blocks, and that the sub-symbol sizes for the sub-blocks are 336, 332, and 332 octets, respectively. Let (J, L) be an identifier for a sub-block within the file, wherein J is the source block number and L is the sub-block number within that source block. Then, the file will comprise 1056 sub-symbols for sub-block (0,0), each sub-symbol of size 336 bytes, followed by 1056 sub-symbols for sub-block (0,1), each sub-symbol of size 332 bytes, followed by 1056 sub-symbols for sub-block (0,2), each sub-symbol of size 332 bytes, followed by 1056 sub-symbols for sub-block (1,0), each sub-symbol of size 336 bytes, followed by 1056 sub-symbols for sub-block (1,1), each sub-symbol of size 332 bytes, followed by 1056 sub-symbols for sub-block (1,2), each sub-symbol of size 332 bytes, and so on. In this example, sub-blocks within the source blocks J=0, . . . , 11 start with ESI 1053 and end with ESI 2108, and sub-blocks within the source blocks J=12, . . . , 18 start with ESI 1052 and end with ESI 2107.

As another example, suppose the service is meant to only support receivers coming back to ask for repair data from the HTTP repair server if they are missing at most 20% of the required data to recover the file. Then, the repair file containing repair data can be much smaller, e.g., corresponding to a UOSI range of [20,000, 24,027], i.e., there 212 repair symbols available for each of the 19 source blocks in the repair file. In this example, the ESI-range of sub-symbols for sub-blocks within the first 11 source blocks is 1053 through 1264, and the ESI-range of sub-symbols for sub-blocks within the remaining 8 source blocks is 1052 through 1263.

Typically, an original source file format is sequential, e.g., data is in the order in which the bytes of the file would be consumed for playback of the content from the beginning to the end, i.e., it is the Original-order HTTP file format. This is a convenient format for many reasons, including the natural format for hosting on HTTP web servers for delivery, for storage in file systems, etc. This might be the format for source files whether delivered by eMBMS or by unicast. If only repair symbols are sent over the eMBMS channel, then no portion of the source file in sequential format is sent, and so requests from the HTTP web servers would not be duplicative and requests for consecutive initial portions of source blocks (or sub-blocks) can be made to combine with what is received over eMBMS to recover the file in a useful manner.

In the cases where it is desirable to send both source symbols and repair symbols over the eMBMS channel to receivers, having just the original source file available on the HTTP web servers may not work as well, as some portions of the source file may have already been received over eMBMS, and thus the request pattern to HTTP web servers to request portions of the source file may end up requesting many small portions of the source file (skipping portions that were received over eMBMS), thus potentially causing considerable inefficiencies in terms of volume of HTTP byte range requests, accessing noncontiguous data portions in the HTTP web servers, and reduced caching efficiency from requesting different data from different receivers that experience different packet loss patterns from the eMBMS channel.

As explained herein, this can be resolved by using the Extended-original-order HTTP file format that extends the original source file format to include repair symbols, or in some cases to be comprised solely of repair symbols, in a natural way. Using this new file format, the file may be made available on conventional HTTP web servers and be used to provide a converged service wherein repair requests may be made to conventional HTTP web servers using byte range requests combined with delivering over eMBMS both source and repair symbols, such that caching efficiency is high, HTTP byte range requests are minimized and are requests for consecutive portions of data starting at the same point in the file independent of loss patterns experience by different receivers in the eMBMS session.

Technically, a file X may have associated FEC OTI parameters (F, Al, T, Z, N). In the Extended-original-order HTTP file format, the range of data in the file may be expressed in terms of the universal object symbol identifier ("UOSI"), alternatively called the UOFI. The UOSI of a symbol corresponds to the symbol's source block number ("SBN") and its encoding symbol identifier ("ESI"), i.e., for a symbol with an SBN of A and an ESI of B, the UOSI would be $C=A+B*Z$. The reverse mapping is that for a symbol with UOSI value of C, the ESI value is $B=\text{floor}(C/Z)$ and the SBN is $A=C-B*Z$. In signaling a UOSI range, the range might be expressed in the form [SU, EU] where SU is a start UOSI value for the file and EU is an end UOSI value for the file. Note that SU is less than or equal to EU. Then, the range of symbols that are included in the file are those symbols with UOSIs ranging from SU to EU, and thus the total number of symbols in the file is EU−SU+1. A special case of this new file format is where SU=0 and $EU=\text{ceil}(F/T)-1$, in which case the file is exactly the same as the original file, i.e., the Extended-original-order HTTP file format coincides with the Original-order HTTP file format in this case (modulo possibly padding the final symbol with zero padding if the file size, F, is not a multiple of the symbol size, 7).

Such a file may be identified by a URL, including the FEC OTI parameters, and by the start and end UOSIs of the symbols in the file. In the new Extended-original-order HTTP file format, the data in the file would be all of the symbols associated with ESIs for the source block with SBN=0 followed by all symbols associated with ESIs for the source block with SBN=1, etc., up to all symbols associated with ESIs for the source block with SBN=Z−1. Within the source blocks, the organization is in order of sub-blocks, i.e., all the sub-symbols associated with the first sub-block of the source block are in order of increasing ESI, followed by all sub-symbols associated with the second sub-block of the source block, etc., up through all sub-symbols associated with the last (N−1) sub-block of the source block.

The ESIs of source symbols in the source block with SBN=J that are in the UOSI range SU through EU can be calculated as follows. Let SESI(J) be the start ESI for source block J among symbols in the UOSI range (SU, . . . , EU), and let EESI(J) be the end ESI for source block J among the symbols in the UOSI range (SU, . . . , EU). Then, SESI(J) can be calculated as follows:

$$SESI(J)=\text{floor}(SU/Z)$$

If ((SU−Z*floor(SU/Z))>J) then SESI(J)=SESI(J)+1.
Similarly, EESI(J) can be calculated as follows:

$$EESI(J)=\text{floor}(EU/Z)$$

If ((EU−Z*floor(EU/Z))<J) then EESI(J)=EESI(J)−1.

Then, the total number of symbols from source block J in the UOSI range (SU, . . . , EU) is NK(J)=EESI(J)−SESI(J)+1. Note that the number of symbols for different source blocks of the file are all within one of one another independent of the range of values (SU, EU).

The size of the sub-symbols in sub-block L, TS(L) can be calculated as shown herein. In the formula below, TS(L') is the size of the sub-symbols in sub-block L'.

The start byte position of the sub-symbol indexed by the (SBN, SuBN, ESI)-triple (J, L, I) within the file, where SESI(J)<=I<=EESI(J), can be calculated as follows:

$$T^*(\text{Sum}\{J'=0,\ldots,J-1\}NK(J'))+NK(J)^*(\text{Sum}\{L'=0,\ldots,L-1\}TS(L'))+TS(L)^*(I-SESI(J)).$$

The end byte position of the sub-symbol indexed by (J, L, I) within the file is the start byte position plus TS(L)−1.

As an example, suppose that the file is formed by setting SU=ceil(F/T) and EU=SU+Z*M−1, where M is the maximum loss of symbols per source block expected by any receiving client, and thus there are exactly M symbols in the file for each of the Z source blocks in this case, and the file consists solely of repair symbols, and the repair symbols with the smallest ESI values in the file have the smallest possible ESI values amongst repair symbols. If, in the original eMBMS broadcast, only source symbols were sent, then this file consisting solely of repair symbols could be uploaded on HTTP web servers and used by clients issuing byte range requests to provide the repair service for eMBMS. In some more generality, if the largest UOSI sent in the eMBMS session is X, then file used for repair could be specified by a UOSI range (X', Y'), where X'>X and (Y'−X')/Z is an upper bound on the number of symbols or sub-symbols any client would need to request to recover a source block or source sub-block.

Figure 34:
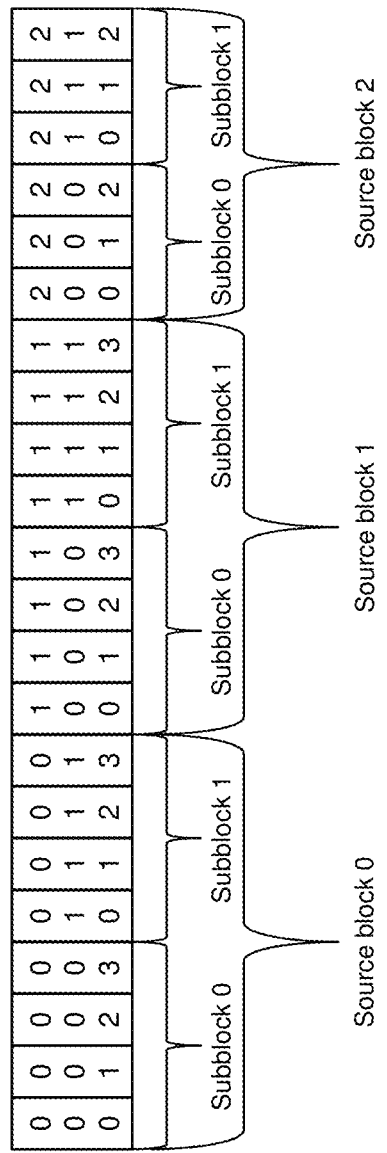
FIG. 34 illustrates an example of an Original-order HTTP file format and partition structure.

FIG. 34 illustrates a file in its original order, where in this example the file is partitioned into Z=3 source blocks, each source block is further partitioned into N=2 sub-blocks, and there are 4 source symbols in each of the first two source blocks and there are 3 source symbols in the third source block. In FIG. 34, each source sub-symbol is labeled with a triple (J, L, I), where J is the SBN, L is the SuBN and I is the ESI of the sub-symbol.

Figure 35:
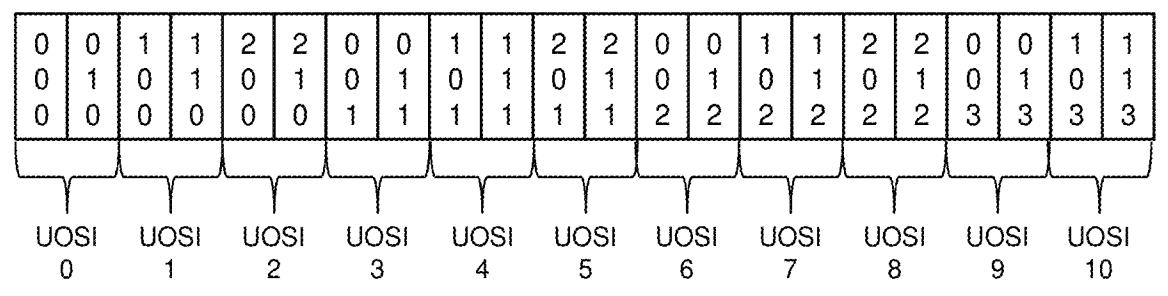

FIG. 35 shows the source symbols for the file corresponding to FIG. 34, where the source symbols are listed in UOSI order. Thus, the source symbol with UOSI=0 comprises the two sub-symbols labeled (0, 0, 0) and (0, 1, 0), and the source symbol with UOSI=5 comprises the two sub-symbols labeled (2, 0, 1) and (2, 1, 1).

Figure 36:
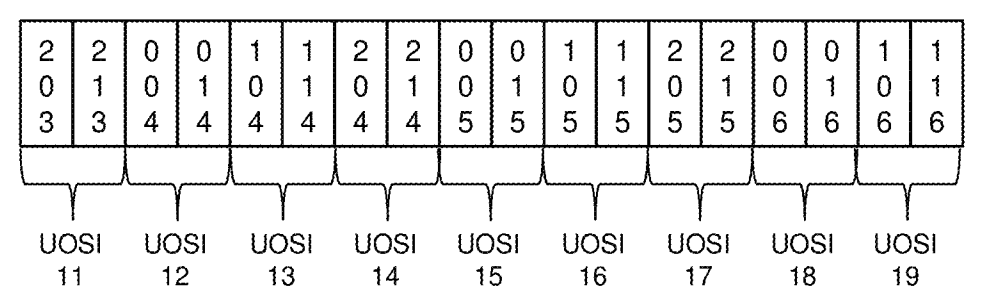

FIG. 36 shows the repair symbols with UOSIs ranging from 11 through 19 for the file shown in FIG. 34. These repair symbols can be generated from the original file, i.e., from the source symbols shown in FIG. 35. Each repair symbol comprises two sub-symbols generated from each of the two sub-blocks of a given source block using the same ESI, e.g., the repair symbol with UOSI=16 comprises the two sub-symbols labeled (1, 0, 5) and (1, 1, 5).

Figure 37:
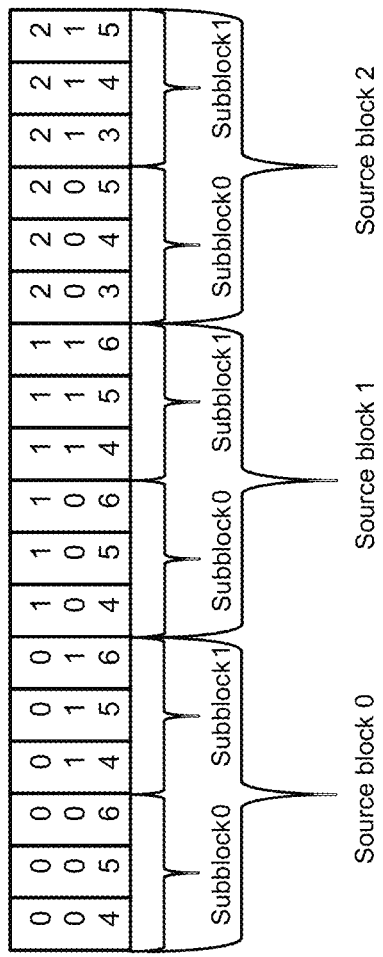
FIG. 37 illustrates an example of an Extended-original-order HTTP file format.

FIG. 37 shows the Extended-original-order HTTP file format corresponding to the UOSI range 11 through 19 for the file shown in FIG. 34. In this ordering, sub-symbols comprising symbols in the specified UOSI range are first ordered by SBN, within that by SuBN, and within that by ESI. Thus, all the sub-symbols for a given sub-block are consecutive within the Extended-original-order HTTP file format. Note that in this example the ESI range if 4 through 6 for sub-symbols of sub-blocks comprising the source blocks with SBN=0 and SBN=1, whereas the ESI range is 3 through 5 for sub-symbols of sub-blocks comprising source block with SBN=2. Note that the Extended-original-order HTTP file format supports using a single byte range to request any number of sub-symbols from a single sub-block up to the number of sub-symbols in the file for that sub-block.

Figure 38:
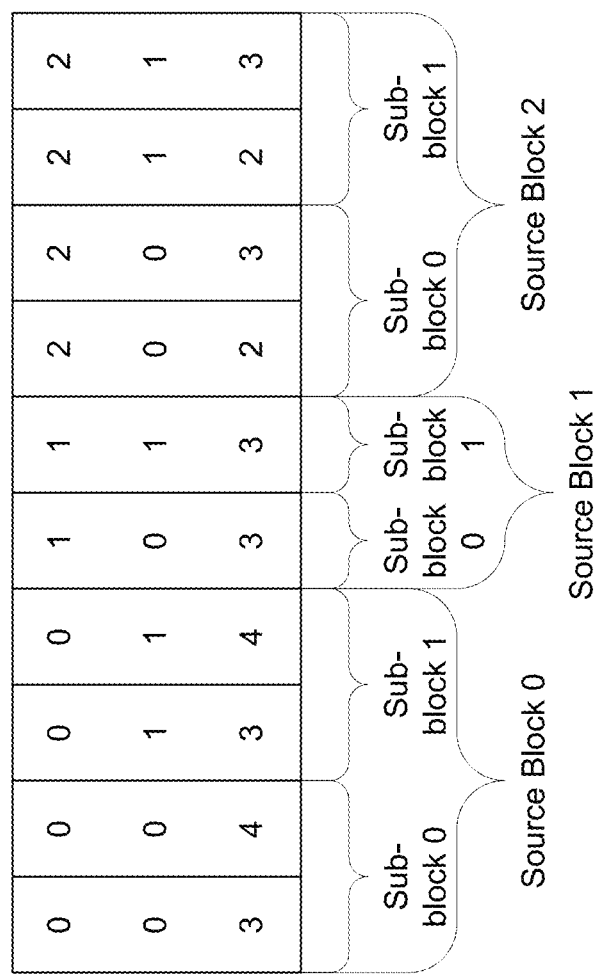
FIG. 38 illustrates another example of Extended-original-order HTTP file format.

The Extended-original-order HTTP file format can also be used to generate a file that comprises a mix of source and repair symbols. For example, FIG. 38 shows the Extended-original-order HTTP file format for the UOSI range 8 through 12 for the file shown in FIG. 34. Note that in this example UOSIs 8, 9 and 10 correspond to source symbols and UOSIs 11 and 12 correspond to repair symbols. Note also in this example that there are differing numbers of symbols for some of the source blocks, e.g., there are 2 symbols for the source blocks with SBN=0 and SBN=2 and there is 1 symbol for the source blocks with SBN=1.

In some cases, it might be desirable to provide more than one Extended-original-order HTTP file for a given source file. For example, different files might be available off of different CDNs, or in different regions. For example, there might be one file with UOSI range [0, 19,999] corresponding to the original source file, and there might be 3 other files with UOSI ranges [20,000, 22,000], [22,001, 26,354] and [45,651, 64,356], respectively. Alternately, there might be multiple files corresponding to the original source file, e.g., 3 files with UOSI ranges [0, 7,000], [7,001, 14,000], [14,000, 19,999], respectively for a source file with 20,000 source symbols. As another example, there might be 2 files with overlapping UOSI ranges available, e.g., with UOSI ranges [0, 15,000] and [10,000, 30,000], respectively. In some cases the symbols in the Extended-original-order HTTP file might be a mix of source and repair symbols, e.g., the UOSI range is [10,000, 30,000] whereas the number of source symbols in the source file is 20,000.

Examples of HTTP Byte Range Requests for Original-Order HTTP Files

An MBMS UE might use conventional HTTP/1.1 GET or partial GET requests as defined in RFC 2616 to request all or a subset of source symbols or sub-symbols of the referenced resource, respectively. These message formats are used if the MBMS UE is requesting symbols from a file repair server that supports byte range requests, i.e., its URI is listed as a "byteRangeServiceURI" or "priorityByteRangeServiceURI", or when requesting source data directly from the server URI portion of the "Content-Location" attribute in the FLUTE FDT instance.

For an Original-order HTTP file, MBMS UE uses the HTTP GET request when it requires all the source symbols of the resource to be transmitted. If the MBMS UE only requests transmission of a subset of the source symbols or sub-symbols, the UE might use the HTTP partial GET request with the Range request header as defined in 14.35.2 of RFC 2626. The MBMS UE indicates the specific source symbols or sub-symbols as a byte-range-spec as defined in 14.35.1 of RFC 2616.

For messaging efficiency, the HTTP GET method allows the UE to include multiple byte range requests within a single partial GET request. If the UE includes multiple byte ranges in a single request, the HTTP GET request should not exceed 2048 bytes in length to avoid truncation by the HTTP server.

If the MBMS UE determines that it can select among multiple subsets of the source symbols or sub-symbols, the MBMS UE should request the subset with the lowest ESI values available, i.e., choose the missing source symbols or sub-symbols from the beginning of the source block or source sub-block, respectively. This improves the caching efficiency of the HTTP file repair servers. Other strategies are also possible, for example the MBMS UE requests subsets with the highest ESI values available.

If more than one file were downloaded in a particular MBMS download session, and, if the MBMS client needs repair data for more than one file received in that session, the MBMS client can send separate HTTP GET requests for each file.

For example, assume that in a MBMS download session a 3gp file with the "Content-Location" attribute in the FLUTE FDT instance set to www.example.com/news/sports.3gp is to be delivered with an FEC OTI of object size F=20,000,000 bytes, an alignment factor of Al=4 bytes, a symbol size of T=1320 bytes, a number of source blocks Z=20, and a number of sub-blocks per source block of N=1. In that example, the total number of source symbols in the file is KT=15,152, and the first 12 source blocks with SBNs 0-11 have 758 source symbols each and the remaining 8 source blocks with SBNs 12-19 have 757 source symbols each.

After the MBMS download session, suppose the MBMS client recognized that it did not receive the 18 consecutive source symbols with ESIs 12-29 from the source block with SBN=5, and the 10 consecutive source symbols with ESIs 27-36 from the last source block with SBN=19, and that it needs at least this many more symbols from each of these source blocks to decode these source blocks. For the source block with SBN=5, the starting byte position of the first missing source symbol with ESI=12 can be calculated as shown in FIG. 39. The calculations for the end byte position of the last missing symbol with ESI=29 are also shown in FIG. 39. The calculations for the start and end byte positions for the missing symbols for the source block with SBN=19 are also shown in the last row of the table in FIG. 39.

If the selected repair server accepts byte range requests (e.g., the server URI is identified with the "byteRangeServiceURI" element in the associated delivery procedure meta data fragment) and its server URI is http:// httprepair1.example.com, then the HTTP GET request to the repair server is as follows:

```
GET /www.example.com/news/sports.3gp HTTP/1.1
Range: bytes = 5018640-5042399,19037040-19050239
Host: httprepair1.example.com
```

The UOSI range of the file in the Extended-original-order HTTP file format can be signaled to the UE via a number of different approaches or embodiments. In one embodiment this can be sent as part of the File Description Table in the FLUTE instance associated with the file, e.g. by adding new attributes "Start-UOSI" and "End-UOSI". In another embodiment, the UOSI range can be directly encoded in the URL of the file, e.g., by inserting/appending "start_uosi=xxx" and "end_uosi=yyy" attributes into the URL. Alternatively, the UOSI range of the file can be signaled via the Session Description Protocol (SDP), Media Presentation Description (MPD), or User Service Description (USD) associated with the delivery session for file, e.g., by adding new attributes for "Start-UOSI" and "End-UOSI" into one of these descriptions.

Auxiliary file format parameters that are needed for the UE to properly decode the file format can be signaled, in addition to the UOSI range. Examples of such additional parameters include some FEC Object Transmission Information. These auxiliary file format parameters can also be sent in the File Description Table (FDT) of the FLUTE instance by defining attributes for these parameters. In another embodiment, the auxiliary file format parameters can be directly encoded in the URL of the file. Alternatively, the auxiliary file format parameters can be signaled via the Session Description Protocol (SDP), Media Presentation Description (MPD), or User Service Description (USD) associated with the delivery session for file, e.g., by adding new attributes for the parameters into one of these descriptions.

In one embodiment, the FEC OTI information, UOSI range, or any general auxiliary file format information can be signaled as a MIME type. For example, the FEC OTI parameters can be signaled using the string "application/mp4 profiles='flut' fec-oti='XYZ'" according to RFC 6381 to indicate that FLUTE symbols have been included into an MP4 file with the specified FEC OTI values. In another embodiment, a new file format is defined and adds the parameter as "fec-oti" to the MIME type registration. An example of this signaling is the string "application/flut fec-oti='XYZ'".

In some embodiments, while not required, the auxiliary file format parameters for files stored on an HTTP server are the same as the auxiliary file format parameters for the file that is sent over the broadcast. In an alternative embodiment, some of the auxiliary file format parameters can be different for the file that was broadcast and for the file that is stored on the HTTP server for enabling repair.

For example, the FEC OTI for the file format stored on the HTTP server can be different from the FEC OTI that was used to format the broadcast. A practical example is when the broadcast data is encoded using different FEC OTI parameters in different areas; a device moving between different coverage areas may have its unicast repair requests routed to different servers serving differently encoded files depending on the current location of the device. To distinguish these different sets of parameter values, the parameter values can be encoded directly into the file name or URI stored on the repair server as described above. Alternatively, their attributes can be defined with different names, e.g., "FEC_OTI_bcast" and "FEC_OTI_file", when signaled to the terminal as part of the EDT, SDP, MPD, or USD. The terminal (e.g., a UE terminal) can then determine the appropriate procedures for decoding the file retrieved from the broadcast or an HTTP server. In one embodiment, the terminal may use the auxiliary file parameters to decide which files on the HTTP servers to retrieve data from when presented with multiple files using different file format configurations. In still other embodiments, the HTTP request for the file may contain pragma directives indicating the OTI parameters required; the HTTP server would then use the embedded directives to either serve the request from the correctly encoded file, or to reject the request if no such encoded file is available.

In another embodiment, it may be necessary for terminals to request repair data from URLs that cannot be changed or formatted to signal the auxiliary file format parameters, e.g., the source files are located on servers with Internet URLs. Another approach is to have the ability to signal optional parameters in the URL, and assume default parameter values if they are not explicitly signaled in the URL. For example, suppose the potential parameters to be signaled were the Format Type (e.g., SS-order HTTP file format, or Extended-original-order HTTP file format), the FEC OTI parameters, and the UOSI range.

Suppose there is a unicast file with URL www.example.com, i.e., none of these parameters are signaled in the URL. In that instance, the default parameters assumed by the client could be Extended-original-order HTTP file format, UOSI range=0, . . . , F/T, FEC OTI=broadcast FEC OTI, i.e., it is just the original source file in original order.

If instead, the UOSI range is signaled, e.g., the URL provided to the client is www.example.UOSI=X_to_Y.com, then the client would see that the UOSI range is X to Y and use this, and since the FEC OTI is not signaled, it would by default be the same as the FEC OTI of the broadcast version of this file and Extended-original-order HTTP file format would be assumed.

In a third example, if both the UOSI range and the FEC OTI are signaled in the URL, e.g., www.example.FEC_OTI=(F,Al,T,Z,N).UOSI=X_to_Y.com, then the default Extended-original-order HTTP file format would be assumed with the given FEC OTI and UOSI range.

In a fourth example, if the format is signaled in the URL, i.e., www.example.Format=SS.FEC_OTI=(F,Al,T,Z,N).com, then this signals to the client that the format is SS-ordered HTTP file format, and provides the FEC OTI (if the FEC OTI was not provided, it would be assumed to be the same as the broadcast FEC OTI in this example).

Thus, by having these optional parameters that can be signaled in the URL, one can achieve the following: allow unmodified URLs for files that are already have a URL associated with them (making sure that the default values for the unsignaled parameters match the format of the files), or allow URLs that signal some or all of the parameters. A key advantage is that unmodified URLs could be used for already existing available files over the Internet or Over-The-Top, since the unsignaled parameters in this case would default to indicating that the file is the original source file. Then for files with URLs that signal the parameters, these files likely would have to be specially formed (for example, producing the repair data that is part of the file, or reorganizing the format of the file). Since these files are not the original source files, having to signal the additional parameters in the URL is acceptable since a URL needs to be generated for these files when they are specially formed.

For an Extended-original-order HTTP file, MBMS UE uses the HTTP GET request when it requires all the symbols of the resource to be transmitted. If the MBMS UE only requests transmission of a subset of the symbols or sub-symbols, the UE might use the HTTP partial GET request with the Range request header as defined in 14.35.2 of RFC 2626. The MBMS UE indicates the specific symbols or sub-symbols as a byte-range-spec as defined in 14.35.1 of RFC 2616.

For example, assume that in a MBMS download session a 3gp file with the "Content-Location" attribute in the FLUTE FDT instance set to www.example.com/news/sports.3gp is to be delivered with an FEC OTI of object size F=20,000,000 bytes, an alignment factor of Al=4 bytes, a symbol size of T=1320 bytes, a number of source blocks Z=20, and a number of sub-blocks per source block of N=1. In that example, the total number of source symbols in the file is KT=15,152, and the first 12 source blocks with SBNs 0-11 have 758 source symbols each and the remaining 8 source blocks with SBNs 12-19 have 757 source symbols each. Suppose in this example that the source symbols are transmitted in the MBMS download session, and that UOSI range associated with the repair file available over HTTP is [15,152, 17,151], i.e., the repair file comprises the first 100 repair symbols for each of the 20 source blocks in Extended-original-order HTTP file format.

After the MBMS download session, suppose the MBMS client recognized that it needs an additional 18 symbols for the source block with SBN=5, and 10 additional symbols for the last source block with SBN=19, in order to decode these source blocks. For the source block with SBN=5, the starting byte position of the first symbol in the file with ESI=758 can be calculated as shown in FIG. 40. The calculations for the end byte position of the last symbol with ESI=775 are also shown in FIG. 40. The calculations for the start and end byte positions for the symbols for the source block with SBN=19 are also shown in the last row of the table in FIG. 40.

If the selected repair server accepts byte range requests (e.g., the server URI is identified with the "byteRangeServiceURI" element in the associated delivery procedure meta data fragment) and its server URI is http://httprepair1.example.com, then the HTTP GET request to the repair server is as follows:

```
GET /www.example.com/news/sports.3gp HTTP/1.1
Range: bytes = 5002800-5026559,19001400-19014599
Host: httprepair1.example.com
```

In another example where sub-blocking is used, assume that in a MBMS download session a 3gp file with the "Content-Location" attribute in the FLUTE FDT instance set to www.example.com/news/international.3gp is to be delivered with an FEC OTI of object size F=20,000,000 bytes, an alignment factor of Al=4 bytes, a symbol size of T=1320 bytes, a number of source blocks Z=2, and a number of sub-blocks per source block of N=12. In that example, the total number of source symbols in the file is KT=15,152, and the first source block with SBN=0 and the second source block with SBN=1 each have 7,576 source symbols. In that example, each source block is further partitioned into 12 sub-blocks each, each with 7,576 source sub-symbols, wherein the first 6 sub-blocks have sub-symbols of size 112 bytes and the remaining 6 sub-blocks have sub-symbols of size 108 bytes. Suppose in this example that the source symbols are transmitted in the MBMS download session, and that UOSI range associated with the repair file available over HTTP is [15,152, 17,151], i.e., the repair file comprises the first 1000 repair symbols for each of the 2 source blocks in Extended-original-order HTTP file format.

Suppose that after the MBMS download session, the MBMS client recognized that it needs 18 additional symbols for the first source block with SBN=0, and it needs 18 additional symbols for the second source block with SBN=1, in order to decode these source blocks.

For the first source block with SBN=0, the starting byte positions of the 12 sub-symbols that constitute the symbols with ESI=7576 (the first symbol available in the repair file) can be calculated as shown in FIG. 41. FIG. 41 also shows how the end byte positions of the 12 sub-symbols that constitute the symbol with ESI=7593 (the last of 18 symbols) can be calculated. In the table of FIG. 41, "SuBN" refers to the Sub-block Number.

There are many other embodiments and variants of the above described embodiments. As an example of a variant for all the formats described herein, the same format might be used except that the symbols and sub-symbols of the source blocks are ordered in reverse order of ESI. For example, if a file partitioned into two source blocks, each with two sub-blocks, each with three sub-symbols, then the Original-order HTTP format of this file can be expressed as (0, 0, 0), (0, 0, 1), (0, 0, 2), (0, 1, 0), (0, 1, 1), (0, 1, 2), (1, 0, 0), (1, 0, 1), (1, 0, 2), (1, 1, 0), (1, 1, 1), (1, 1, 2), where each triple indicates the SBN, SuBN, and ESI of each sub-symbol. This file in reverse order can be expressed as (0, 0, 2), (0, 0, 1), (0, 0, 0), (0, 1, 2), (0, 1, 1), (0, 1, 0), (1, 0, 2), (1, 0, 1), (1, 0, 0), (1, 1, 2), (1, 1, 1), (1, 1, 0). Similar reverse variants hold for all the other file formats described herein. A reverse variant of the file can be useful for example if a client is downloading data that can be used to reconstruct content from two different servers, wherein the client is downloading or receiving data that can be used to reconstruct the content from the first server stored in one file format and the client is downloading or receiving the file that can be used to reconstruct the content from the second server stored in the reverse format. If the delivery speeds of the data from the two servers differ or are unpredictable, then the client can simply wait until enough data in combination from the two servers arrive to reconstruct the content and then the client can terminate the connection, or simply stop receiving additional data, from the two servers. Because the one format is the reverse of the other, the client largely receives non-redundant data that allows the client to reconstruct the content, independent of how much of the data the client receives from each server.

There are many other variants of specifying the format of Extended-original-order HTTP format files, or the many other formats described herein. For example, a byte-range can be used to specify the data an Extended-original-order HTTP format file instead of a UOSI range. For example, if the UOSI range is (X, Y) and the symbol size is T, then the byte range specifying the same format could be the byte range starting at byte X*T and ending at byte (Y+1)*T−1. Other variants of specifying the format include specifying an explicit list of ESI ranges for each source block of the file. For example, if a file has 5 source symbols, then the specification of the format of the file could be SBN=0, ESIs=20-50, SBN=1, ESIs=30-40, SBN=2, ESIs=10-19, SBN=3, ESIs=0-50, SBN=4, ESIs=17-37. In this example, the same source block could be listed multiple times with different ranges of ESIs, e.g., SBN=4, ESIs=55-65 could be added to the list above and then there would be two ranges of ESIs for the source block with SBN=4 in the formatted file. Alternatively, the ESI ranges could be replaced with byte ranges, where in this case each byte range would be relative to a source block. For example, in the above if the symbol size is 1,000 bytes, then byte range 30,000-40,999 would be equivalent to ESI range 30-40. These variants of specifications of formats can be combined with all the formats previously described herein.

As has now been described, there are some specific examples. Further embodiments can be envisioned to one of ordinary skill in the art after reading this disclosure. In other embodiments, combinations or sub-combinations of the above disclosed invention can be advantageously made. The example arrangements of components are shown for purposes of illustration and it should be understood that combinations, additions, re-arrangements, and the like are contemplated in alternative embodiments of the present invention. Thus, while the invention has been described with respect to exemplary embodiments, one skilled in the art will recognize that numerous modifications are possible.

For example, the processes described herein may be implemented using hardware components, software components, and/or any combination thereof. The specification and drawings are, accordingly, to be regarded in an illustrative rather than a restrictive sense. It will, however, be evident that various modifications and changes may be made thereunto without departing from the broader spirit and scope of the invention as set forth in the claims and that the invention is intended to cover all modifications and equivalents within the scope of the following claims.

What is claimed is:

1. A method of playing out one or more multimedia objects received over a network by a client device comprising an electronic device or system, wherein source data of the one or more multimedia objects is represented by encoded symbols in packets such that the source data is recoverable, at least approximately, from the encoded symbols, the method comprising:

receiving the encoded symbols via a broadcast channel, wherein a value of each encoded symbol received for a multimedia object comprises either a repair symbol derived from values of one or more source symbols for the multimedia object or comprises a source symbol for the multimedia object;

determining an amount of additional repair data needed beyond the received encoded symbols to recover a portion of the multimedia object;

determining a set of one or more byte ranges of one or more files, wherein the set corresponds to the additional repair data within the one or more files needed to recover the portion of the multimedia object;

generating a request for at least a portion of the set of the one or more byte ranges corresponding to the additional repair data, wherein the request specifies at least the portion of the set of the one or more byte ranges;

determining whether to send the request to a first type of server or to a second type of server based on priority information, wherein the first type of server includes a dedicated file repair server and the second type of server includes a content server, wherein the priority information includes a priority element indicating the first type of server as a prioritized server type to which to send one or more requests, and wherein the request is sent to the second type of server when the first type of server is unresponsive;

sending the request to a server of the first type or the second type based on the priority information;

receiving, from the server, at least some of the requested additional repair data in response to the request; and processing the received additional repair data in combination with the encoded symbols received via the broadcast channel in recovering the portion of the multimedia object.

2. The method of claim 1, wherein the dedicated file repair server and the content server are both configured to provide the additional repair data.

3. The method of claim 1, wherein the dedicated file repair server is hosted by a network provider.

4. The method of claim 1, wherein the content server includes a web content server.

5. The method of claim 1, wherein the additional repair data comprises repair symbols of the portion of the multimedia object.

6. The method of claim 1, wherein at least one of the one or more files is in an Extended-original-order HTTP file format.

7. The method of claim 1, wherein at least one of the one or more files is an original-order HTTP file of the multimedia object, and data in the at least one file is in a native format.

8. The method of claim 1, wherein at least one of the one or more files is a universal file symbol identifier-order ("UFSI-order") HTTP file of the multimedia object.

9. The method of claim 1, wherein the server is a HyperText Transport Protocol ("HTTP") server that is responsive to file requests and byte range requests and that serves files and byte ranges of files.

10. The method of claim 9, wherein the file requests are HTTP 1.1 formatted requests, and the HTTP server supports the HTTP/1.1 protocol.

11. A client device for playing out one or more multimedia objects received over a network, wherein source data of the one or more multimedia objects is represented by encoded symbols in packets such that the source data is recoverable, at least approximately, from the encoded symbols, the client device comprising:
a broadcast receiver input for receiving the encoded symbols via a broadcast channel, wherein a value of each encoded symbol received for a multimedia object comprises either a repair symbol derived from values of one or more source symbols for the multimedia object or comprises a source symbol for the multimedia object;
logic for determining an amount of additional repair data needed beyond the received encoded symbols to recover a portion of the multimedia object;
logic for determining a set of one or more byte ranges of one or more files, wherein the set corresponds to the additional repair data within the one or more files needed to recover the portion of the multimedia object;
logic for generating a request for at least a portion of the set of the one or more byte ranges corresponding to the additional repair data, wherein the request specifies at least the portion of the set of the one or more byte ranges;
logic for determining whether to send the request for the additional repair data to a first type of server or to a second type of server based on priority information, wherein the first type of server includes a dedicated file repair server and the second type of server includes a content server, wherein the priority information includes a priority element indicating the first type of server as a prioritized server type to which to send one or more requests, and wherein the request is sent to the second type of server when the first type of server is unresponsive;
a network interface for sending the request to a server of the first type or the second type based on the priority information;
logic for receiving, from the server, at least some of the requested additional repair data in response to the request; and
a processor for processing the received additional repair data in combination with the encoded symbols received via the broadcast channel in recovering the portion of the multimedia object.

12. The client device of claim 11, wherein the dedicated file repair server and the content server are both configured to provide the additional repair data.

13. The client device of claim 11, wherein the dedicated file repair server is hosted by a network provider.

14. The client device of claim 11, wherein the content server includes a web content server.

15. The client device of claim 11, wherein the additional repair data comprises repair symbols of the portion of the multimedia object.

16. The client device of claim 11, wherein at least one of the one or more files is in an Extended-original-order HTTP file format.

17. The client device of claim 11, wherein at least one of the one or more files is an original-order HTTP file of the multimedia object, and data in the at least one file is in a native format.

18. The client device of claim 11, wherein at least one of the one or more files is a universal file symbol identifier-order ("UFSI-order") HTTP file of the multimedia object.

19. The client device of claim 11, wherein the server is a HyperText Transport Protocol ("HTTP") server that is responsive to file requests and byte range requests and that serves files and byte ranges of files.

20. The client device of claim 19, wherein the file requests are HTTP 1.1 formatted requests, and the HTTP server supports the HTTP/1.1 protocol.

21. A non-transitory computer readable medium having instructions stored thereon, the instructions for causing an apparatus to:
receive encoded symbols via a broadcast channel, wherein a value of each encoded symbol received for a multimedia object comprises either a repair symbol derived from values of one or more source symbols for the multimedia object or comprises a source symbol for the multimedia object;
determine an amount of additional repair data needed beyond the received encoded symbols to recover a portion of the multimedia object;
determine a set of one or more byte ranges of one or more files, wherein the set corresponds to the additional repair data within the one or more files needed to recover the portion of the multimedia object;
generate a request for at least a portion of the set of the one or more byte ranges corresponding to the additional repair data, wherein the request specifies at least the portion of the set of the one or more byte ranges;
determine whether to send the request to a first type of server or to a second type of server based on priority information, wherein the first type of server includes a dedicated file repair server and the second type of server includes a content server, wherein the priority information includes a priority element indicating the first type of server as a prioritized server type to which to send one or more requests, and wherein the request is sent to the second type of server when the first type of server is unresponsive;
send the request to a server of the first type or the second type based on the priority information;
receive, from the server, at least some of the requested additional repair data in response to the request; and
process the received additional repair data in combination with the encoded symbols received via the broadcast channel in recovering the portion of the multimedia object.

* * * * *